(12) United States Patent
Kawabata et al.

(10) Patent No.: US 7,868,464 B2
(45) Date of Patent: Jan. 11, 2011

(54) MULTILAYER SUBSTRATE AND MANUFACTURING METHOD THEREOF

(75) Inventors: Kenichi Kawabata, Tokyo (JP); Hisayuki Abe, Tokyo (JP); Masashi Katsumata, Tokyo (JP)

(73) Assignee: TDK Corporation, Tokyo (JP)

( * ) Notice: Subject to any disclaimer, the term of this patent is extended or adjusted under 35 U.S.C. 154(b) by 1307 days.

(21) Appl. No.: 11/229,394

(22) Filed: Sep. 15, 2005

(65) Prior Publication Data

US 2006/0057341 A1 Mar. 16, 2006

(30) Foreign Application Priority Data

| Sep. 16, 2004 | (JP) | ............................. 2004-269706 |
| Sep. 16, 2004 | (JP) | ............................. 2004-269707 |
| Sep. 16, 2004 | (JP) | ............................. 2004-269708 |

(51) Int. Cl.
H01L 23/485 (2006.01)
(52) U.S. Cl. ............... 257/778; 257/678; 257/E21.499; 257/E21.505; 438/108; 430/311
(58) Field of Classification Search ........................ None
See application file for complete search history.

(56) References Cited

U.S. PATENT DOCUMENTS

| 4,926,239 | A | 5/1990 | Fujita et al. .................. 257/791 |
| 4,941,255 | A | 7/1990 | Bull et al. ....................... 29/833 |
| 5,745,984 | A | 5/1998 | Cole, Jr. et al. ................ 29/833 |
| 5,994,166 | A | 11/1999 | Akram et al. ................ 438/108 |
| 6,104,093 | A | 8/2000 | Caletka et al. .............. 257/778 |
| 6,136,668 | A | 10/2000 | Tamaki et al. ............... 438/462 |
| 6,175,157 | B1 | 1/2001 | Morifuji ..................... 257/777 |
| 6,338,980 | B1 | 1/2002 | Satoh | |
| 6,489,685 | B2 | 12/2002 | Asahi et al. ................. 257/774 |
| 6,525,414 | B2 | 2/2003 | Shiraishi et al. ............ 257/686 |
| 6,555,924 | B2 | 4/2003 | Chai et al. ................... 257/788 |
| 6,582,991 | B1 | 6/2003 | Maeda et al. ................ 438/107 |
| 6,753,483 | B2 | 6/2004 | Andoh et al. ................ 174/262 |
| 6,784,530 | B2 | 8/2004 | Sugaya et al. ............... 257/686 |
| 6,930,258 | B1 | 8/2005 | Kawasaki et al. ........... 174/264 |
| 6,969,554 | B2 | 11/2005 | Kashiwagi et al. .......... 428/447 |
| 7,547,975 | B2 | 6/2009 | Takaya et al. ............... 257/778 |
| 2001/0018242 | A1 | 8/2001 | Kramer et al. .............. 438/200 |
| 2001/0036711 | A1 | 11/2001 | Urushima | |
| 2002/0106893 | A1 | 8/2002 | Furukawa et al. ........... 438/652 |
| 2003/0001283 | A1 | 1/2003 | Kumamoto | |
| 2003/0013233 | A1 | 1/2003 | Shibata ....................... 438/114 |
| 2004/0145858 | A1 | 7/2004 | Sakurada .................... 361/600 |
| 2004/0178482 | A1 | 9/2004 | Bolken et al. | |
| 2005/0142696 | A1 | 6/2005 | Tsai | |
| 2006/0021791 | A1 | 2/2006 | Sunohara et al. ............ 174/255 |
| 2007/0045793 | A1 | 3/2007 | Tanaka ....................... 257/678 |

FOREIGN PATENT DOCUMENTS

| CN | 1327710 A | 12/2001 |
| CN | 1395461 A | 2/2003 |
| CN | 1503338 A | 6/2004 |
| EP | 0 370 745 | 5/1990 |
| EP | 1225629 A2 | 7/2002 |
| EP | 1503409 A2 | 2/2005 |
| JP | A-S59-227185 | 12/1984 |
| JP | A-H63-280496 | 11/1988 |
| JP | 2529987 | 7/1989 |
| JP | A-H05-299816 | 11/1993 |
| JP | A-H08-293659 | 11/1996 |
| JP | 09-321408 | 12/1997 |
| JP | 2857279 | 11/1998 |
| JP | A-H10-313152 | 11/1998 |
| JP | 10-322021 | 12/1998 |
| JP | 11-274241 | 10/1999 |
| JP | A-H11-307888 | 11/1999 |
| JP | A-2001-053421 | 2/2001 |

(Continued)

OTHER PUBLICATIONS

U.S. Appl. No. 11/527,829, filed Sep. 27, 2006, Kawabata et al.

(Continued)

Primary Examiner—Daborah Chacko Davis
(74) Attorney, Agent, or Firm—Wolff Law Offices, PLLC; Kevin Alan Wolff

(57) ABSTRACT

A multilayer substrate according to the present invention includes a plurality of laminated insulating layers and conductive patterns formed between the respective insulating layers. The conductive patterns include a first conductive pattern having a predetermined thickness and a second conductive pattern thicker than the first conductive pattern. The first and second conductive patterns are located in the same layer. The first conductive pattern is formed by pattern-etching a conductive layer having a uniform thickness by the subtractive method. The second conductive pattern is formed by forming a pattern-forming groove and then filling the inside of the pattern-forming groove with a conductive material simultaneously with forming a via hole. The first conductive pattern is suitable for an LC pattern for a high-frequency circuit requiring small variations in the width and the thickness of the pattern as well as accuracy in the thickness relative to an insulating pattern, and for a normal conductive pattern requiring impedance matching. The second conductive pattern is suitable for an L pattern for a choke coil.

23 Claims, 58 Drawing Sheets

FOREIGN PATENT DOCUMENTS

| | | |
|---|---|---|
| JP | A-2001-185663 | 7/2001 |
| JP | 2001-250902 | 9/2001 |
| JP | 2001-339165 | 12/2001 |
| JP | 2002-050874 | 2/2002 |
| JP | 2002-170840 | 6/2002 |
| JP | 2002-217656 A | 8/2002 |
| JP | 2002-246500 | 8/2002 |
| JP | 2002-246507 | 8/2002 |
| JP | A-2002-217656 | 8/2002 |
| JP | 2002-290051 | 12/2002 |
| JP | 2003-007896 | 1/2003 |
| JP | 2003-37205 | 2/2003 |
| JP | 2003-197655 | 7/2003 |
| JP | A-2003-347748 | 12/2003 |
| JP | 2005-064470 | 3/2005 |
| WO | WO 03/065778 | 8/2003 |

OTHER PUBLICATIONS

European Search Report and Opinion dated Nov. 6, 2007 and attachments (9 pages).

Dibble E. P., et al: "Considerations for Flip Chip," Advance Packaging, IHS Publishing Group, US, vol. 6, No. 3, May 1997, pp. 28-30, XP000694608, ISSN: 1065-0555.

U.S. Appl. No. 10/900,458, filed Jul. 28, 2004, Minoru Takaya et al.

Japanese Office Action received Feb. 13, 2007 and its excerpt translation in English.

European Search Report from the European Patent Office, dated Aug. 9, 2006.

State Intellectual Property Office (SIPO) Office Action dated Mar. 20, 2009 (4 pages).

State Intellectual Property Office (SIPO) Office Action dated Jan. 8, 2010 (4 pages).

English language translation of a State Intellectual Property Office of (SIPO) Office Action dated Apr. 26, 2010 (6 pages).

MULTILAYER SUBSTRATE AND MANUFACTURING METHOD THEREOF

TECHNICAL FIELD

The present invention relates to a multilayer substrate and a manufacturing method thereof. More specifically, the present invention relates to a multilayer substrate including a conductive pattern and a via hole electrode, and a manufacturing method thereof.

BACKGROUND OF THE INVENTION

The need for higher-density packaging becomes increasingly severe in recent years. For this reason, "multilayer substrates" including lamination of a plurality of insulating layers are often used as substrates for various modules to be mounted on printed circuit boards.

A typical multilayer substrate is manufactured by forming conductive patterns and other elements on respective insulating layers collectively constituting the multilayer substrate, and then laminating the insulating layers together. Connection between the conductive patterns formed on the different insulating layers is achieved by use of via holes penetrating the insulating layers (see Japanese Patent No. 2857270 and Japanese Unexamined Patent Publication No. 10(1998)-322021, for example).

Formation of the conductive patterns on the respective insulating layers usually applies two methods called a "subtractive method" and an "additive method". In the subtractive method, a desired pattern is formed by selectively etching off a conductive layer, which is formed uniformly on an insulating layer in advance. In general, pattern formation by the subtractive method can achieve high accuracy in the thickness easily because a copper foil formed into a uniform thickness is applied to the conductive layer. However, this method poses a difficulty in controlling the width at high accuracy, and the accuracy of the width is even more reduced by an increase in the thickness of the conductive layer. In the additive method, a portion to draw a desired pattern is exposed and developed by use of a dry film, resist, and the like, and then metal is plated on the exposed pattern. Then, the pattern is finished by removing the dry film and the like. Pattern formation by the additive method can achieve high accuracy in the width direction because the width is accurately defined by the dry film and the like thus exposed and developed. However, the accuracy in the thickness direction depends on evenness of plating behavior, and the pattern formed by the additive method is apt to cause a relatively large variation in the thickness. For this reason, the additive method poses a difficulty in controlling the thickness at high accuracy.

As described above, the subtractive method and the additive method have advantages and disadvantages, respectively. The additive method is selected when the accuracy in the width direction is important, while the subtractive method is selected when the accuracy in the thickness direction is important. In the pattern formation, it is sufficient to apply either one of these two methods, and the two methods are not performed on a single surface at the same time.

In recent years, there is a growing demand for so-called embedding, which is a technique to embed inductance (L) and capacitance (C) on a substrate in addition to conductive patterns. The embedded L and C must meet the following requirements.

First, in terms of the L used in a high-frequency circuit, it is important to regulate the width direction of a pattern in order to control impedance. There is little impact on a transmission characteristic even when the pattern is relatively thin. On the contrary, a low direct-current resistance is desirable for the L used, for instance, in a smoothing circuit in a power system (such as a choke coil). Accordingly, it is important to maximize a cross-sectional area of a conductive pattern.

Meanwhile, in terms of the C used in a high-frequency circuit, it is important to reduce a variation in the capacitance. To be more precise, the variation in the capacitance needs to be suppressed within the range of ±5%. To achieve this, it is important to regulate the width direction of a pattern. However, there is no problem if the pattern is relatively thin. In addition, in terms of the conductive pattern, it is important to reduce the variations in the width and the thickness in order to control impedance.

Under such circumstances, there may be a case where it is necessary to combine "the L for a matching circuit" that requires the accuracy in the width direction of the pattern with "the L for a power circuit" (the choke coil) that requires the lowest direct-current resistance available, as represented by a substrate for a power amplifier. However, it is not possible to form these L elements having different characteristics on the same layer of the multilayer substrate by means of selecting one of the above-described patterning methods.

In other words, there are structural limitations and contradictions in pursuit of desired accuracy in the width and thickness of patterns, as represented by incapability of forming patterns in various thicknesses on the same layer, which lead to restriction of design freedom. As a result, it is difficult to respond to the needs for downsizing and improving performances of multilayer substrates.

SUMMARY OF THE INVENTION

It is therefore an object of the present invention to provide a multilayer substrate and a manufacturing method thereof, which can offer a high degree of design freedom and arbitrary selection of optimal pattern shapes and variations required in various electronic elements.

A multilayer substrate according to the present invention comprises a plurality of laminated insulating layers and conductive patterns formed between the respective insulating layers, wherein the conductive patterns includes a first conductive pattern having a predetermined thickness and a second conductive pattern thicker than the first conductive pattern, and the first conductive pattern and the second conductive pattern are located in the same layer. Here, the expression "in the same layer" means the vicinity of a boundary between the mutually adjacent insulating layers, and the situation "in the same layer" includes a case where both of the first and second conductive patterns exist across the boundary between the insulating layers, a case where both of the first and second conductive patterns contact one of surfaces of the boundary, and a case where one of the first and second conductive patterns contacts one of the surfaces of the boundary and the other one of the first and second conductive patterns contacts the other surface of the boundary. It may sometimes be difficult to clearly identify the boundary between the insulating layers due to lamination of the insulating layers of the same material, such as a case of laminating a build-up layer on another build-up layer. However, even in that case, it is obvious that the first and second conductive patterns are provided between those layers. Accordingly, it is possible to perceive that there is the boundary between the insulating layers in the vicinity of the first and second conductive patterns.

According to the present invention, it is possible to form an LC pattern for a high-frequency circuit and a normal conductive pattern collectively configured as the first conductive pattern and an L pattern for a choke coil configured as the second pattern in the same layer, for example. In this way, it is possible to arbitrarily select optimal pattern shapes and variations required in various elements. In other words, it is possible to provide high design freedom and thereby to realize a high-performance multilayer substrate suitable for high-density packaging.

In the present invention, the first conductive pattern may be formed on a surface of a predetermined one of the plurality of insulating layers and at least part of the second conductive pattern may be buried in the predetermined insulating layer. Alternatively, both the first conductive pattern and the second conductive pattern may be formed on a surface of a predetermined one of the plurality of insulating layers. According to the present invention, it is possible to form the first conductive pattern by the subtractive method and to form the second conductive pattern by the additive method. Accordingly, it is possible to arbitrarily select optimal pattern shapes and variations required in various elements.

In the present invention, at least one of the first conductive pattern and the second pattern is preferably formed as a laminated body of a plurality of conductive layers having mutually different etching rates. According to the present invention, it is possible to form a relatively thicker conductive pattern by patterning a clad material in advance, then to attach the relatively thicker pattern onto a core substrate, and then to form a relatively thinner conductive pattern by further patterning the clad material on the core substrate. In this way, it is possible to form all the conductive patterns by using only the subtractive method. As a result, it is only necessary to prepare process equipment designed for the subtractive method, and process equipment designed for the additive method is not required at all.

In the present invention, the laminated body is preferably made of two conductive layers, wherein a combination of the two conductive layers is preferably selected in the combinations of copper (Cu) and aluminum (Al), aluminum (Al) and copper (Cu), copper (Cu) and nickel (Ni), nickel (Ni) and copper (Cu), copper (Cu) and palladium (Pd), copper (Cu) and silver (Ag), stainless steel (SUS) and palladium (Pd), stainless steel (SUS) and silver (Ag), silver (Ag) and stainless steel (SUS), and copper (Cu) and stainless steel (SUS). If the combination of the two types of the conductive layers applies any of the foregoing, it is possible to form the conductive patterns having the mutually different thicknesses reliably by pattern-etching the conductive layers.

In the present invention, it is preferable that the multilayer substrate further includes a via hole electrode for connecting the conductive patterns located on different layers. In this way, it is possible to form the second conductive pattern simultaneously with the via hole. Accordingly, it is possible to form the second conductive pattern within usual processes while avoiding an additional process.

In the present invention, the thickness (t1) of the first conductive pattern is preferably selected in a range from 1 µm to 18 µm, and the thickness (t2) of the second conductive pattern is preferably selected such that a proportion (t2/t1) between the thickness of the first conductive pattern and the second conductive pattern is in a range from 1.5 to 20. When the proportion remains in this range, it is possible to draw an optimal circuit pattern in a necessary position without restriction of design freedom.

In the present invention, at least part of the second conductive patterns preferably serves as a choke coil. In this way, for example, it is possible to realize a multilayer substrate for a power amplifier having fine characteristics.

A method of manufacturing a multilayer substrate according to the present invention comprises a first step for forming a first conductive pattern having a predetermined thickness on a surface of an insulating layer constituting part of a multilayer substrate, a second step for forming a pattern-forming groove on the insulating layer, and a third step for forming a second conductive pattern thicker than the first conductive pattern by filling a space inside the pattern-forming groove with a conductive material.

According to the present invention, it is possible to form the patterns having mutually different thicknesses in the same layer. For example, an LC pattern for a high-frequency circuit and a normal conductive pattern are formed into thin patterns by patterning the conductive layer, and an L pattern for a choke coil is formed into a thick pattern by use of the pattern-forming groove. In this way, it is possible to realize a multilayer substrate for a power amplifier having fine characteristics. Likewise, it is possible to arbitrarily select optimal pattern shapes and variations required in various elements. In other words, it is possible to provide high design freedom and thereby to manufacture a high-performance multilayer substrate suitable for high-density packaging.

In the present invention, the first step preferably includes the step for patterning a conductive layer formed on at least one of surfaces of the insulating layer, and the third step preferably includes the steps of forming a base conductive layer, forming a mask in a region not supposed to deposit the conductive material, and depositing the conductive material by electrolytic plating.

According to the present invention, it is possible to form the thin pattern by the subtractive method and to form the thick pattern by the additive method. Therefore, it is possible to arbitrarily select optimal pattern shapes and variations required in various elements. In this way, it is possible to provide high design freedom and thereby to manufacture a high-performance multilayer substrate suitable for high-density packaging. Here, the mask forming step is preferably achieved by forming a photosensitive material on substantially the entire surface and then patterning the photosensitive material by an exposure process. Alternatively, the mask forming step is preferably achieved by selectively forming an insulative material by screen printing.

In the present invention, the second step preferably includes the step for forming a via hole, and the third step preferably includes the step for filling a space inside the via hole with the conductive material. According to the present invention, it is possible to form the second conductive pattern simultaneously with the step for forming a via hole. Therefore, it is possible to form the conductive pattern using the pattern-forming groove within usual processes while avoiding an additional process.

In the present invention, the second step is preferably configured to form the via hole such that a conductive layer included in a different insulating layer constitutes a bottom of the via hole. According to the present invention, it is possible to form the conductive material by use of a plating solution capable of filling the hole having the bottom almost completely. In this way, it is possible to simplify the processes.

In the present invention, the third step is preferably equivalent to the step for selectively forming the conductive material for filling the space inside the via hole and the space inside the pattern-forming groove. According to the present invention, the conductive material for filling at least part of the space inside the via hole and the space inside the pattern-forming groove is selectively formed. Accordingly, it is possible to suppress a variation in the thickness of the insulating layer caused by polishing.

In another aspect, the method of manufacturing a multilayer substrate according to the present invention comprises a first step for forming a first conductive pattern having a predetermined thickness on a surface of an insulating layer constituting part of a multilayer substrate, and a second step for forming a second conductive pattern thicker than the first conductive pattern on the surface of the insulating layer.

According to the present invention, it is possible to form the patterns having mutually different thicknesses in the same layer. For example, an LC pattern for a high-frequency circuit and a normal conductive pattern are formed into thin patterns by patterning the conductive layer, and an L pattern for a choke coil is formed into a thick pattern by plating. In this way, it is possible to realize a multilayer substrate for a power amplifier having fine characteristics. Likewise, it is possible to arbitrarily select optimal pattern shapes and variations required in various elements. In other words, it is possible to provide high design freedom and thereby to manufacture a high-performance multilayer substrate suitable for high-density packaging.

In the present invention, the first step preferably includes the step for patterning a conductive layer formed on at least one of surfaces of the insulating layer, and the second step preferably includes the steps of forming a base conductive layer on substantially the entire surface, forming a mask in a region not supposed to deposit the conductive material, and depositing the conductive material by electrolytic plating.

According to the present invention, it is possible to form the first conductive pattern by the subtractive method and to form the second conductive pattern by the additive method. Therefore, it is possible to arbitrarily select optimal pattern shapes and variations required in various elements. In this way, it is possible to provide high design freedom and thereby to manufacture a high-performance multilayer substrate suitable for high-density packaging. Here, the mask forming step is preferably achieved by forming a photosensitive material on substantially the entire surface and then patterning the photosensitive material by an exposure process. Alternatively, the mask forming step may be achieved by selectively forming an insulative material by screen printing.

In the present invention, the second step preferably includes the steps of forming a via hole and filling a space inside the via hole with the conductive material. According to the present invention, it is possible to form the second conductive pattern simultaneously with the step for forming a via hole. Therefore, it is possible to form the second conductive pattern within usual processes while avoiding an additional process.

In the present invention, the second step is preferably configured to form the via hole such that a conductive layer included in a different insulating layer constitutes a bottom of the via hole. According to the present invention, it is possible to form the conductive material by use of a plating solution capable of filling the hole having the bottom almost completely. In this way, it is possible to simplify the processes.

In another aspect, the method of manufacturing a multilayer substrate according to the present invention comprises a first step for forming a first conductive pattern by pattern-etching one of surfaces of a clad material configured as a laminated body of a plurality of conductive layers having mutually different etching rates, a second step for attaching the one surface of the clad material to a surface of an insulating layer constituting part of a multilayer substrate, and a third step for forming a second conductive pattern having a different thickness from the first conductive pattern by pattern-etching the other surface of the clad material attached onto the insulating layer.

According to the present invention, it is possible to form the patterns having mutually different thicknesses in the same layer. For example, an LC pattern for a high-frequency circuit and a normal conductive pattern are formed into thin patterns by patterning the conductive layer, and an L pattern for a choke coil is formed into a thick pattern by use of a pattern-forming groove. In this way, it is possible to realize a multilayer substrate for a power amplifier having fine characteristics. In addition, it is possible to form a relatively thicker conductive pattern by pattern-etching the clad material in advance, then to attach the relatively thicker pattern onto a core substrate, and then to form a relatively thinner conductive pattern by further pattern-etching the clad material on the core substrate. In this way, it is possible to form all the conductive patterns by using only the subtractive method. As a result, it is only necessary to prepare process equipment designed for the subtractive method, and process equipment designed for the additive method is not required at all.

In the present invention, it is preferred that the plurality of conductive layers have mutually different thicknesses. Specifically, the thickness of the conductive layer provided on the one surface side of the clad material is preferably thicker than the thickness of the conductive layer provided on the other surface of the clad material. According to the present invention, it is possible to ensure formation of the highly accurate conductive patterns having the mutually different thicknesses.

In the present invention, the clad material is preferably made of a laminated body of conductive layers formed by sequentially laminating a first conductive layer, a second conductive layer, and a third conductive layer. wherein, the first conductive layer and the third conductive layer are preferably made of a predetermined etching material, while the second conductive layer is preferably made of a predetermined etch-stop material. Moreover, a combination of the etching material and the etch-stop material is preferably selected in the combinations of copper (Cu) and aluminum (Al), aluminum (Al) and copper (Cu), copper (Cu) and nickel (Ni), nickel (Ni) and copper (Cu), copper (Cu) and palladium (Pd), copper (Cu) and silver (Ag), stainless steel (SUS) and palladium (Pd), stainless steel (SUS) and silver (Ag), silver (Ag) and stainless steel (SUS), and copper (Cu) and stainless steel (SUS). If the combination of the etching material and the etch-stop material applies any of the foregoing, it is possible to form the conductive patterns having the mutually different thicknesses reliably by pattern-etching the conductive layers.

Meanwhile, in the present invention, the first conductive layer preferably constitutes the one surface of the clad material and the third conductive layer preferably constitutes the other surface of the clad material. In this way, it is possible to form the relatively thicker pattern by pattern-etching the first conductive layer and to form the relatively thinner conductive pattern by pattern-etching the third and second conductive layers. Accordingly, it is possible to ensure formation of the conductive patterns having the mutually different thicknesses.

In the present invention, it is preferable that the method further includes the steps of forming a via hole and selectively forming a conductive material for filling a space inside the via hole. Here, when the space inside the via hole is filled with the conductive material, the conductive material is selectively formed by forming a mask in a region not supposed to deposit the conductive material. In this way, it is possible to suppress a variation in the thickness of the insulating layer caused by polishing. As a consequence, it is possible to significantly improve pattern accuracy when the conductive pattern is formed by patterning the conductive layer in accordance with the subtractive method. Moreover, since a protruded portion of the selectively formed conductive material is mainly subjected to polishing, it is possible to reduce occurrence of warpage as compared to polishing the entire surface. In this way, it is possible to suppress a variation in the impedance even in the case of forming a passive element such as an LC for a high-frequency circuit on a core substrate, for example.

In the present invention, the insulating layer may be either a core substrate or a build-up layer to be provided on the core substrate. Moreover, the insulating layer may be a combination of the core substrate and the build-up layer. When the present invention is applied to both of the core substrate and the build-up layer, it is possible to reduce variations in the thickness in terms of both of a conductive pattern to be formed on a surface of the core substrate and a conductive pattern to be formed on a surface of the build-up layer. As a result, it is possible to improve pattern accuracy on the whole.

As described above, according to the present invention, it is possible to form relatively thinner patterns in terms of an LC pattern for a high-frequency circuit that requires small variations in the width and the thickness of the pattern as well as accuracy in the thickness relative to an insulating pattern, and in terms of a normal conductive pattern that requires impedance matching (the LC pattern and the normal conductive pattern are collectively deemed as the first conductive pattern), by pattern-etching a conductive layer having a uniform thickness by the subtractive method. Meanwhile, in terms of an L pattern for a choke coil (the second conductive pattern), it is possible to form a pattern having a high aspect ratio and a relatively large cross-sectional area (which has a low direct-current resistance) by forming the pattern-forming groove applying a drilling process in the same step for forming a via hole, and then filling spaces in the via hole and the pattern-forming groove with a conductive material. In other words, according to the present invention, it is possible to arbitrarily select optimal pattern shapes and variations required in various elements. In this way, it is possible to provide high design freedom and thereby to realize a high-performance multilayer substrate suitable for high-density packaging.

Moreover, according to the present invention, it is possible to suppress a variation in the thickness of a conductive material which is caused by polishing. As a consequence, pattern accuracy can be significantly improved when a conductive pattern is formed by a patterning method such as the subtractive method. In this way, it is possible to suppress a variation in the impedance when a passive element such as a capacitor or an inductor is incorporated into a multilayer substrate, for example.

BRIEF DESCRIPTION OF THE DRAWINGS

The above and other objects, features and advantages of this invention will become more apparent by reference to the following detailed description of the invention taken in conjunction with the accompanying drawings.

DETAILED DESCRIPTION OF THE EMBODIMENTS

Preferred embodiments of the present invention will now be described in detail with reference to the accompanying drawings.

A method of manufacturing a multilayer substrate according to the present invention is applicable to both of a "core substrate" and a "build-up layer" to be provided on the core substrate, which constitutes the multilayer substrate. First, the case of applying the method of manufacturing a multilayer substrate according to a first embodiment of the present invention to a "core substrate" will be described with reference to schematic cross-sectional views in FIG. 1 to FIG. 16.

Figure 1:
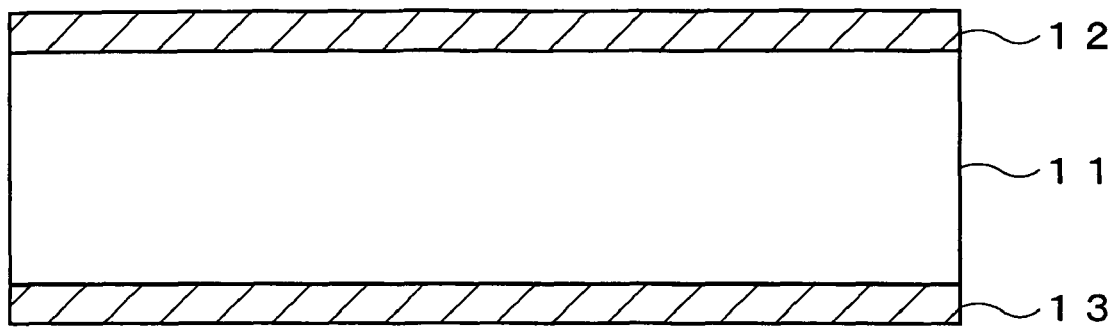
FIG. 1 is a schematic cross-sectional view showing a process (preparing a core substrate) in the method of manufacturing a multilayer substrate according to a first embodiment of the present invention.

A core substrate 10 is prepared to begin with (FIG. 1). The core substrate 10 before processing includes an insulating layer 11, and conductive layers 12 and 13 respectively formed on both surfaces of the insulating layer 11. The insulating layer 11 serves to ensure overall mechanical strength upon fabrication of a multilayer substrate. Although the material of the insulating layer 11 is not particularly limited, it is preferable to use a core made of a glass cloth, Kevlar, a resin cloth such as liquid crystal polymer, a fluoroplastic porous sheet or the like, which is impregnated with thermosetting resin, thermoplastic resin or the like. The thickness of the insulating layer 11 is set preferably in a range from about 20 μm to 200 μm. Alternatively, it is possible to use a sheet material without a core, such as LCP, PPS, PES, PEEK or PI as the insulating layer 11 in order to uniformize laser processing conditions. The conductive layers 12 and 13 are preferably made of a metal foil, particularly to a copper foil. A thickness (t1) of each conductive layer is set preferably in a range from about 1 to 18 μm. When forming the conductive layers 12 and 13 by using a copper foil, it is possible to minimize a variation in the thickness either by use of an electrolytic copper foil (a copper foil formed by electrodepositing copper ions dissolved in a copper sulfate aqueous solution continuously onto an electrodeposited roll) generally applied to printed circuit boards, or by use of a rolled copper foil. Alternatively, it is possible to regulate the thickness of the copper foil by a surface uniform etching process (SUEP) or any other methods as appropriate.

Figure 2:
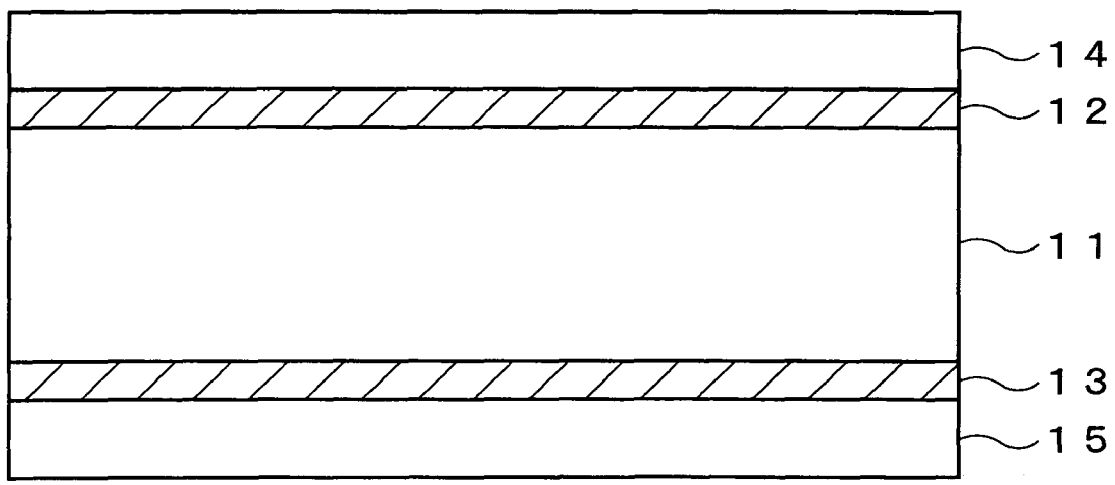
FIG. 2 is a schematic cross-sectional view showing a process (forming dry films) in the method of manufacturing the multilayer substrate according to the first embodiment of the present invention.
Figure 3:
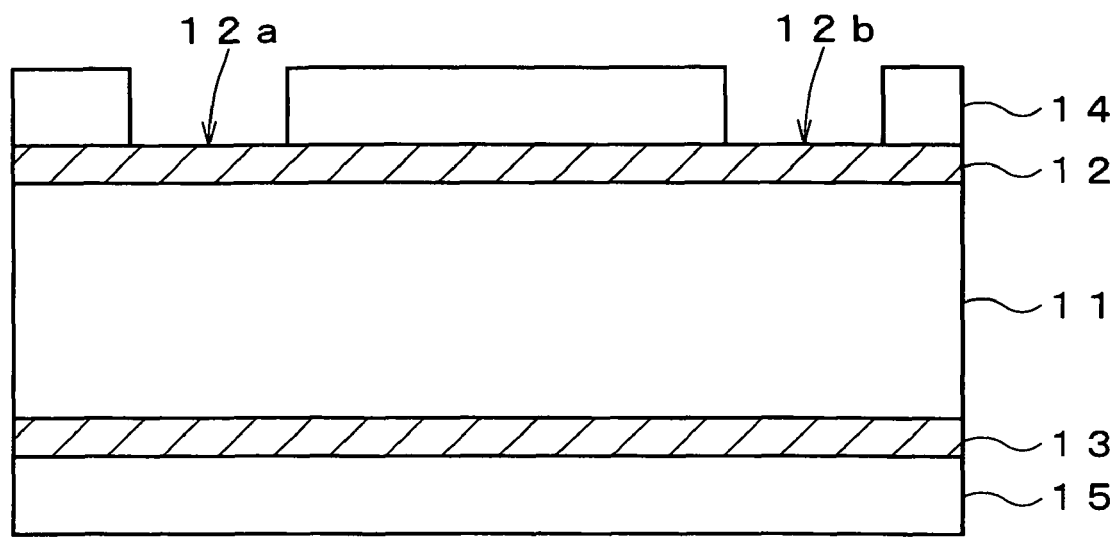
FIG. 3 is a schematic cross-sectional view showing a process (exposing and developing the dry films) in the method of manufacturing the multilayer substrate according to the first embodiment of the present invention.

Next, dry films 14 and 15 made of a photosensitive material are respectively attached to both surfaces of the core substrate 10 (FIG. 2). In this way, substantially the entire surfaces of the conductive layers 12 and 13 are covered with the dry films 14 and 15. Thereafter, the dry film 14 is partially removed by exposure and development processes to expose portions 12a and 12b of the conductive layer 12 (FIG. 3).

Figure 4:
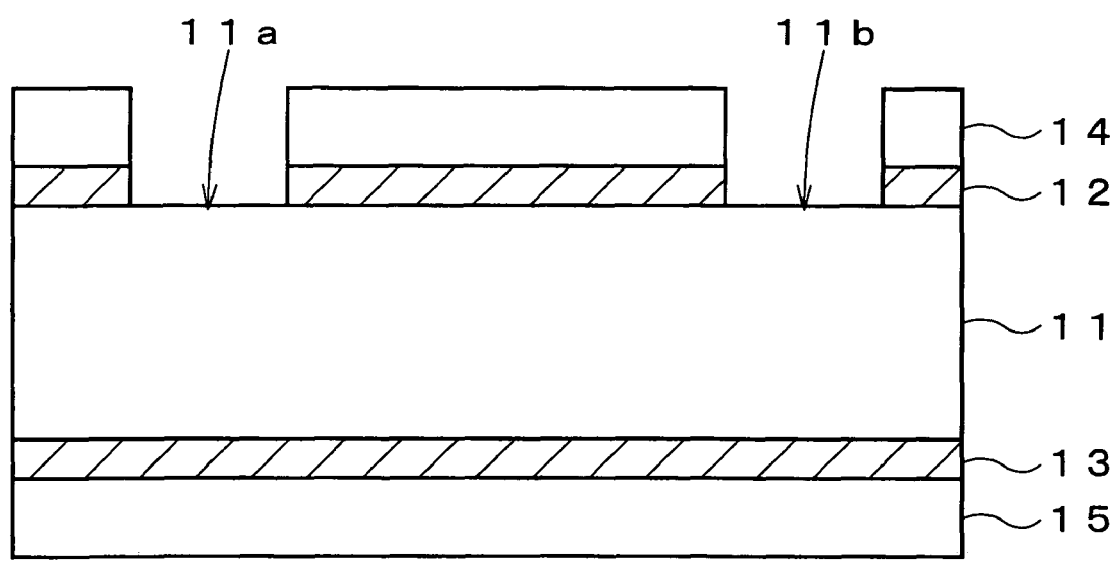
FIG. 4 is a schematic cross-sectional view showing a process (etching the conductive layer) in the method of manufacturing the multilayer substrate according to the first embodiment of the present invention.

Next, the conductive layer 12 is etched while using the dry film 14 as a mask, and the insulating layer 11 is partially exposed (FIG. 4). A portion 11a in an exposed region of the insulating layer constitutes an open portion for a via hole, and another portion 11b constitutes an open portion for a pattern-forming groove.

Figure 5:
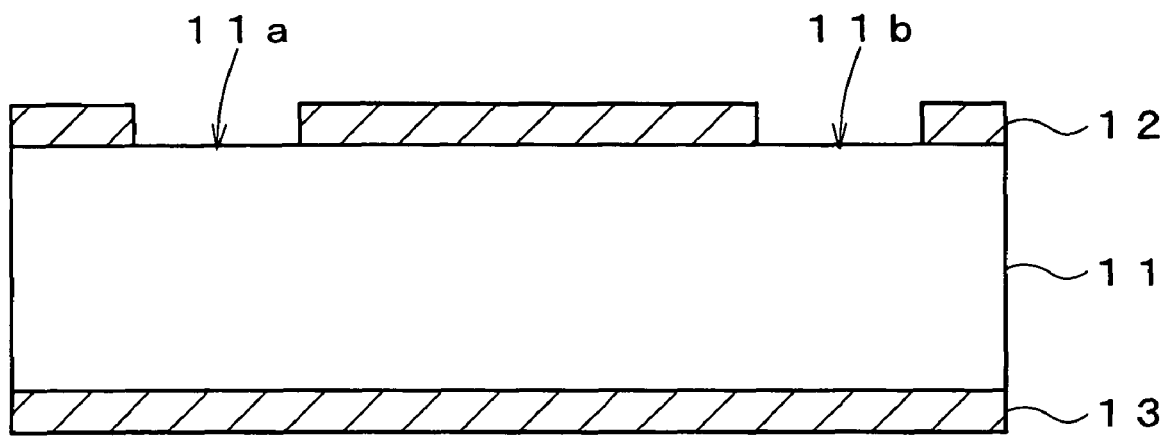
FIG. 5 is a schematic cross-sectional view showing a process (removing the dry films) in the method of manufacturing the multilayer substrate according to the first embodiment of the present invention.
Figure 6:
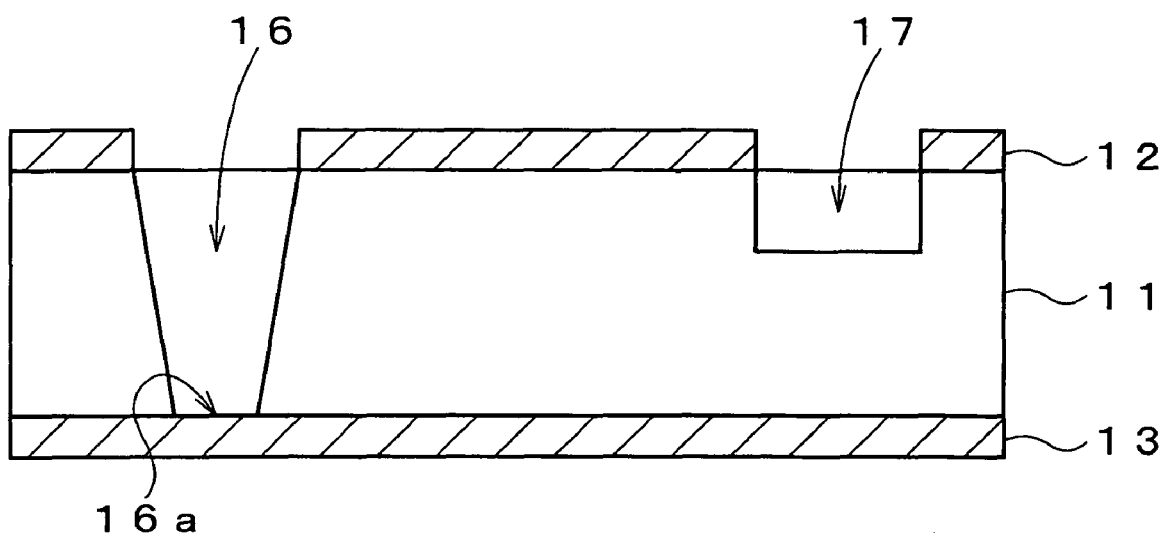
FIG. 6 is a schematic cross-sectional view showing a process (forming a via hole and a pattern-forming groove) in the method of manufacturing the multilayer substrate according to the first embodiment of the present invention.

Next, the dry films 14 and 15 are peeled off (FIG. 5). Then, a via hole 16 is formed at the portion 11a in the exposed region of the insulating layer 11 and a pattern-forming groove 17 is formed at the portion 11b in the exposed region of the insulating layer 11 by laser processing (FIG. 6). In the laser processing, the via hole 16 and the pattern-forming groove 17 are respectively formed by setting laser power and irradiation time to optimal levels depending on the location. Although the via hole 16 penetrates the insulating layer 11, the conductive layer 13 serves as a stopper in this case. Accordingly, this conductive layer 13 constitutes a bottom 16a of the via hole 16. The diameter of the via hole 16 is not particularly limited but is preferably set in a range from about 30 to 200 μm. Meanwhile, the pattern-forming groove 17 is formed only by etching the insulating layer 11 to a predetermined depth, and the pattern-forming groove 17 does not penetrate the insulating layer 11 unlike the via hole 16. The depth of the pattern-forming groove 17 is preferably set such that a proportion (t2/t1) between the thickness (t1) of each of the conductive layer 12 and 13 and a thickness (t2) of a conductive pattern to be ultimately formed by use of the pattern-forming groove 17 is in a range from 1.5 to 20.

Figure 7:
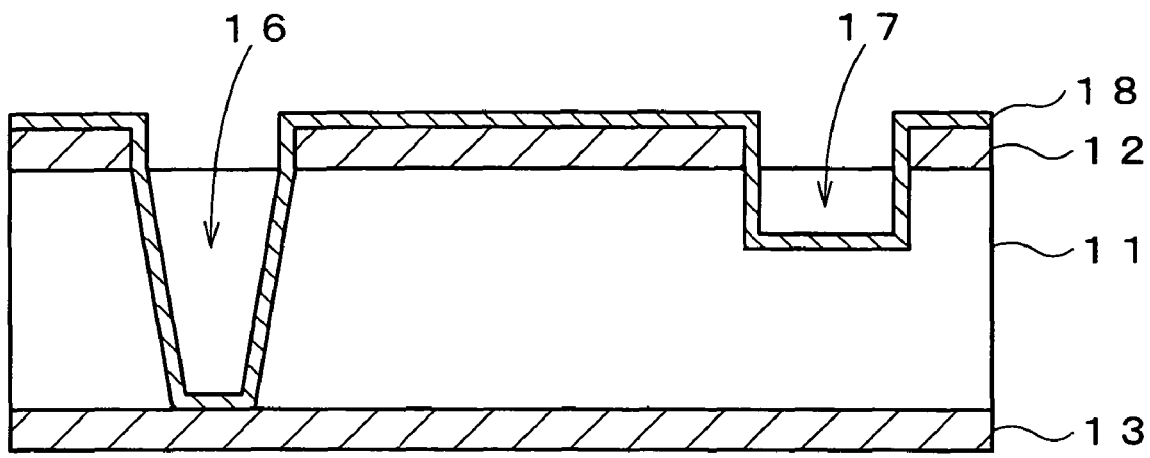
FIG. 7 is a schematic cross-sectional view showing a process (forming a base conductive layer) in the method of manufacturing the multilayer substrate according to the first embodiment of the present invention.

Next, a base conductive layer 18 is formed on substantially the entire exposed surface including inner walls of the via hole 16 and the pattern-forming groove 17 (FIG. 7). As the method of forming the base conductive layer 18, it is preferable to apply an electroless plating method, a sputtering method, a vapor deposition method, and the like. The base conductive layer 18 serves as a base for electrolytic plating to be performed later. Accordingly, the base conductive layer 18 is formed in a very small thickness, which may be selected appropriately from a range of several hundred angstroms to 3.0 μm.

Figure 8:
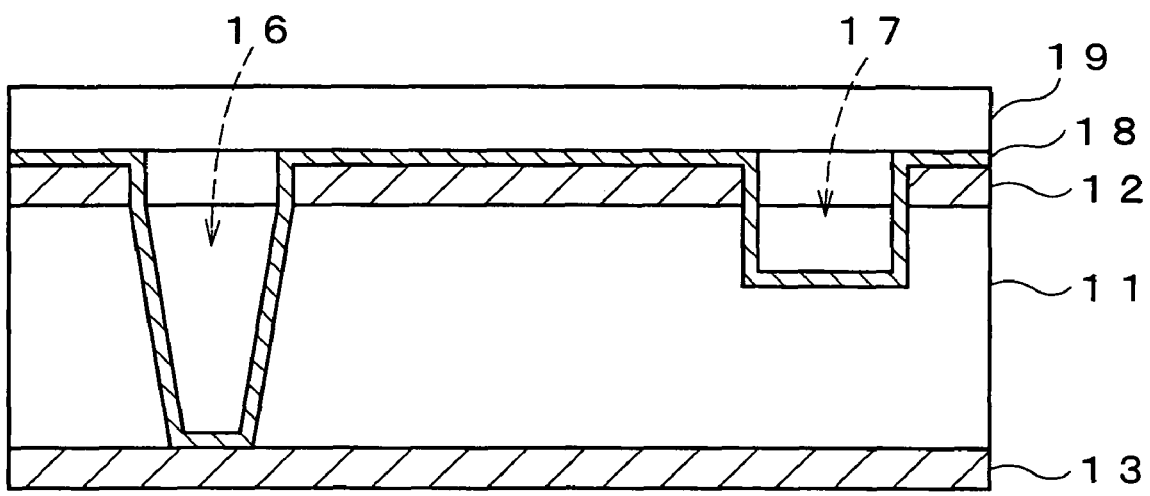
FIG. 8 is a schematic cross-sectional view showing a process (forming a dry film) in the method of manufacturing the multilayer substrate according to the first embodiment of the present invention.
Figure 9:
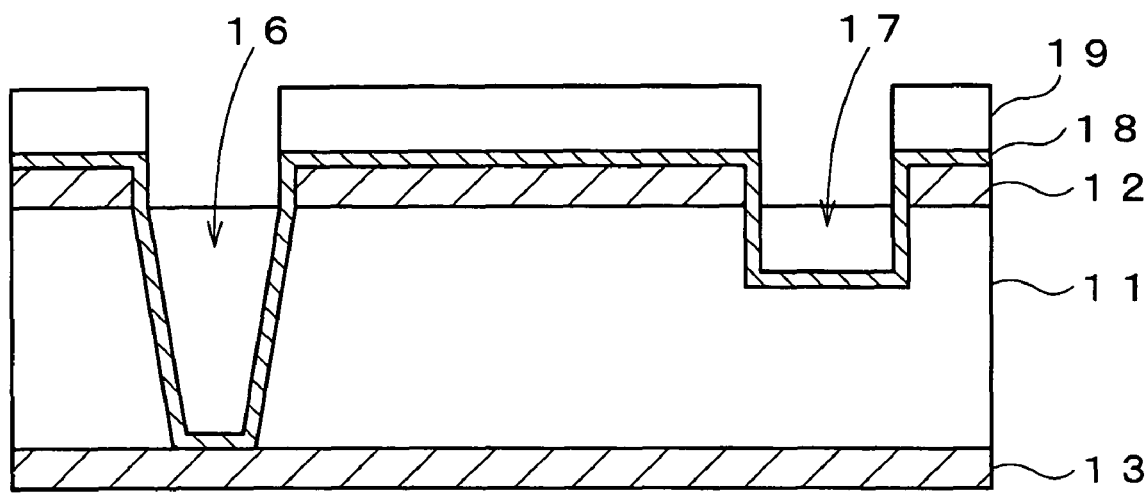
FIG. 9 is a schematic cross-sectional view showing a process (exposing and developing the dry film) in the method of manufacturing the multilayer substrate according to the first embodiment of the present invention.

Next, a dry film 19 made of a photosensitive material is attached to a surface of the core substrate 10 (FIG. 8). In this way, substantially the entire surface of the base conductive layer 18 is covered with the dry film 19. Then, the dry film 19 located above the open portions for the via hole 16 and the pattern-forming groove 17 is removed by exposing and developing the dry film 19 (FIG. 9). The remaining dry film 19 is used as a mask for the electrolytic plating to be performed later.

Figure 10:
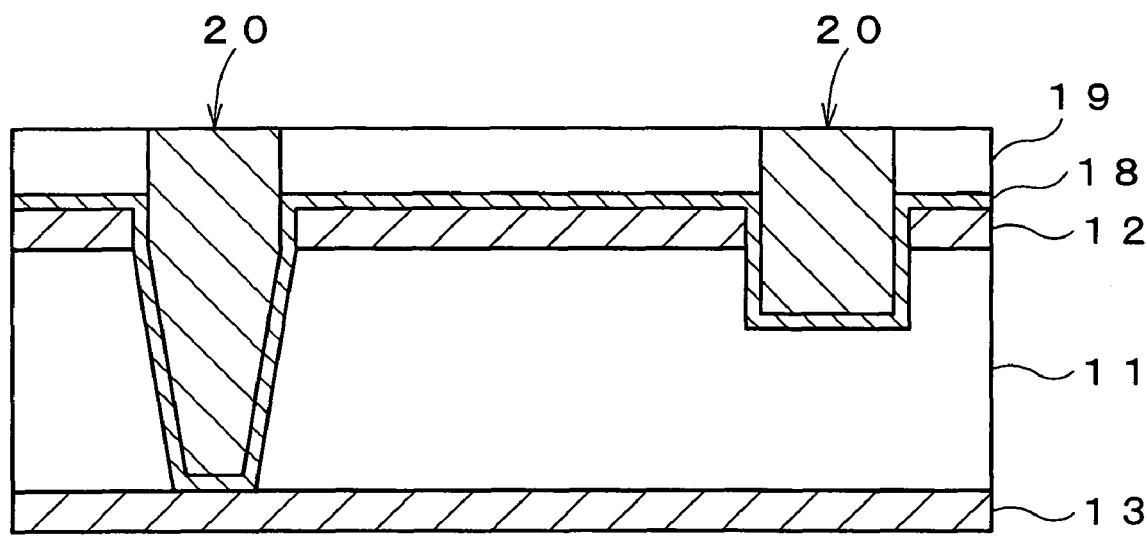
FIG. 10 is a schematic cross-sectional view showing a process (forming a conductive material) in the method of manufacturing the multilayer substrate according to the first embodiment of the present invention.
Figure 11:
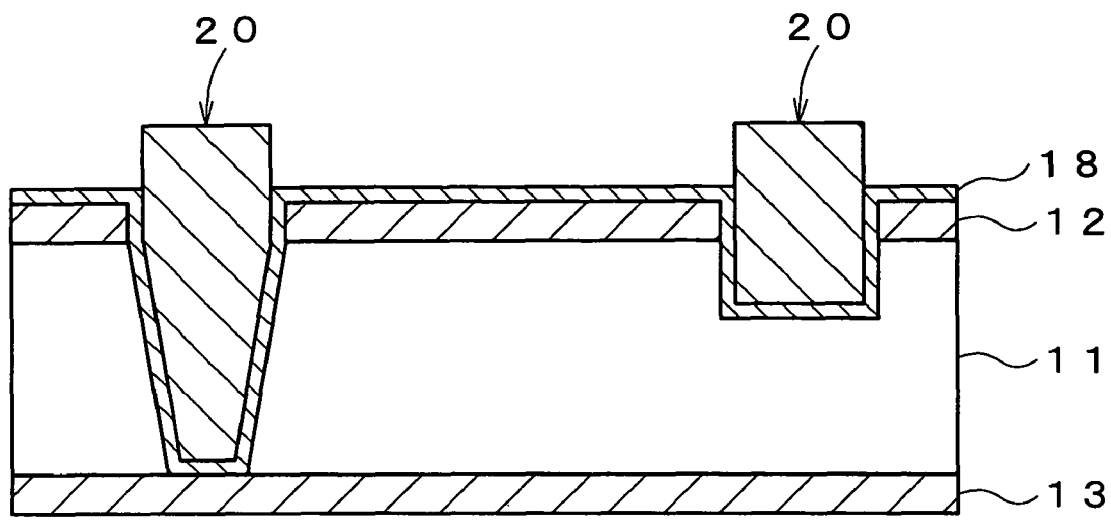
FIG. 11 is a schematic cross-sectional view showing a process (removing the dry film) in the method of manufacturing the multilayer substrate according to the first embodiment of the present invention.

Next, a conductive material 20 is deposited in the region not covered with the dry film 19 by electrolytic plating (FIG. 10). In other words, the conductive material 20 is selectively formed in the region not covered with the dry film 19, instead of the entire surface of the core substrate 10. In this way, a space inside the via hole 16 is almost completely filled with the conductive material 20. Similarly, a space inside the pattern-forming groove 17 is also almost completely filled with the conductive material 20.

The electrolytic plating is preferably performed to fill the spaces inside the via hole 16 and the pattern-forming groove 17 completely with the conductive material 20. The type of a plating solution may be appropriately selected. For example, when using copper (Cu) as the conductive material 20, it is possible to use copper sulfate as the plating solution. If a void is left in the space inside the via hole 16, it is preferable to fill the space inside the via hole 16 with conductive resin. This is because when a void is left, the plating solution and the like will remain inside the void and will lead to corrosion of the via hole. It is also possible to use insulative resin instead. However, it is preferable to use the conductive resin to ensure electrical connection of the layers above and below the via hole 16

Figure 12:
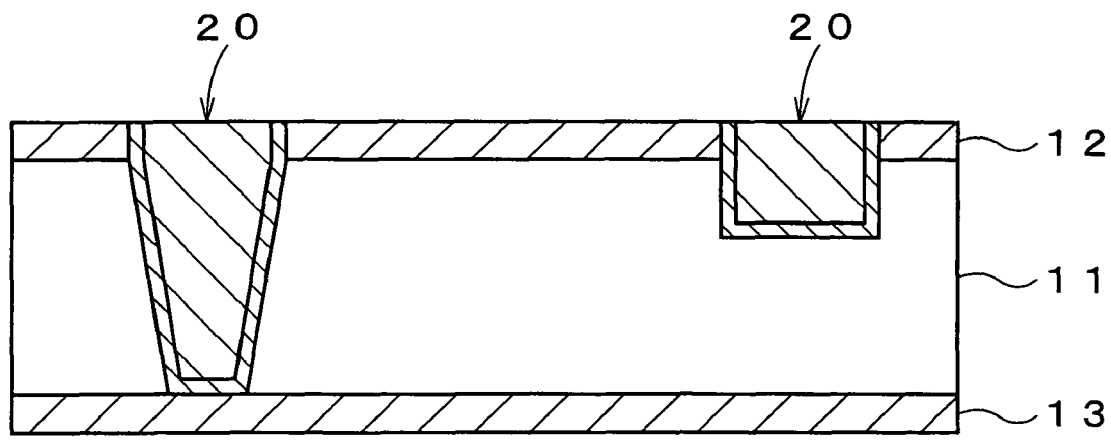
FIG. 12 is a schematic cross-sectional view showing a process (polishing the conductive material) in the method of manufacturing the multilayer substrate according to the first embodiment of the present invention.
Figure 13:
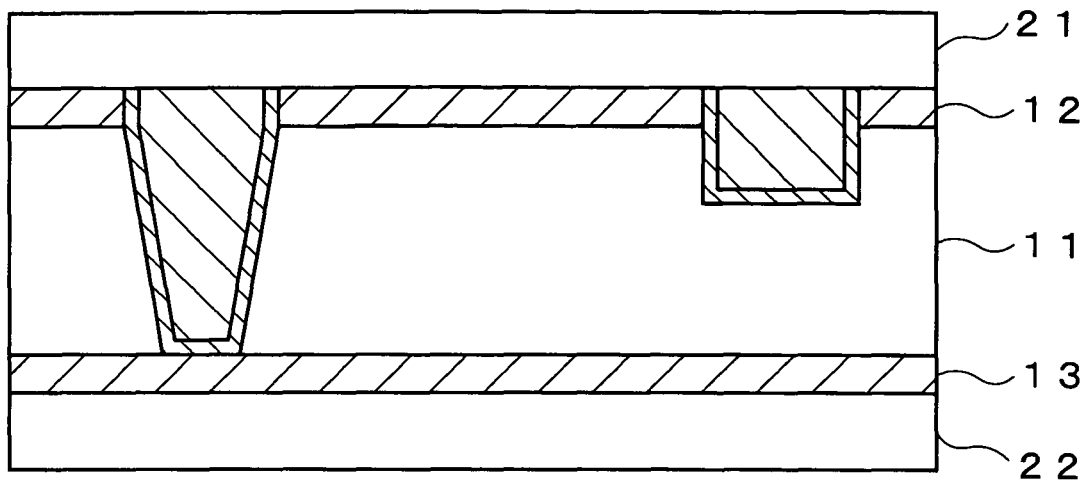
FIG. 13 is a schematic cross-sectional view showing a process (forming dry films) in the method of manufacturing the multilayer substrate according to the first embodiment of the present invention.

Next, after peeling the dry film 19 off (FIG. 11), the conductive material 20 is polished parallel to the surface of the core substrate 10, thereby planarizing the entire surface (FIG. 12). At this time, it is possible to planarize the entire surface reliably by performing the polishing process so as to remove the base conductive layer 18 and further to polish a small amount of the surface of the conductive layer 12. The polishing process may apply only one of a chemical polishing method and a mechanical polishing method using a buff. However, it is preferable to perform the both methods. Particularly, it is possible to ensure a very high degree of flatness by performing the chemical polishing method and then performing the mechanical polishing method using the buff.

If a large amount of the surface of the conductive layer 12 is polished in this polishing process, a variation in the thickness of the conductive layer 12 may be slightly increased. However, the conductive material 20 is not formed on the entire surface but is formed selectively. Therefore, even when the conductive layer 12 is polished along with polishing the conductive material 20, an amount of the conductive layer 12 to be polished off is very limited. For this reason, the increase in the variation in the thickness is also very limited. On the contrary, if the conductive material 20 is formed on the entire surface without using the dry film 19, it is necessary to polish a relatively a large amount (in the thickness of 20 μm, for example) of the conductive material 20 on the whole. Accordingly, the variation in the thickness of the conductive layer 12 eventually becomes quite large. This is why this embodiment provides the mask made of the dry film 19 in the region not supposed to deposit the conductive material 20. It is to be noted, however, that formation of the mask in the region not supposed to deposit the conductive material 20 is not always essential in the present invention.

Figure 14:
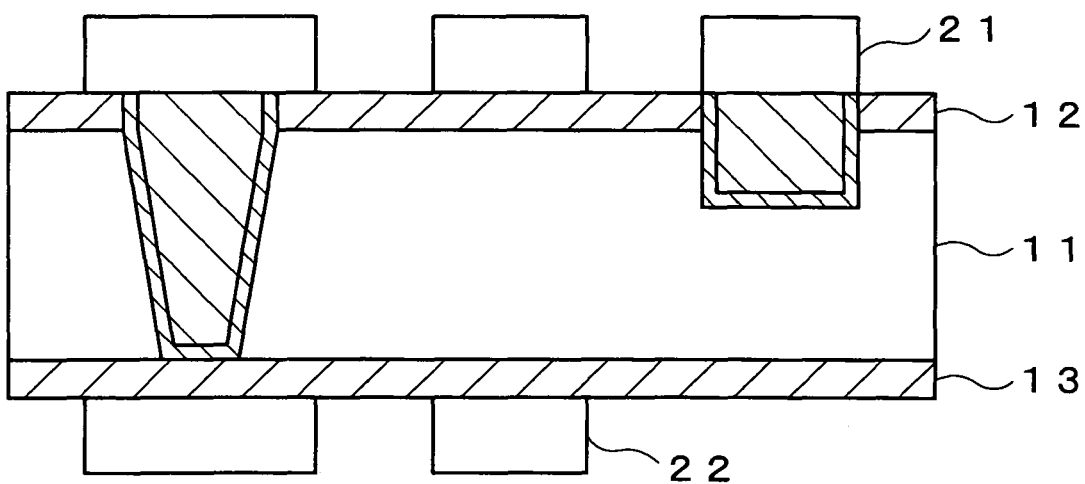
FIG. 14 is a schematic cross-sectional view showing a process (exposing and developing the dry films) in the method of manufacturing the multilayer substrate according to the first embodiment of the present invention.
Figure 15:
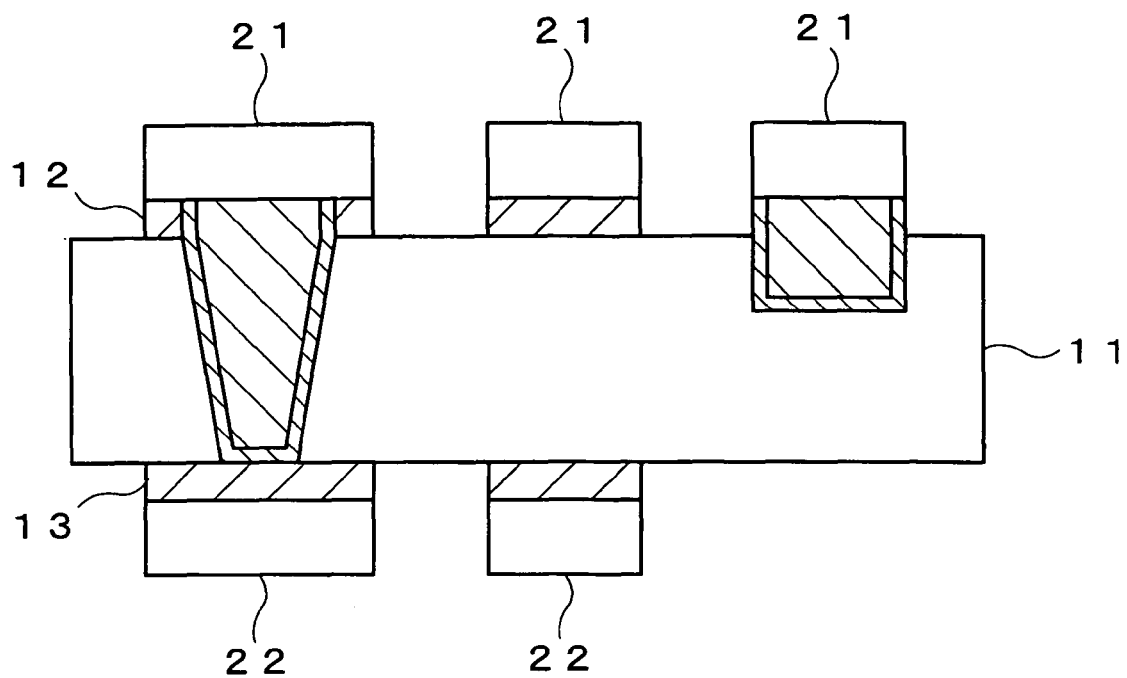
FIG. 15 is a schematic cross-sectional view showing a process (etching the conductive layers) in the method of manufacturing the multilayer substrate according to the first embodiment of the present invention.
Figure 16:
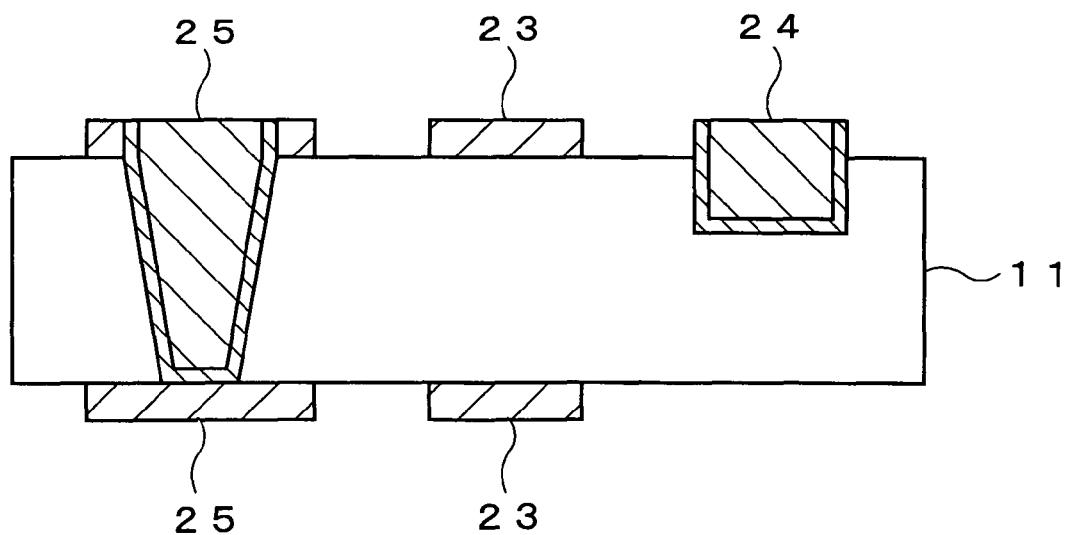
FIG. 16 is a schematic cross-sectional view showing a process (removing the dry films) in the method of manufacturing the multilayer substrate according to the first embodiment of the present invention.

Next, dry films 21 are attached to the both surfaces of the core substrate (FIG. 13), and are patterned by performing exposing and developing processes. In this way, the conductive layers 12 and 13 are partially exposed (FIG. 14). Thereafter, the exposed portions of the conductive layers 12 and 13 are removed by etching (FIG. 15). Here, the variation in the thickness of the conductive layers 12 and 13 subject to patterning is reduced to a very small amount. Accordingly, it is possible to perform patterning at high accuracy. Each of the remaining conductive layers 12 and 13 constitutes a normal conductive pattern (a first conductive pattern) 23 and part of an electrode pattern 25 on the via hole electrode. The dry films 21 are lastly peeled off to complete the series of processes on the core substrate 10. In this way, a processed core substrate 26 which includes the relatively thinner first conductive pattern 23, a relatively thicker second conductive pattern 24, and the electrode pattern 25 on the via hole electrode is completed (FIG. 16).

Figure 17:
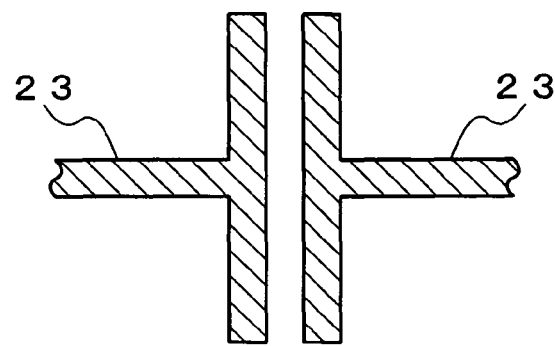
FIG. 17 is a schematic plan view showing a example of the shape of the conductive pattern (an opposed pattern).
Figure 18:
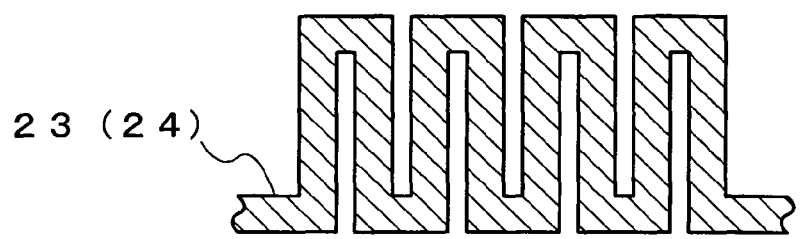
FIG. 18 is a schematic plan view showing a example of the shape of the conductive pattern (a meandering pattern).
Figure 19:
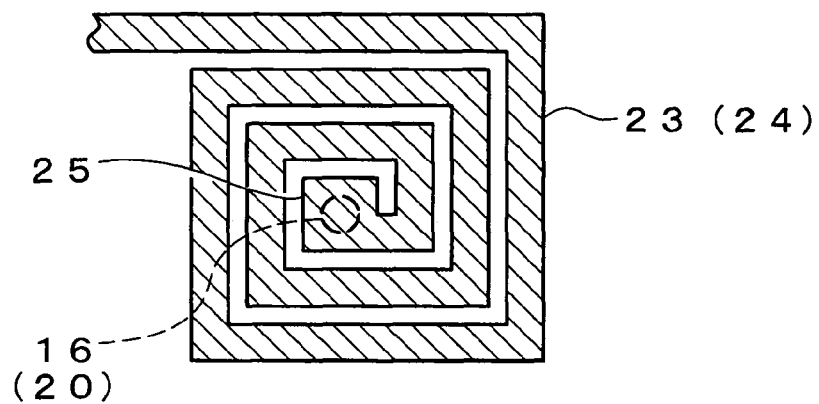
FIG. 19 is a schematic plan view showing a example of the shape of the conductive pattern (a spiral pattern).
Figure 20:
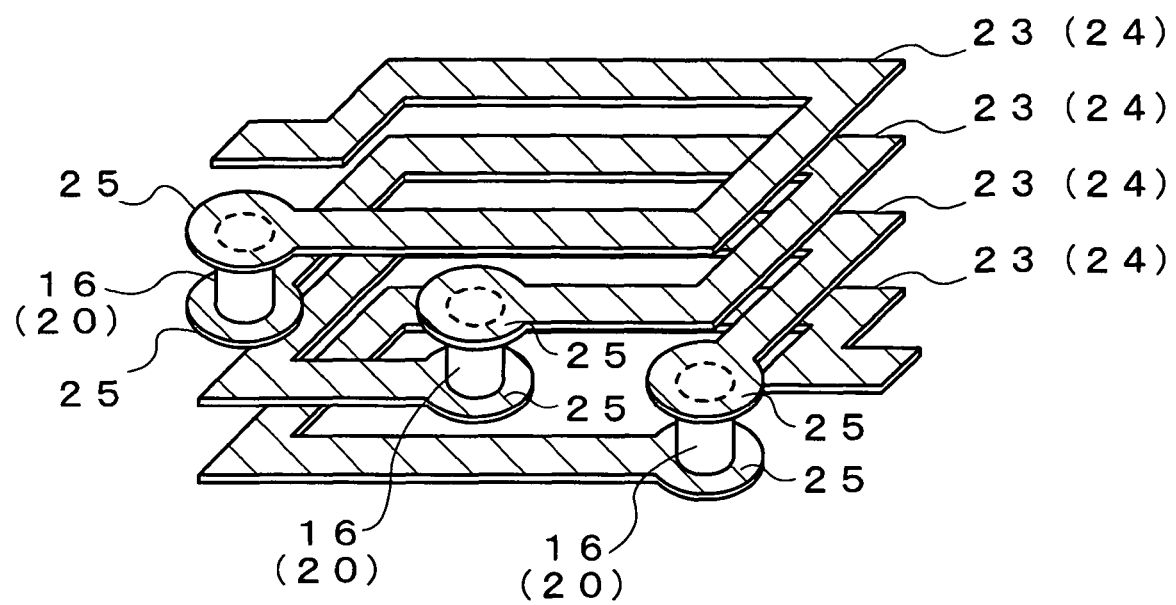
FIG. 20 is a schematic plan view showing a example of the shape of the conductive pattern (a helical pattern).

FIG. 17 to FIG. 19 are plan views showing various conductive pattern shapes. Meanwhile, FIG. 20 is a perspective view showing still another conductive pattern shape.

For example, it is possible to form a capacitor element by designing the shape of the conductive pattern 23 into an opposed pattern as shown in FIG. 17. Meanwhile, it is possible to form an inductor element by designing the shape of the conductive pattern 23 (or 24) into a meandering pattern as shown in FIG. 18, a spiral pattern as shown in FIG. 19 or a helical pattern as shown in FIG. 20. In FIG. 19, the electrode pattern 25 on the via hole 16 is formed in the center of the spiral pattern, whereby the conductive pattern is connected to another conductive pattern on a different layer through the via hole 16 filled with the conductive material 20. Meanwhile, in FIG. 20, the electrode pattern 25 on the via hole 16 is formed at a terminal end portion of the approximately loop pattern, where by the conductive pattern is connected to another approximately loop pattern on a different layer through the via hole 16 filled with the conductive material 2b. In this way, these patterns collectively constitute the helical pattern. The impedance of the passive elements thereof varies greatly depending on the width and thickness of the conductive pattern. However, it is possible to achieve patterning at high accuracy by using the method of this embodiment. As a result, it is possible to drastically reduce variations in characteristics of these passive elements.

As described above, according to this embodiment, it is possible to form patterns having mutually different thicknesses in the same layer. Therefore, an LC pattern for a high-frequency circuit that requires small variations in the width and the thickness of the pattern and a normal conductive pattern that requires impedance matching can be formed as the first conductive pattern formed by patterning the conductive layers. Meanwhile, an L pattern for a choke coil that requires a high aspect ratio and a relatively large cross-sectional area (which has a low direct-current resistance) can be formed as the second conductive pattern by use of the pattern-forming groove. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a core substrate suitable for high-density packaging.

Furthermore, according to this embodiment, it is possible to form the pattern-forming groove in the same step for forming the via hole by laser processing. Then, the second conductive pattern is formed by filling the space inside the pattern-forming groove with the conductive material simultaneously in the step for filling the space inside the via hole with the conductive material. Therefore, it is possible to form the second conductive pattern within usual processes without increasing an additional process.

In addition, according to this embodiment, the mask is formed in the region not supposed to deposit the conductive material and the conductive material is selectively deposited in the process of filling the spaces inside the via hole and the pattern-forming groove. Accordingly, it is possible to reduce the variation in the thickness of the conductive layer caused by polishing. Therefore, pattern accuracy can be significantly improved when forming the conductive pattern by patterning the conductive layer. In this way, it is possible to suppress a variation in the impedance in the case of forming a passive element such as an LC for a high-frequency circuit on the core substrate, for example.

Next, the case of applying the method of manufacturing a multilayer substrate of this embodiment to a "build-up layer" will be described with reference to schematic cross-sectional views in FIG. 21 to FIG. 37.

The method according to this embodiment is applicable to a build-up layer to be laminated on the processed core substrate 26 which is fabricated by the method described with reference to FIG. 1 to 16, or to a build-up layer to be laminated on a processed core substrate that will be fabricated by other methods to be described later. In any case, it is preferable to apply this method to a build-up layer to be laminated on any of the core substrates which is fabricated by the method of manufacturing a multilayer substrate of the present invention. In this way, the variation in the thickness is reduced in terms of the conductive pattern formed on the surface of the core substrate as well as the conductive pattern formed on the surface of the build-up layer. As a consequence, it is possible to improve the pattern accuracy on the whole. Now, the case of applying this embodiment to the build-up layer to be laminated on the processed core substrate 26 (see FIG. 16) will be described.

Figure 21:
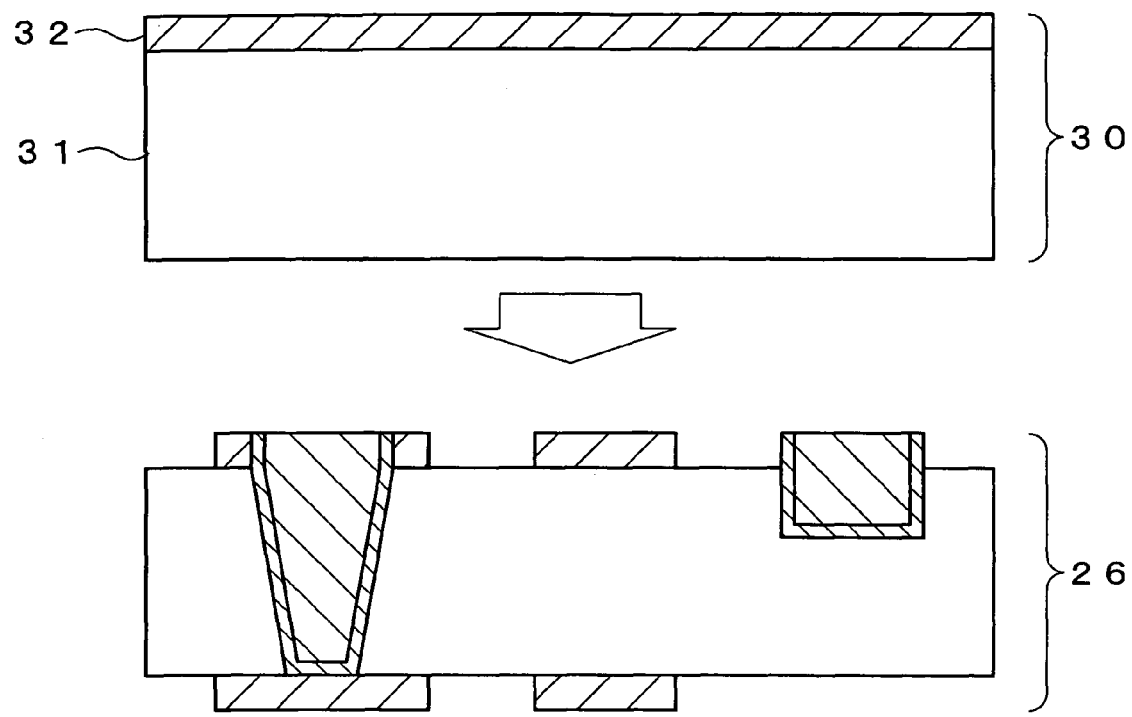
FIG. 21 is a schematic cross-sectional view showing a process (pressing a build-up layer) in the method of manufacturing a multilayer substrate according to the first embodiment of the present invention.
Figure 22:
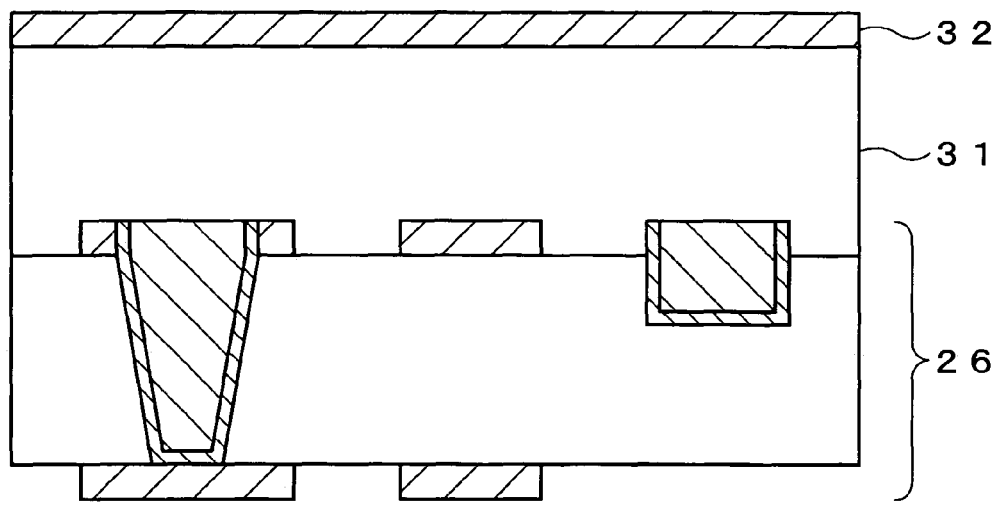
FIG. 22 is a schematic cross-sectional view showing a process (preparing the multilayer substrate) in the method of manufacturing the multilayer substrate according to the first embodiment of the present invention.

First, the processed core substrate 26 fabricated by the method described with reference to FIG. 1 to FIG. 16 is prepared, and a build-up layer 30 is laminated thereon (FIG. 21). The build-up layer 30 before processing is made of a sheet (a resin-coated metal film) made of thermosetting resin 31 such as B-stage epoxy resin, which is provided with a metal foil 32. This sheet is laminated on the core substrate 26 so as to allow the thermosetting resin 31 to face the core substrate 26. The thermosetting resin 31 is hardened by subjecting this laminated body to hot pressing. Accordingly, the build-up layer 30 is integrated with the core substrate 26 (FIG. 22). In this way, the thermosetting resin 31 constitutes an insulating layer of the build-up layer, while the metal foil 32 constitutes a conductive layer thereof.

Figure 23:
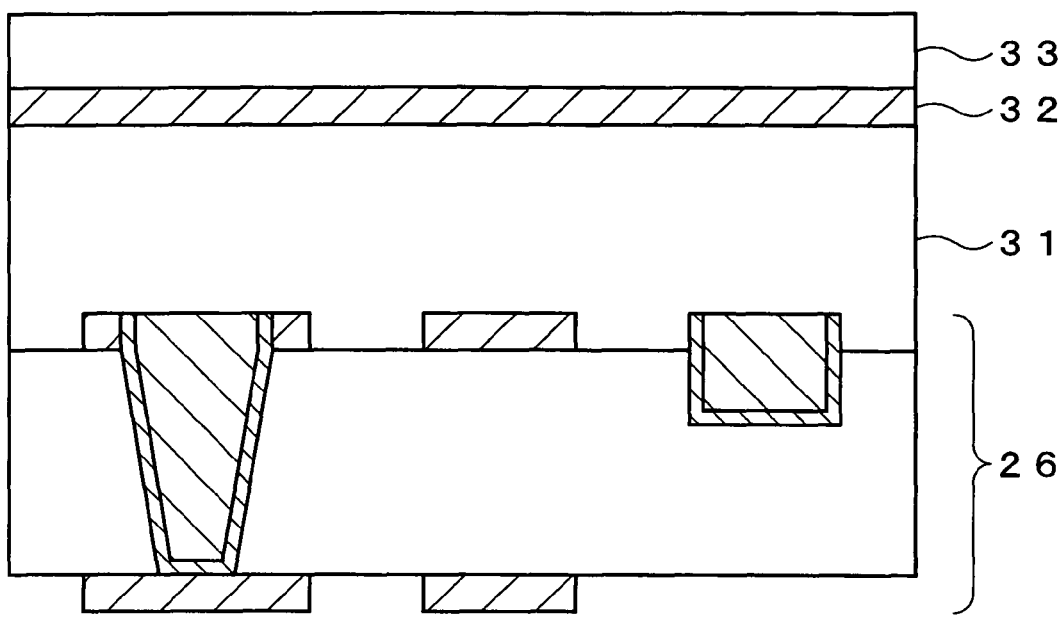
FIG. 23 is a schematic cross-sectional view showing a process (forming a dry film) in the method of manufacturing the multilayer substrate according to the first embodiment of the present invention.
Figure 24:
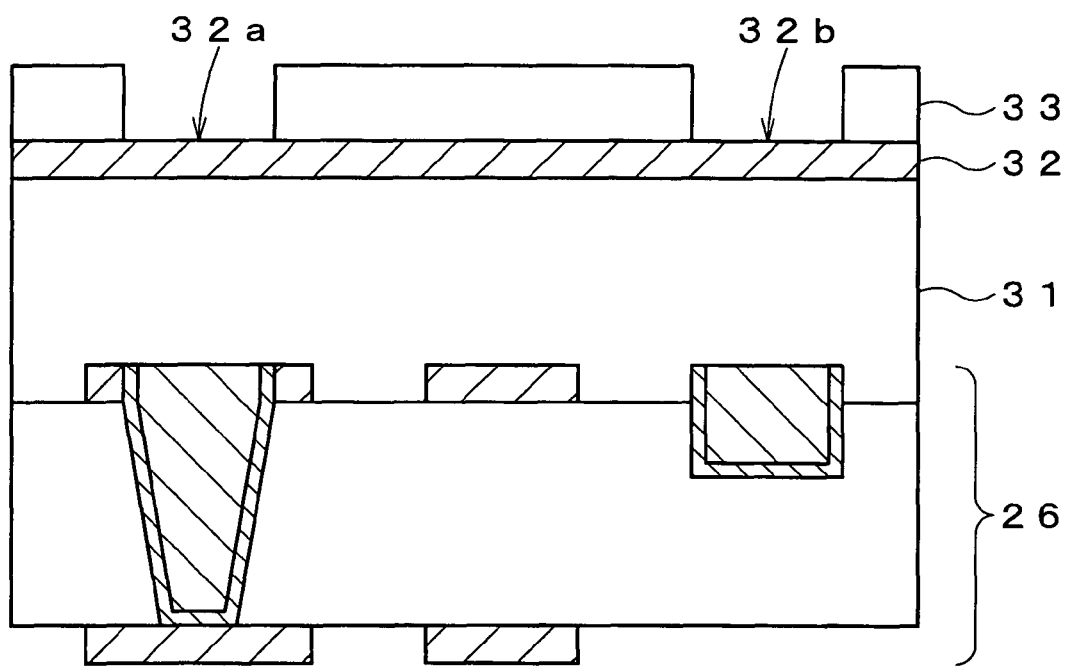
FIG. 24 is a schematic cross-sectional view showing a process (exposing and developing the dry film) in the method of manufacturing the multilayer substrate according to the first embodiment of the present invention.

Next, a dry film 33 made of a photosensitive material is attached to a surface of the build-up layer 30 (FIG. 23). In this way, substantially the entire surface of the conductive layer 32 is covered with the dry film 33. Thereafter, the dry film 33 is partially removed by exposure and development processes to expose portions 32a and 32b of the conductive layer 32 (FIG. 24).

Figure 25:
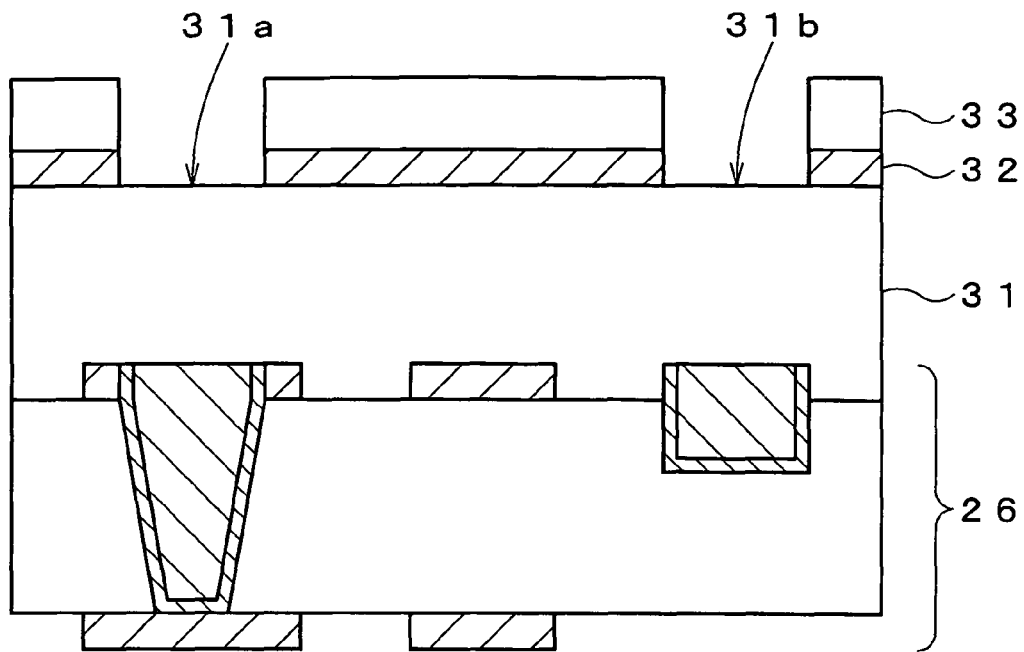
FIG. 25 is a schematic cross-sectional view showing a process (etching the conductive layer) in the method of manufacturing the multilayer substrate according to the first embodiment of the present invention.

Next, the conductive layer 32 is etched while using the dry film 33 as a mask, and the insulating layer 31 is partially exposed (FIG. 25). A portion 31a in an exposed region of the insulating layer constitutes an open portion for a via hole, and another portion 31b constitutes an open portion for a pattern-forming groove.

Figure 26:
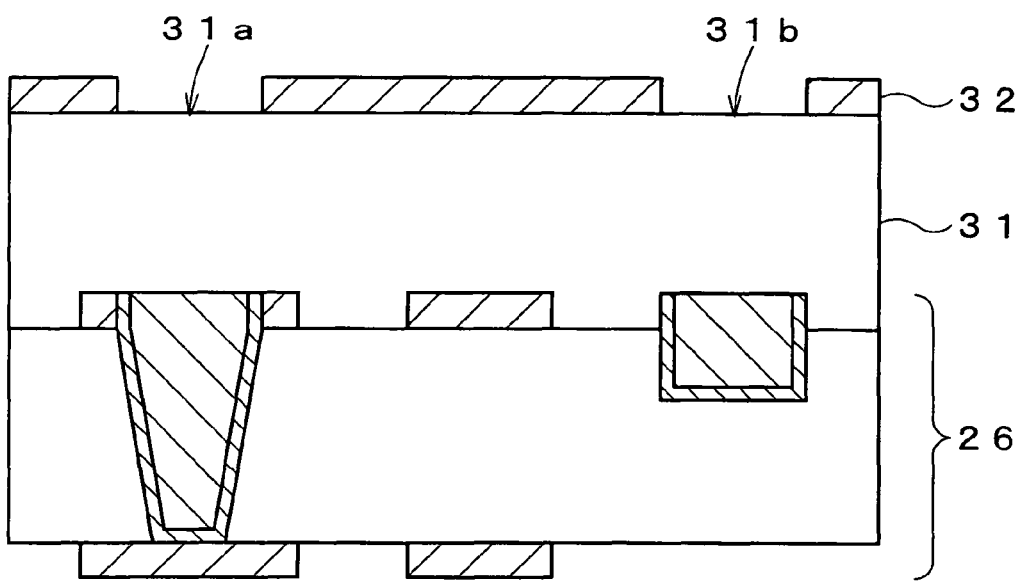
FIG. 26 is a schematic cross-sectional view showing a process (removing the dry films) in the method of manufacturing the multilayer substrate according to the first embodiment of the present invention.
Figure 27:
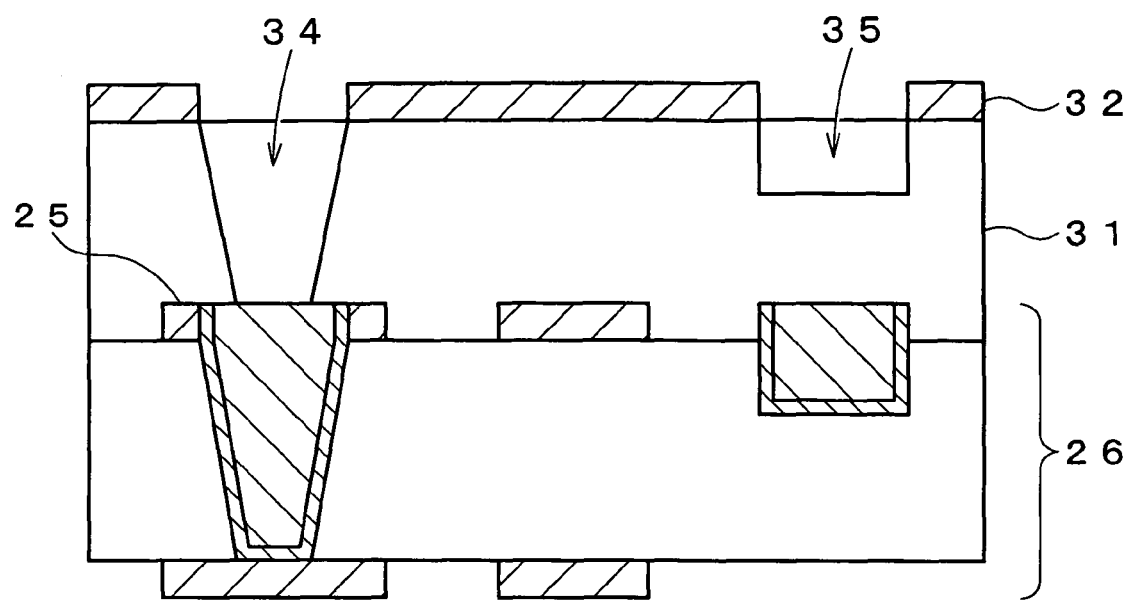
FIG. 27 is a schematic cross-sectional view showing a process (forming a via hole and a pattern-forming groove) in the method of manufacturing the multilayer substrate according to the first embodiment of the present invention.

Next, the dry film 33 is peeled off (FIG. 26). Then, a via hole 34 is formed at the portion 31a in the exposed region of the insulating layer 31 and a pattern-forming groove 35 is formed at the portion 31b in the exposed region of the insulating layer 31 by laser processing (FIG. 27). In the laser processing, the via hole 34 and the pattern-forming groove 35 are respectively formed by setting laser power and irradiation time to optimal levels depending on the location. Although the via hole 34 penetrates the insulating layer 31, the conductive layer on the core substrate 26 (which is the electrode pattern 25) serves as a stopper in this case. Accordingly, this conductive layer constitutes a bottom 34a of the via hole 34. The diameter of the via hole 34 is not particularly limited but is preferably set in a range from about 30 to 200 μm. Meanwhile, the insulating layer 31 is only dug to a predetermined depth to define the pattern-forming groove 35, and unlike the via hole 34, the pattern-forming groove 35 does not penetrate the insulating layer 31. The depth of the pattern-forming groove 35 is preferably set such that a proportion (t2/t1) between a thickness (t1) of the conductive layer 32 and a thickness (t2) of a conductive pattern to be ultimately formed by use of the pattern-forming groove 35 is in a range from 1.5 to 20.

Figure 28:
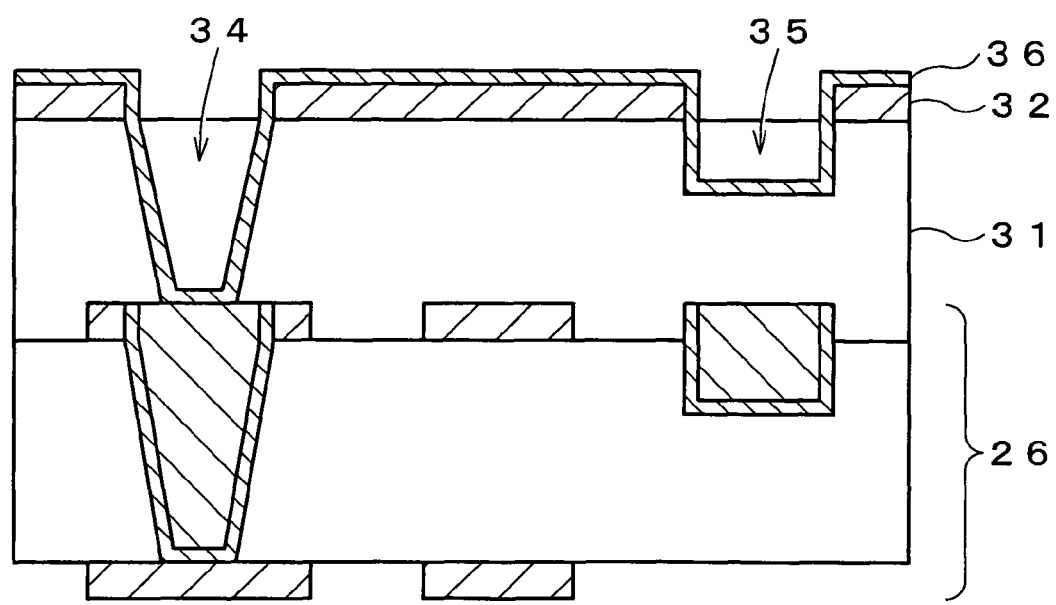
FIG. 28 is a schematic cross-sectional view showing a process (forming a base conductive layer) in the method of manufacturing the multilayer substrate according to the first embodiment of the present invention.

Next, a base conductive layer 36 is formed on substantially the entire exposed surface including inner walls of the via hole 34 and the pattern-forming groove 35 (FIG. 28). As the method of forming the base conductive layer 36, it is preferable to apply an electroless plating method, a sputtering method, a vapor deposition method, and the like. The base conductive layer 36 serves as a base for electrolytic plating to be performed later. Accordingly, the base conductive layer 36 is formed in a very small thickness, which may be selected appropriately from a range of several hundred angstroms to 3.0 μm.

Figure 29:
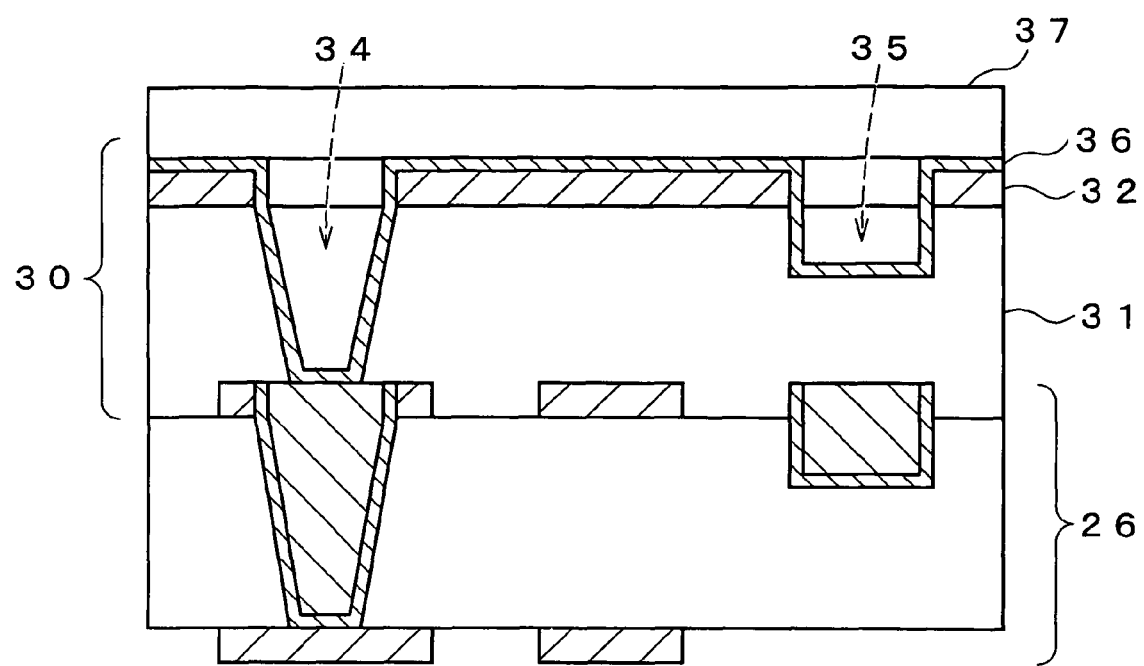
FIG. 29 is a schematic cross-sectional view showing a process (forming a dry film) in the method of manufacturing the multilayer substrate according to the first embodiment of the present invention.
Figure 30:
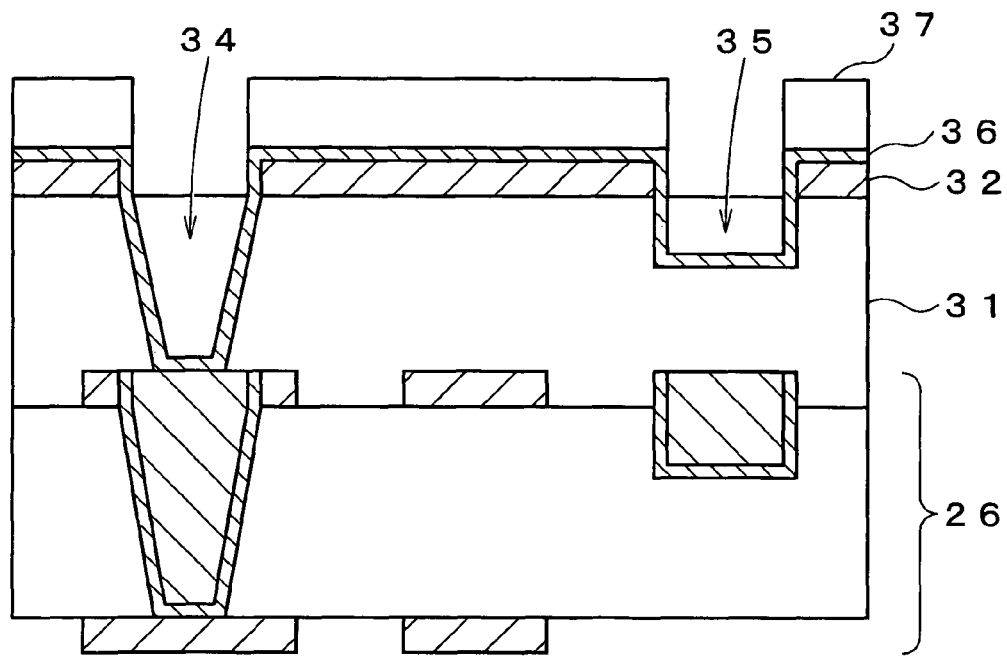
FIG. 30 is a schematic cross-sectional view showing a process (exposing and developing the dry film) in the method of manufacturing the multilayer substrate according to the first embodiment of the present invention.

Next, a dry film 37 made of a photosensitive material is attached to a surface of the build-up layer 30 (FIG. 29). In this way, substantially the entire surface of the base conductive layer 36 is covered with the dry film 37. Then, the dry film 37 located above the open portions for the via hole 34 and the pattern-forming groove 35 is removed by exposing and developing the dry film 37 (FIG. 30). The remaining dry film 37 is used as a mask for the electrolytic plating to be performed later.

Figure 31:
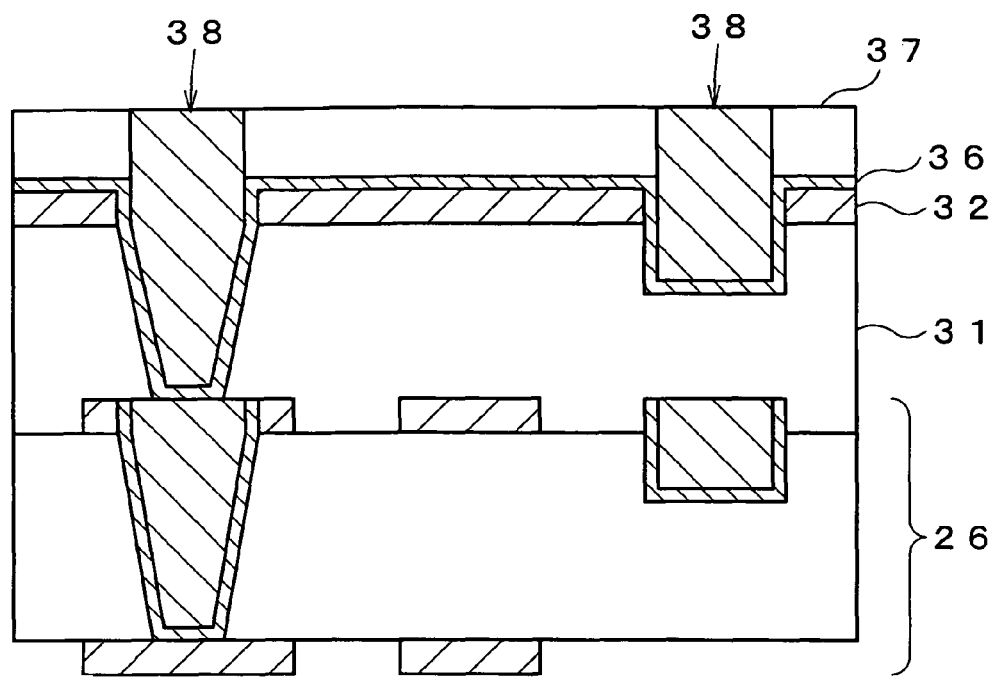
FIG. 31 is a schematic cross-sectional view showing a process (forming a conductive material) in the method of manufacturing the multilayer substrate according to the first embodiment of the present invention.
Figure 32:
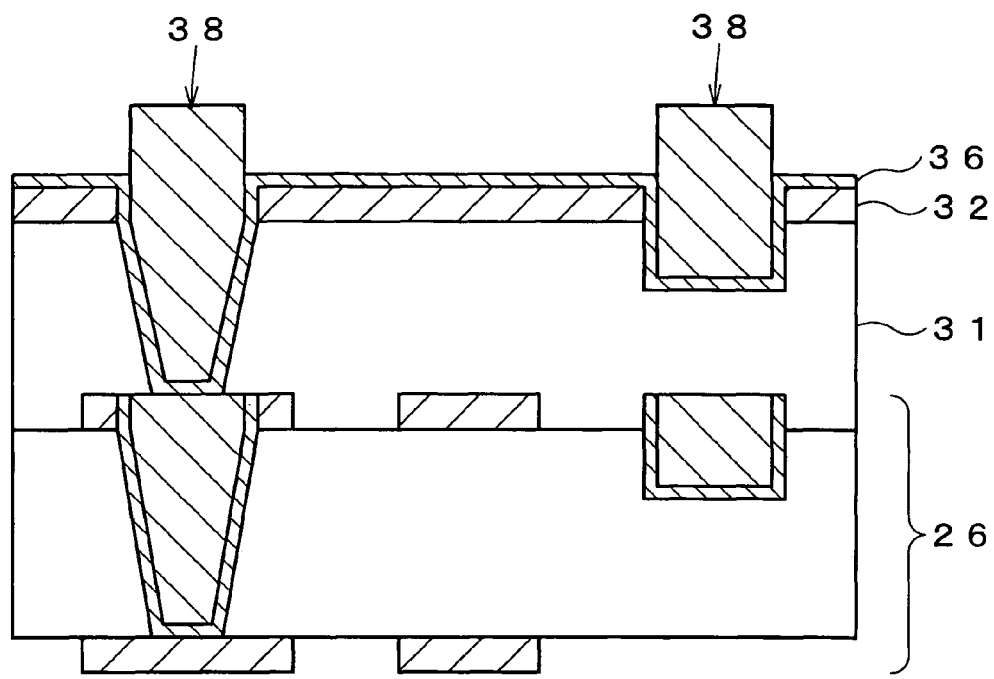
FIG. 32 is a schematic cross-sectional view showing a process (removing the dry film) in the method of manufacturing the multilayer substrate according to the first embodiment of the present invention.

Next, a conductive material 38 is deposited in the region not covered with the dry film 37 by electrolytic plating (FIG. 31). In other words, the conductive material 38 is selectively formed in the region not covered with the dry film 37, instead of the entire surface of the build-up layer. In this way, a space inside the via hole 34 is almost completely filled with the conductive material 38. Similarly, a space inside the pattern-forming groove 35 is almost completely filled with the conductive material 38.

Figure 33:
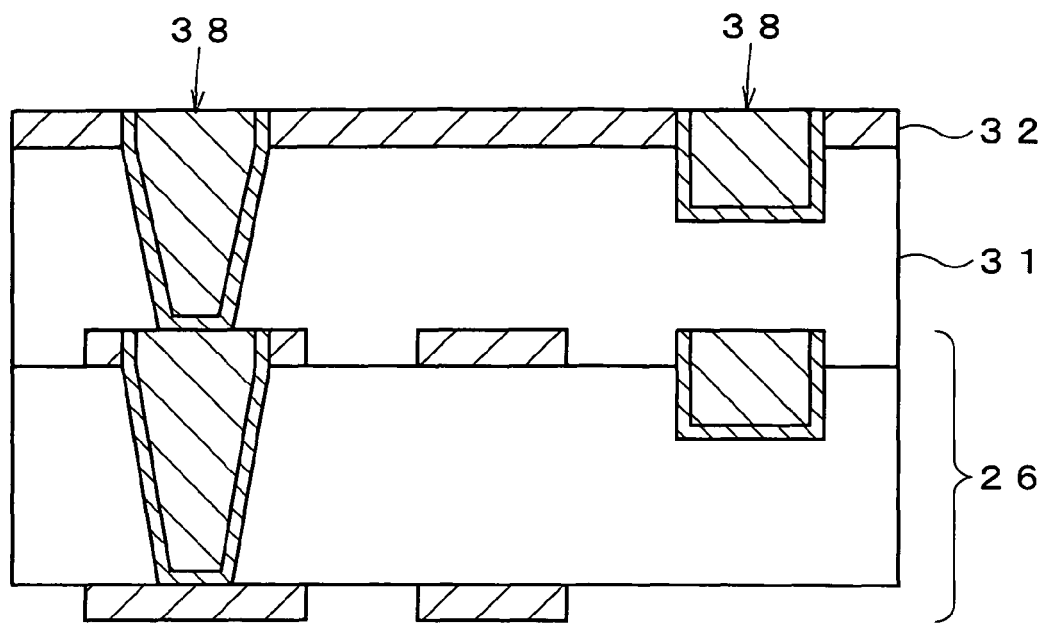
FIG. 33 is a schematic cross-sectional view showing a process (polishing the conductive material) in the method of manufacturing the multilayer substrate according to the first embodiment of the present invention.
Figure 34:
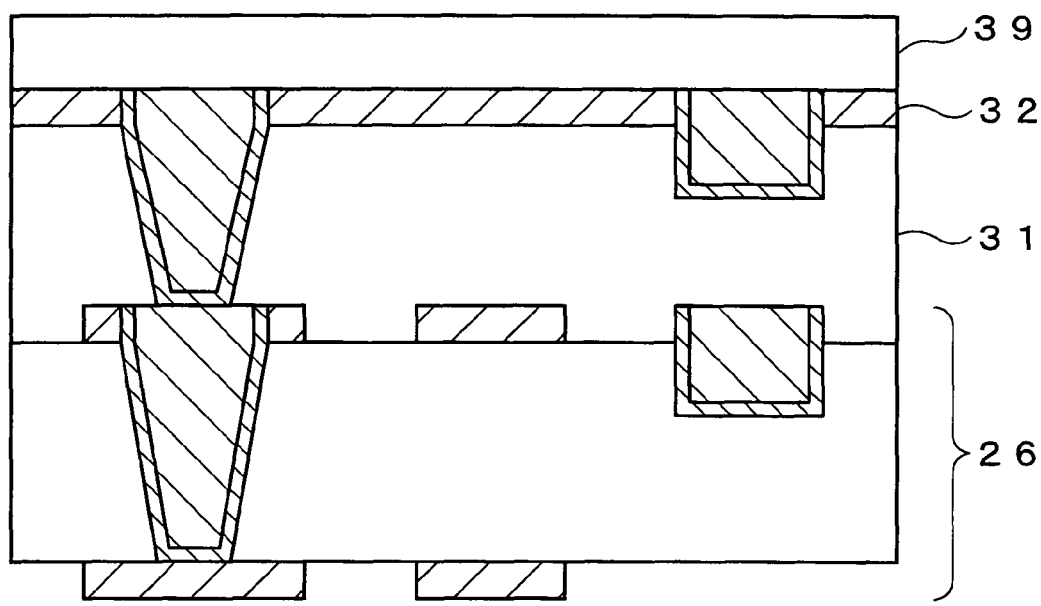
FIG. 34 is a schematic cross-sectional view showing a process (forming a dry film) in the method of manufacturing the multilayer substrate according to the first embodiment of the present invention.

Next, after peeling the dry film 37 off (FIG. 32), the conductive material 38 is polished parallel to the surface of the build-up layer 30, thereby planarizing the entire surface (FIG. 33). Here, similarly to the first embodiment, it is possible to planarize the entire surface reliably by performing the polishing process so as to remove the base conductive layer 36 and further to polish a small amount of the surface of the conductive layer 32. Similarly to the first embodiment, it is possible to ensure a very high degree of flatness by performing a chemical polishing method and then performing a mechanical polishing method using a buff.

If a large amount of the surface of the conductive layer 32 is polished in this polishing process, a variation in the thickness of the conductive layer 32 may be slightly increased. However, the conductive material 38 is not formed on the entire surface but is formed selectively. Therefore, even when the conductive layer 32 is polished along with polishing the conductive material 38, an amount of the conductive layer 32 to be polished off is very limited. For this reason, the increase in the variation in the thickness is also very limited. It is to be noted, however, that formation of the mask in the region not supposed to deposit the conductive material 38 is not always essential in the present invention.

Figure 35:
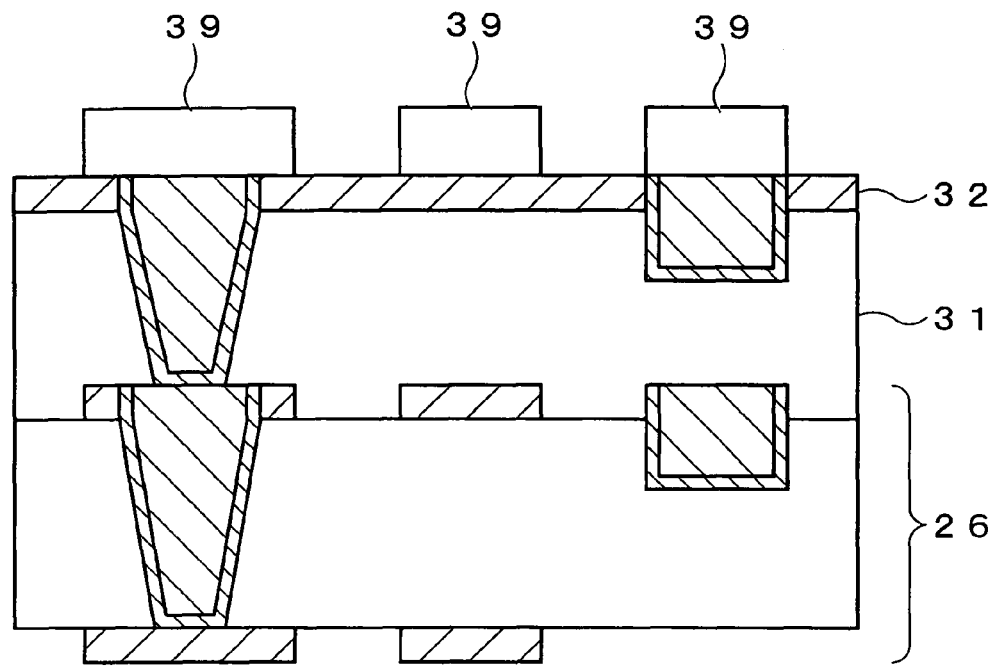
FIG. 35 is a schematic cross-sectional view showing a process (exposing and developing the dry film) in the method of manufacturing the multilayer substrate according to the first embodiment of the present invention.
Figure 36:
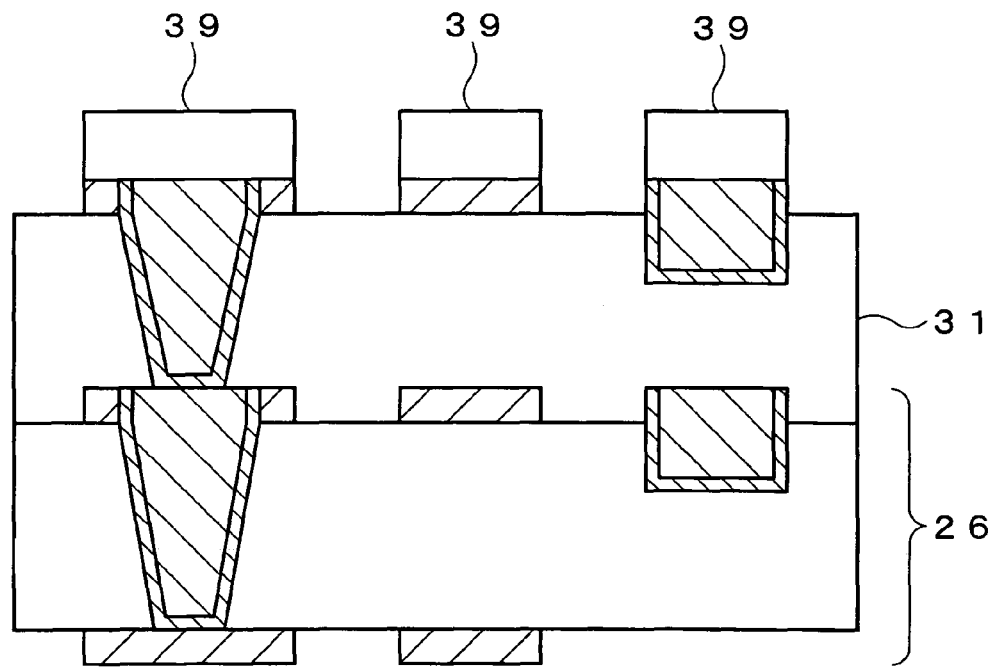
FIG. 36 is a schematic cross-sectional view showing a process (etching the conductive layer) in the method of manufacturing the multilayer substrate according to the first embodiment of the present invention.
Figure 37:
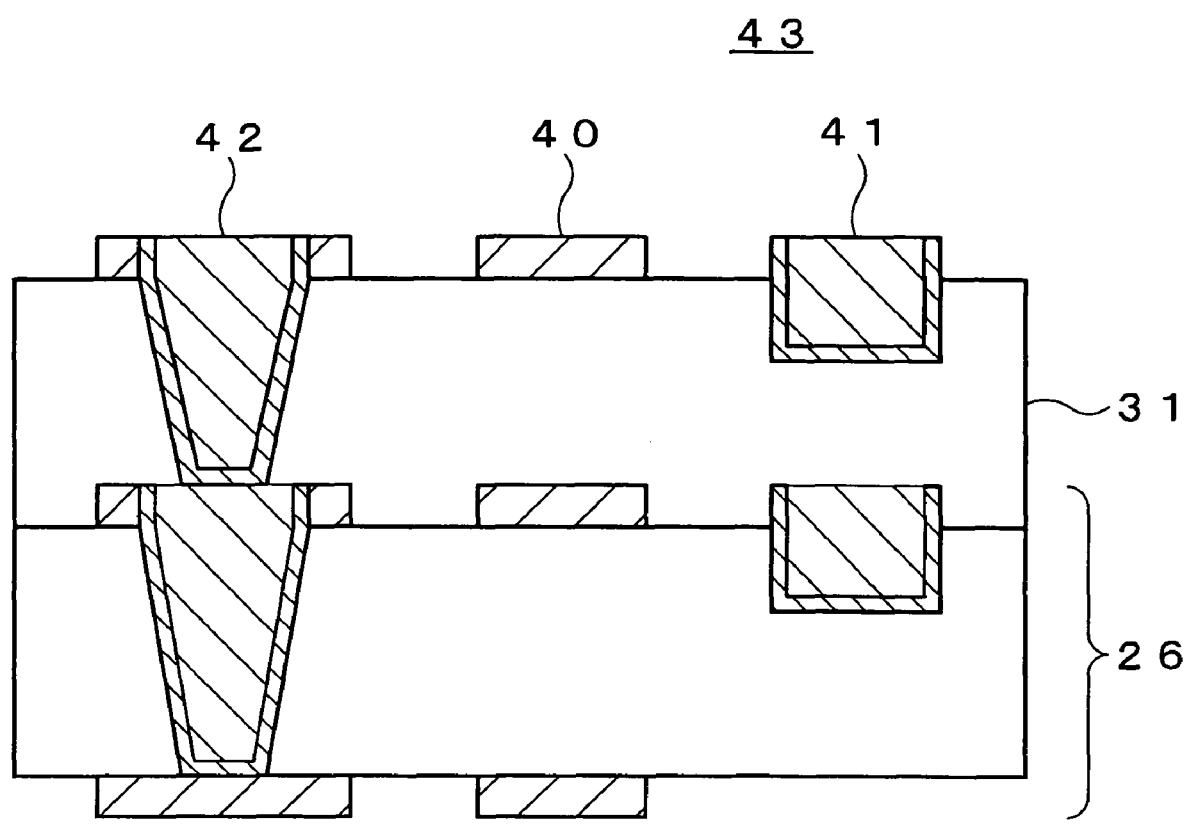
FIG. 37 is a schematic cross-sectional view showing a process (removing the dry film) in the method of manufacturing the multilayer substrate according to the first embodiment of the present invention.

Next, a dry film 39 is attached to the surface of the build-up layer 10 (FIG. 34), and is patterned by performing exposing and developing processes. In this way, the conductive layer 32 is partially exposed (FIG. 35). Thereafter, the exposed portions of the conductive layer 32 are removed by etching (FIG. 36). Here, the variation in the thickness of the conductive layer 32 subject to patterning is reduced to a very small amount. Accordingly, it is possible to perform patterning at high accuracy. The remaining conductive layer 32 constitutes a normal conductive pattern (a first conductive pattern) 40 and part of an electrode pattern 42 on the via hole electrode. The dry film 39 is lastly peeled off to complete the series of processes on the build-up layer 30. In this way, a multilayer substrate 43 is completed to include the relatively thinner first conductive pattern 40, a relatively thicker second conductive pattern 41, and the electrode pattern 42 on the via hole electrode (FIG. 37).

As described above, according to this embodiment, it is possible to form conductive patterns having mutually different thicknesses in the same layer. Therefore, an LC pattern for a high-frequency circuit that requires small variations in the width and the thickness of the pattern and a normal conductive pattern that requires impedance matching can be formed as the first conductive pattern by patterning the conductive layer. Meanwhile, an L pattern for a choke coil that requires a high aspect ratio and a relatively large cross-sectional area (which has a low direct-current resistance) can be formed as the second conductive pattern by use of the pattern-forming groove. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a build-up layer suitable for high-density packaging.

Furthermore, according to this embodiment, it is possible to form the pattern-forming groove in the same step for forming the via hole by laser processing. Then, the second conductive pattern is formed by filling the space inside the pattern-forming groove with the conductive material simultaneously in the step for filling the space inside the via hole with the conductive material. Therefore, it is possible to form the second conductive pattern within usual processes without increasing an additional process.

In addition, according to this embodiment, the mask is formed in the region not supposed to deposit the conductive material and the conductive material is selectively deposited in the process of filling the spaces inside the via hole and the pattern-forming groove. Accordingly, it is possible to reduce the variation in the thickness of the conductive layer caused by polishing. Therefore, pattern accuracy can be significantly improved when forming the conductive pattern by patterning the conductive layer. In this way, it is possible to suppress a variation in the impedance in the case of forming a passive element such as an LC for a high-frequency circuit on the core substrate, for example.

Next, a method of manufacturing a multilayer substrate according to a second embodiment of the present invention will be described in detail.

The method of manufacturing a multilayer substrate according to this embodiment is also applicable to both of a "core substrate" constituting a multilayer substrate and a "build-up layer" to be provided on the core substrate. In the following, the case of applying the method of manufacturing a multilayer substrate according to this embodiment to a "build-up layer" will be described with reference to schematic cross-sectional views in FIG. 38 to FIG. 51. Note that the basic processes for the core substrate are the same as the basic processes for the build-up layer as described in the first embodiment. Therefore, this embodiment will only describe application to the "build-up layer", and will omit a description of application to the core substrate. In the meantime, the same constituents as those described in the first embodiment will be designated by the same reference numerals, and the detailed description thereof will be omitted as well.

The method of this embodiment is applicable to a build-up layer to be laminated on the processed core substrate 26 which is fabricated by the method described with reference to FIG. 1 to 16, or to a build-up layer to be laminated on a processed core substrate that will be fabricated by any other methods. In any case, it is preferable to apply this method to a build-up layer to be laminated on any of the core substrates which is fabricated by the method of manufacturing a multilayer substrate of the present invention. In this way, the variation in the thickness is reduced in terms of the conductive pattern formed on the surface of the core substrate as well as the conductive pattern formed on the surface of the build-up layer. As a consequence, it is possible to improve the pattern accuracy on the whole. Now, the case of applying this embodiment to the build-up layer to be laminated on the processed core substrate 26 (see FIG. 16) will be described.

Figure 38:
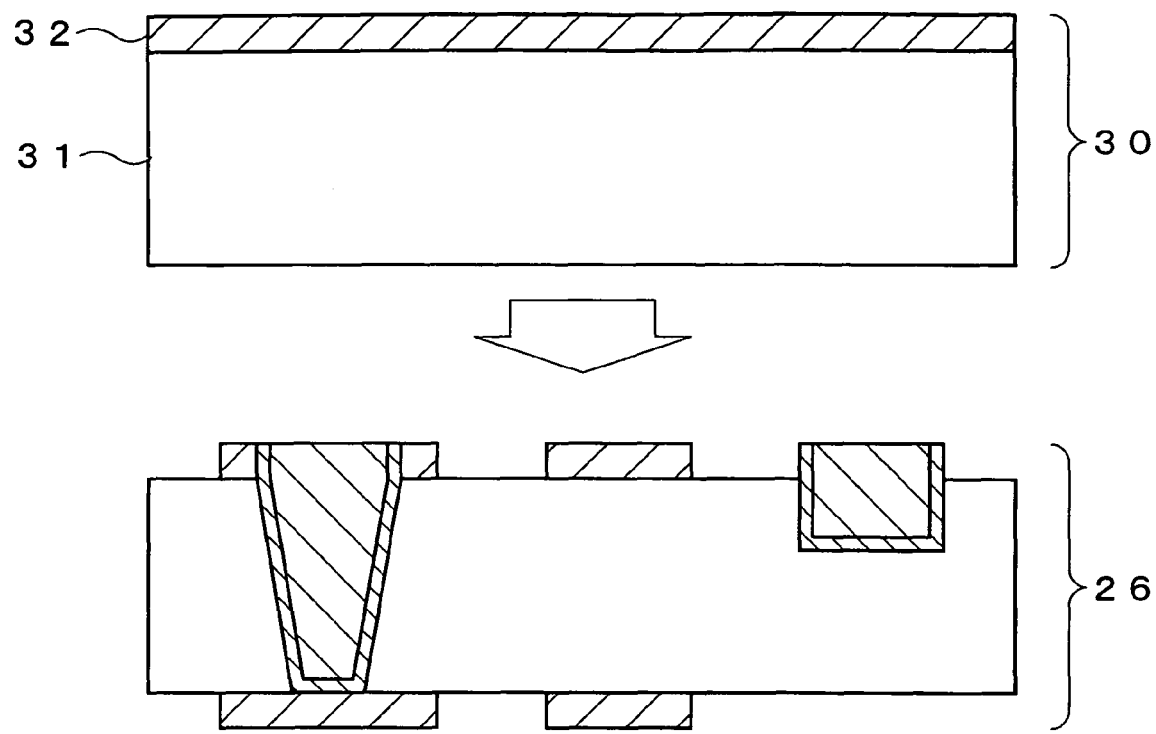
FIG. 38 is a schematic cross-sectional view showing a process (pressing a build-up layer) in the method of manufacturing a multilayer substrate according to a second embodiment of the present invention.
Figure 39:
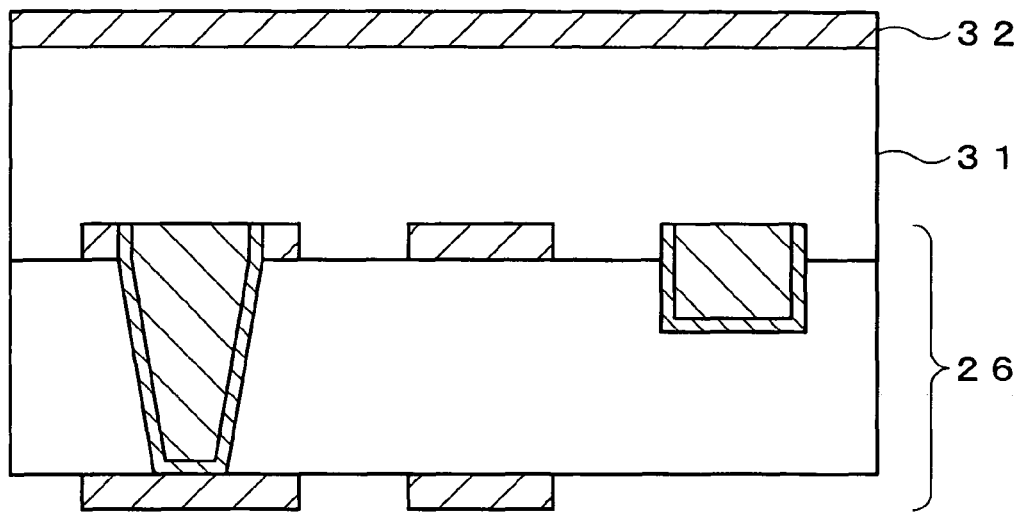
FIG. 39 is a schematic cross-sectional view showing a process (preparing the multilayer substrate) in the method of manufacturing the multilayer substrate according to the second embodiment of the present invention.

First, the processed core substrate 26 fabricated by the method described with reference to FIG. 1 to FIG. 16 is prepared, and a build-up layer 30 is laminated thereon (FIG. 38). The build-up layer 30 before processing is made of a sheet (a resin-coated metal film) made of thermosetting resin 31 such as B-stage epoxy resin, which is provided with a metal foil 32. This sheet is laminated on the core substrate 26 so as to allow the thermosetting resin 31 to face the core substrate 26. The thermosetting resin 31 is hardened by subjecting this laminated body to hot pressing. Accordingly, the build-up layer 30 is integrated with the core substrate 26 (FIG. 39). In this way, the thermosetting resin 31 constitutes an insulating layer of the build-up layer, while the metal foil 32 constitutes a conductive layer thereof.

Figure 40:
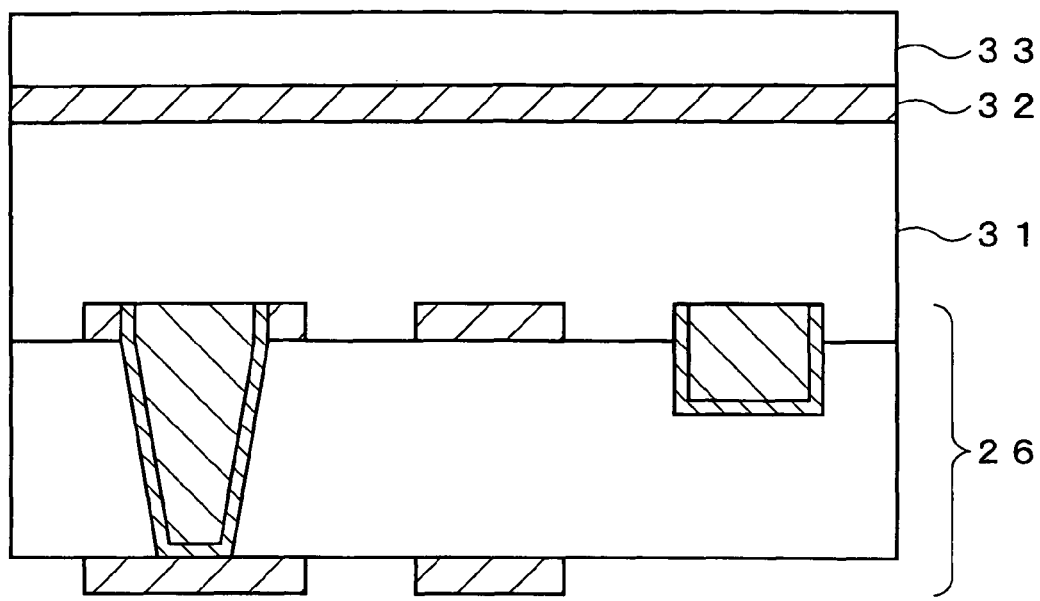
FIG. 40 is a schematic cross-sectional view showing a process (forming a dry film) in the method of manufacturing the multilayer substrate according to the second embodiment of the present invention.
Figure 41:
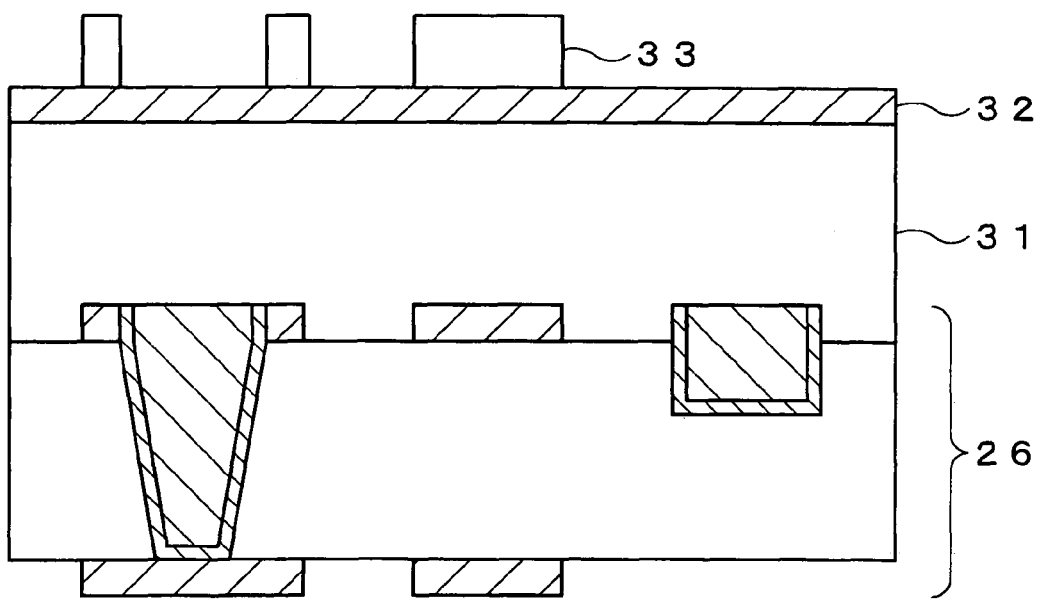
FIG. 41 is a schematic cross-sectional view showing a process (exposing and developing the dry film) in the method of manufacturing the multilayer substrate according to the second embodiment of the present invention.

Next, a dry film 33 made of a photosensitive material is attached to a surface of the build-up layer 30 (FIG. 40). In this way, substantially the entire surface of the conductive layer 32 is covered with the dry film 33. Thereafter, the dry film 33 is patterned by exposure and development processes to partially expose the conductive layer 32 partially (FIG. 41).

Figure 42:
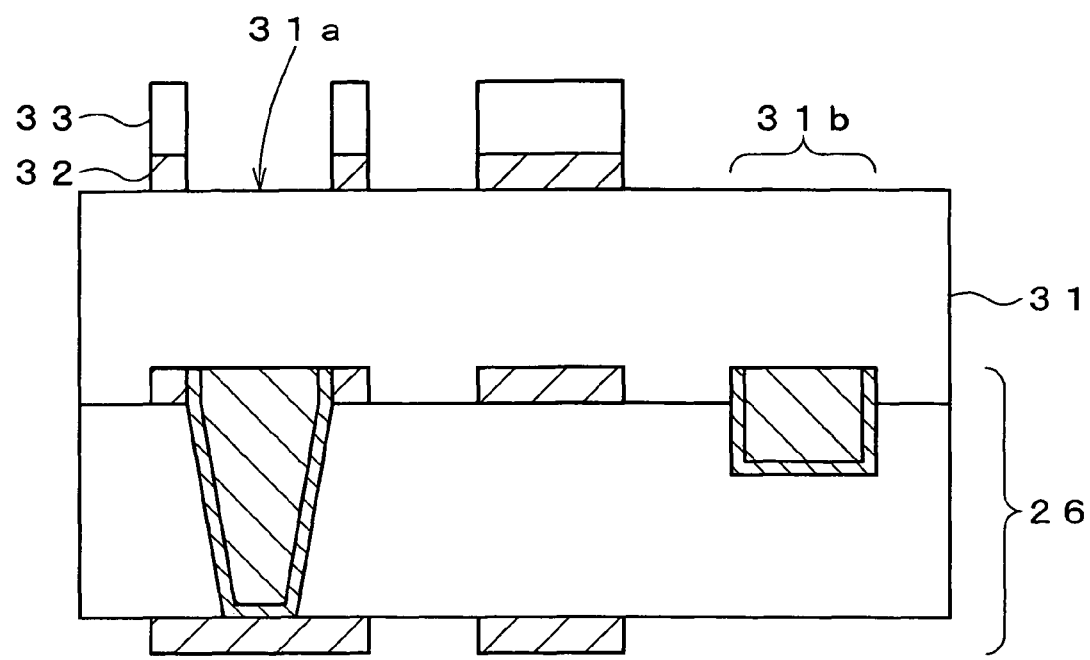
FIG. 42 is a schematic cross-sectional view showing a process (etching the conductive layer) in the method of manufacturing the multilayer substrate according to the second embodiment of the present invention.

Next, the conductive layer 32 is etched while using the dry film 33 as a mask, and the insulating layer 31 is partially exposed (FIG. 42). A portion 31a in an exposed region of the insulating layer constitutes an open portion for a via hole, and another portion 31b constitutes an open portion for a pattern-forming groove. Meanwhile, the remaining conductive layer 32 mainly constitutes a normal conductive pattern (a first conductive pattern) having a predetermined thickness. In other words, this embodiment is different from the above-described first embodiment in that pattern etching for forming the first conductive pattern and etching for ensuring forming regions of the via hole and the pattern-forming groove take place in the same step. A variation in the thickness of the conductive layer 32 patterned in this process is reduced to a very small amount. Accordingly, it is possible to perform patterning at high accuracy. Therefore, the width of the conductive pattern can be regulated to a desired width.

Figure 43:
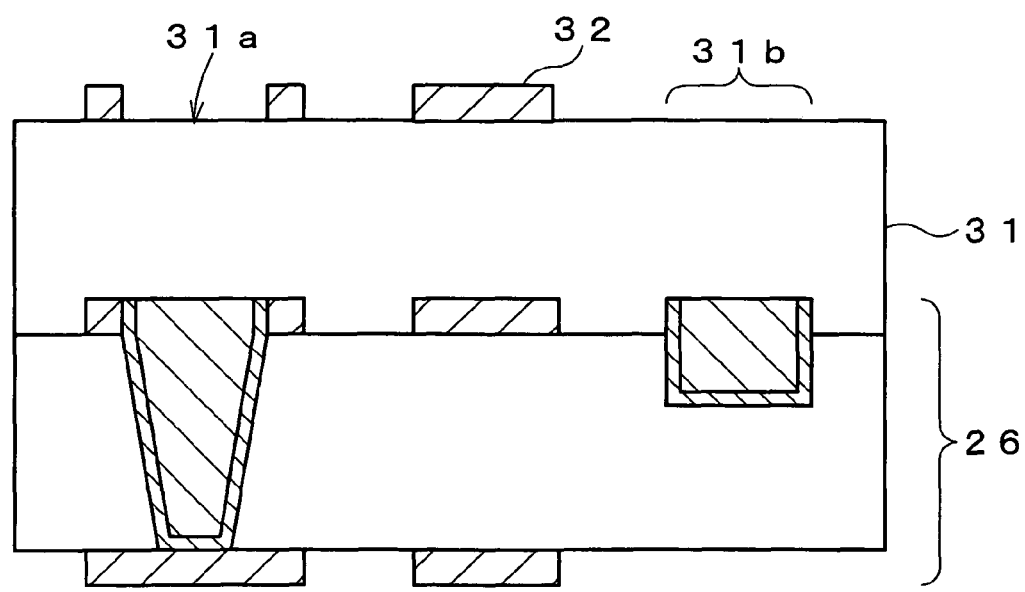
FIG. 43 is a schematic cross-sectional view showing a process (removing the dry film) in the method of manufacturing the multilayer substrate according to the second embodiment of the present invention.
Figure 44:
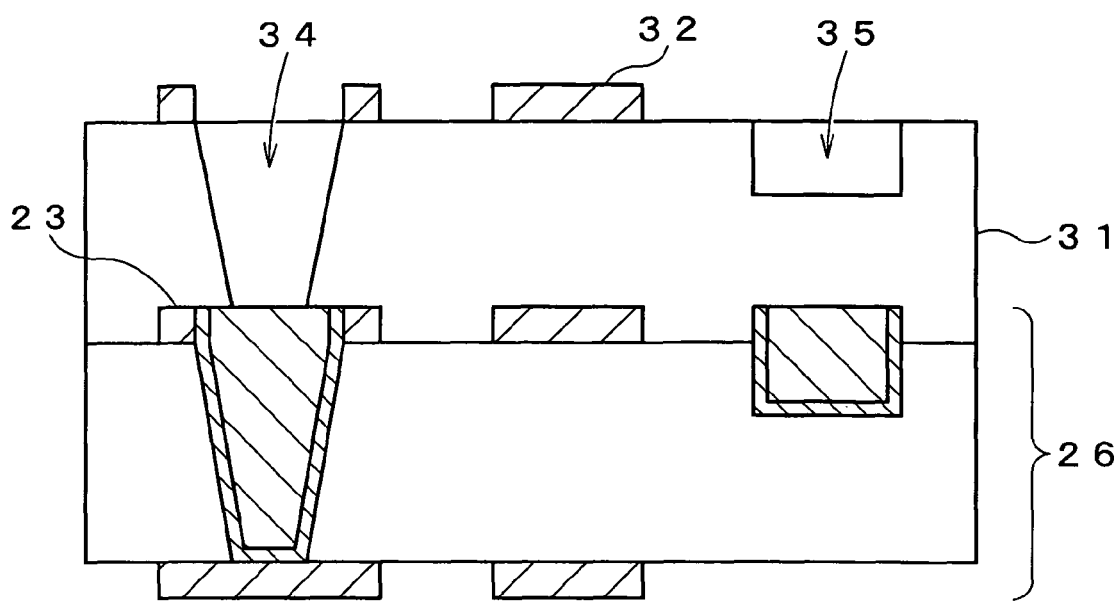
FIG. 44 is a schematic cross-sectional view showing a process (forming a via hole and a pattern-forming groove) in the method of manufacturing the multilayer substrate according to the second embodiment of the present invention.

Next, the dry film 33 is peeled off (FIG. 43). Then, a via hole 34 is formed at the portion 31a in the exposed region of the insulating layer 31 and a pattern-forming groove 35 is formed at the portion 31b in the exposed region of the insulating layer 31 by laser processing (FIG. 44).

Figure 45:
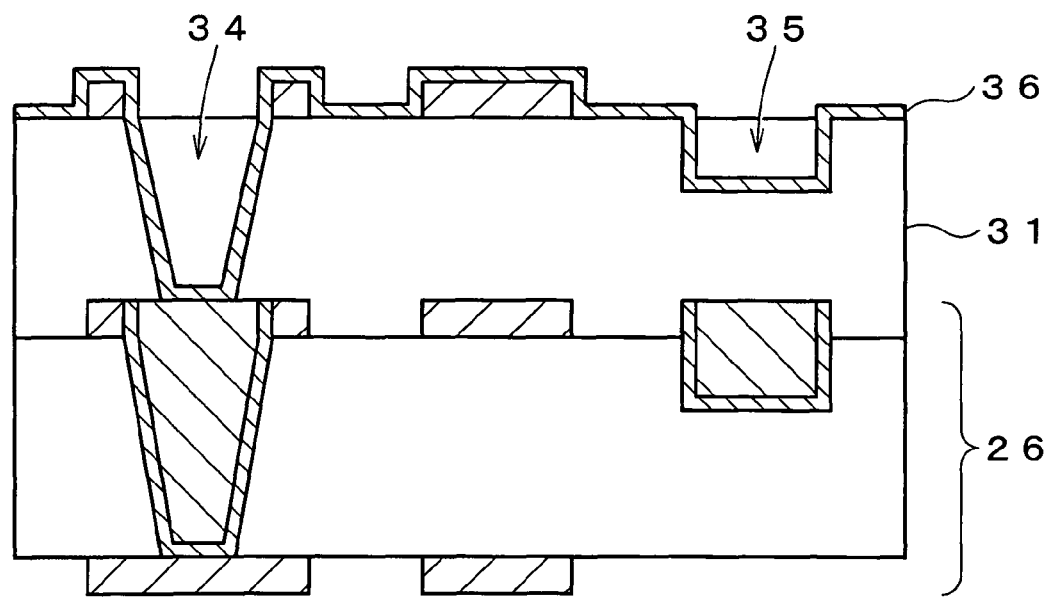
FIG. 45 is a schematic cross-sectional view showing a process (forming a base conductive layer) in the method of manufacturing the multilayer substrate according to the second embodiment of the present invention.

Next, a base conductive layer 36 is formed on substantially the entire exposed surface including inner walls of the via hole 34 and the pattern-forming groove 35 (FIG. 45). As the method of forming the base conductive layer 36, it is preferable to apply an electroless plating method, a sputtering method, a vapor deposition method, and the like.

Figure 46:
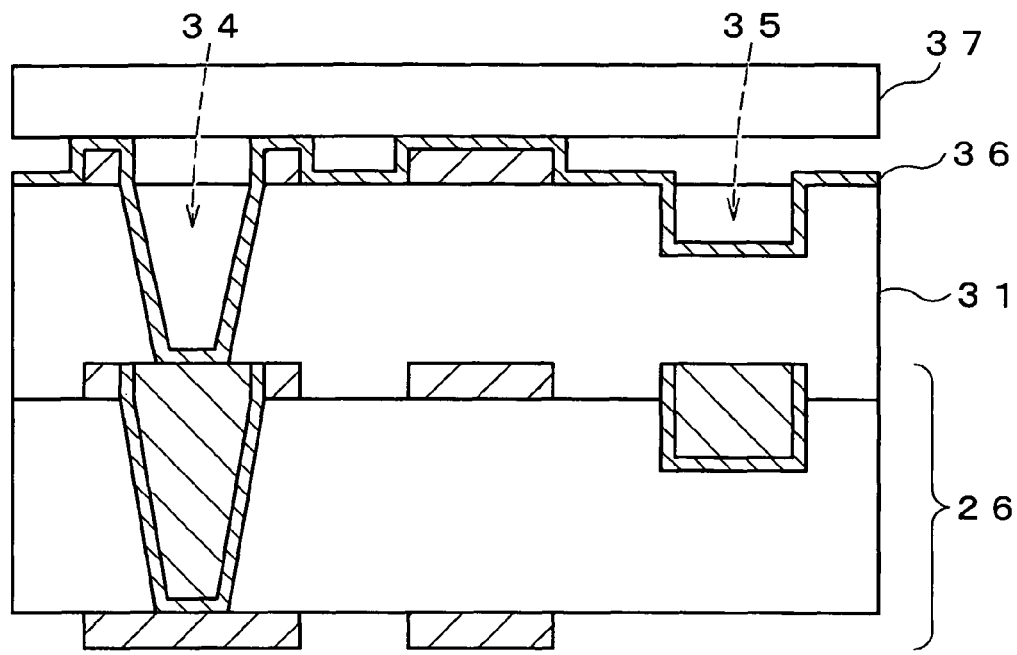
FIG. 46 is a schematic cross-sectional view showing a process (forming a dry film) in the method of manufacturing the multilayer substrate according to the second embodiment of the present invention.
Figure 47:
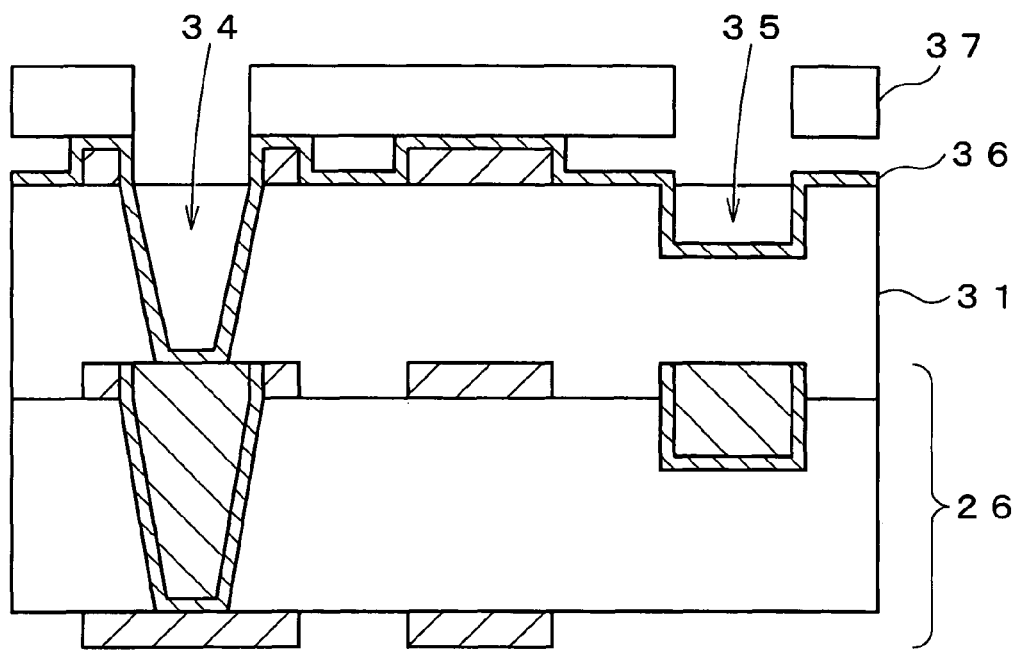
FIG. 47 is a schematic cross-sectional view showing a process (exposing and developing the dry film) in the method of manufacturing the multilayer substrate according to the second embodiment of the present invention.

Next, a dry film 37 made of a photosensitive material is attached to a surface of the build-up layer 30 (FIG. 46). In this way, substantially the entire surface of the base conductive layer 36 is covered with the dry film 37. Then, the dry film 37 located above the open portions for the via hole 34 and the pattern-forming groove 35 is removed by exposing and developing the dry film 37 (FIG. 47). The remaining dry film 37 is used as a mask for the electrolytic plating to be performed later.

Figure 48:
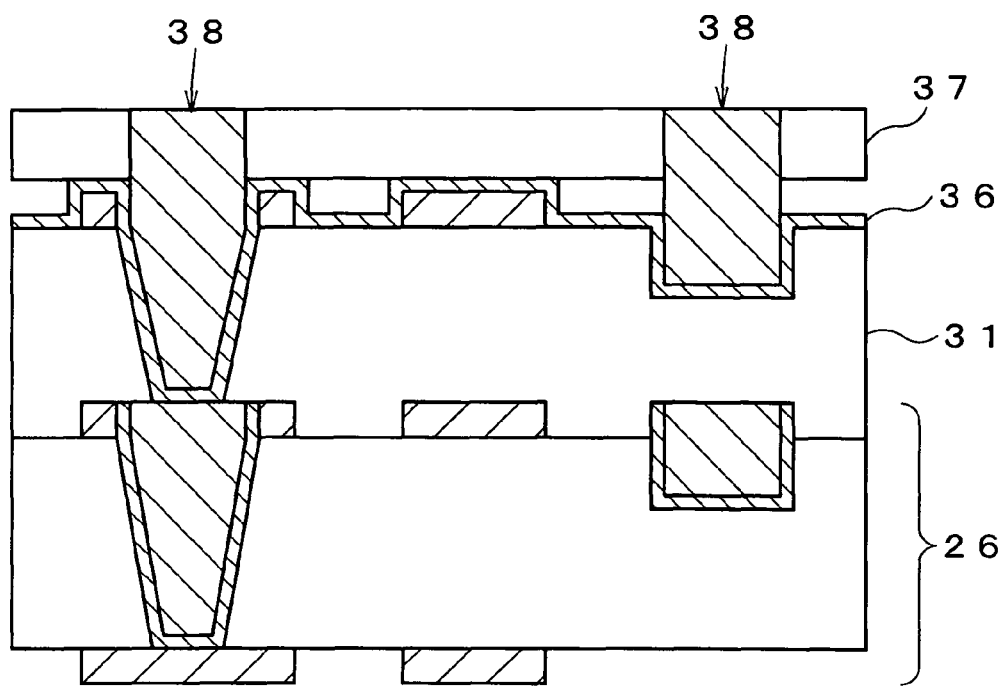
FIG. 48 is a schematic cross-sectional view showing a process (forming a conductive material) in the method of manufacturing the multilayer substrate according to the second embodiment of the present invention.
Figure 49:
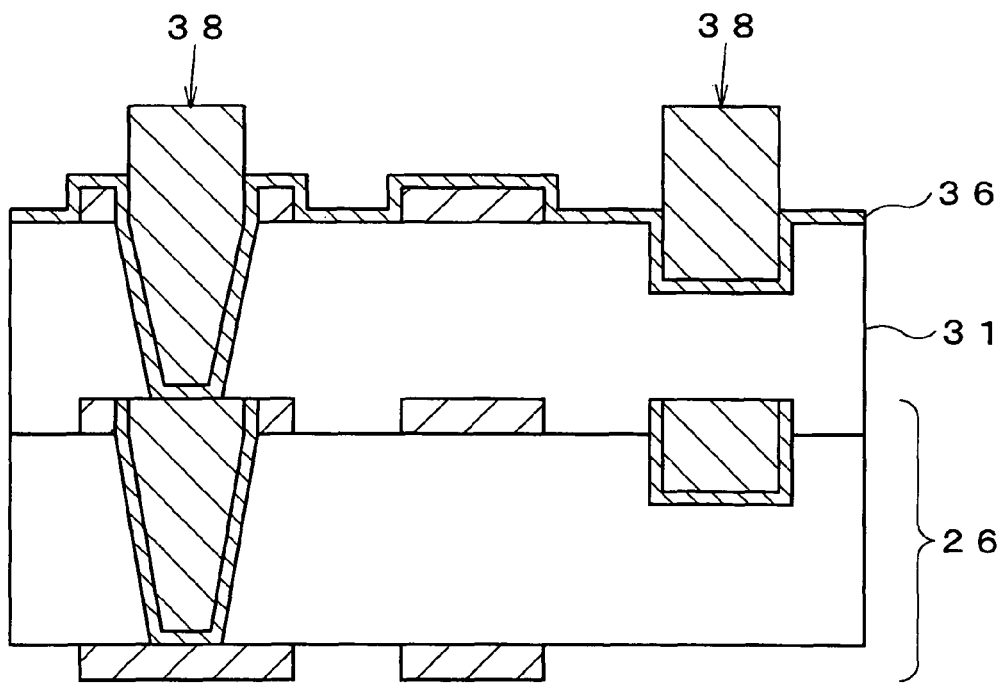
FIG. 49 is a schematic cross-sectional view showing a process (removing the dry film) in the method of manufacturing the multilayer substrate according to the second embodiment of the present invention.

Next, a conductive material 38 is deposited in the region not covered with the dry film 37 by electrolytic plating (FIG. 48). In this way, a space inside the via hole 34 is almost completely filled with the conductive material 38. Similarly, a space inside the pattern-forming groove 35 is almost completely filled with the conductive material 38.

Figure 50:
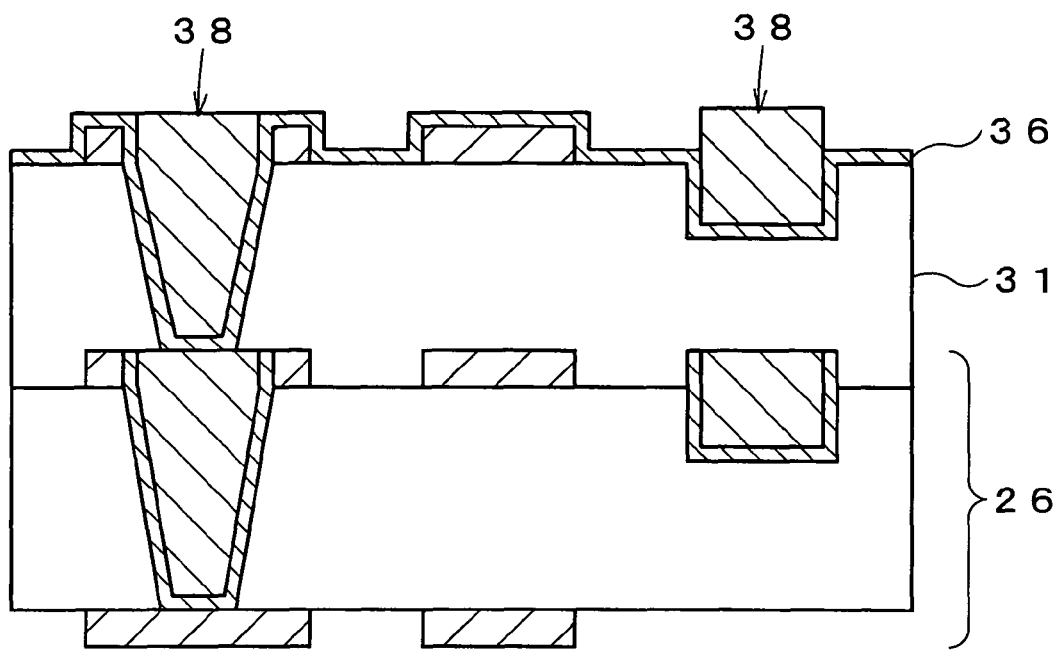
FIG. 50 is a schematic cross-sectional view showing a process (polishing the conductive material) in the method of manufacturing the multilayer substrate according to the second embodiment of the present invention.
Figure 51:
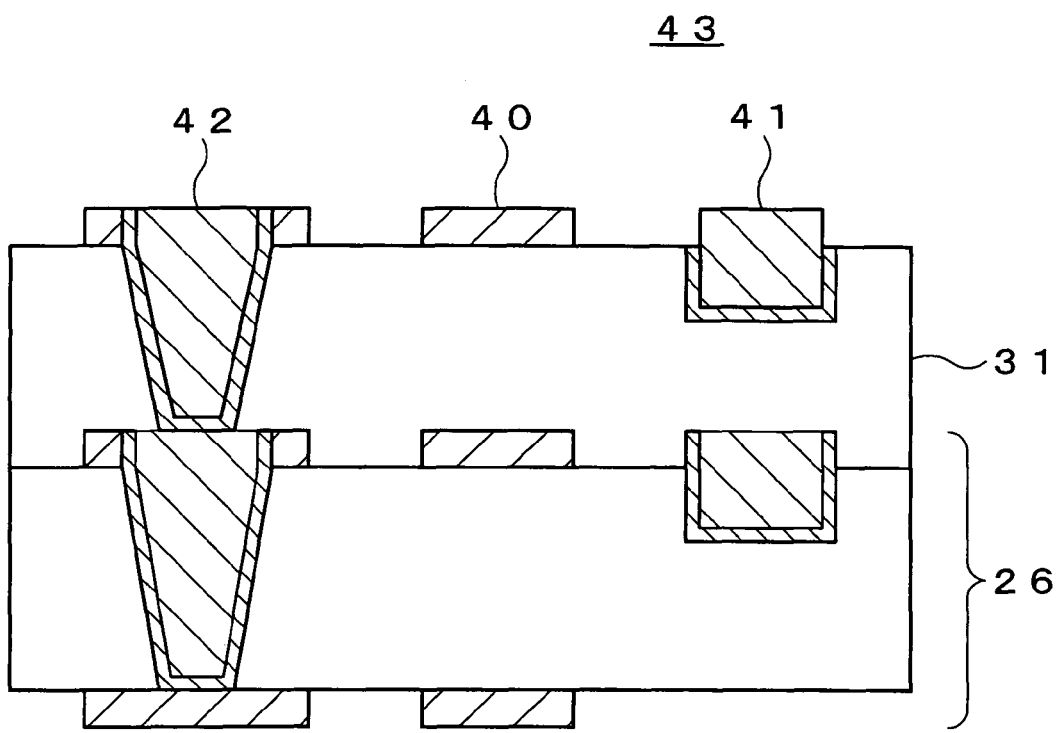
FIG. 51 is a schematic cross-sectional view showing a process (soft etching) in the method of manufacturing the multilayer substrate according to the second embodiment of the present invention.

Next, after peeling the dry film 37 off (FIG. 49) the conductive material 38 is polished parallel to the surface of the build-up layer 30, thereby planarizing the entire surface (FIG. 50). In this way, a second conductive pattern 41 thicker than a first conductive pattern 40 and part of an electrode pattern 42 on the via hole are formed. Thereafter, by removing (soft-etching) the unnecessary base conductive layer 36 at the portion where the conductive patterns and the like are not formed by use of an etchant such as an acid, the series of processes on the build-up layer 30 are completed. In this way, a multilayer substrate 43 is finished to include the relatively thinner first conductive pattern 40, the relatively thicker second conductive pattern 41, and the electrode pattern 42 on the via hole (FIG. 51).

As described above, according to this embodiment, it is possible to form patterns having mutually different thicknesses in the same layer. Therefore, an LC pattern for a high-frequency circuit that requires small variations in the width and the thickness of the pattern and a normal conductive pattern that requires impedance matching can be formed as the first conductive pattern by patterning the conductive layer. Meanwhile, an L pattern for a choke coil that requires a high aspect ratio and a relatively large cross-sectional area (which has a low direct-current resistance) can be formed as the second conductive pattern by use of the pattern-forming groove. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a build-up layer suitable for high-density packaging.

Furthermore, according to this embodiment, it is possible to form the pattern-forming groove in the same step for forming the via hole by laser processing. Then, the second conductive pattern is formed by filling the space inside the pattern-forming groove with the conductive material simultaneously in the step for filling the space inside the via hole with the conductive material. Therefore, it is possible to form the second conductive pattern within usual processes while avoiding an additional process.

In addition, according to this embodiment, pattern etching for forming the first conductive pattern and etching for ensuring the forming regions of the via hole and the pattern-forming groove are performed in the single etching process on the conductive layer. Therefore, it is possible to reduce the number of processes as compared to the first embodiment.

In the above-described embodiments, the conductive pattern (the second conductive pattern) utilizing the pattern-forming groove is formed by the additive method such as electrolytic plating. In the meantime, the rest of conductive patterns (the first conductive pattern) are formed by the subtractive method such as etching. However, it is also possible to form these two types of conductive patterns only by the additive method. In this case, the thickness accuracy of the first conductive pattern may be slightly degraded. However, it is possible to suppress degradation of the thickness accuracy by setting the thickness sufficiently small.

In the first embodiment, the second conductive pattern is formed by use of the pattern-forming groove together with the via hole in the beginning, and the first conductive pattern is formed thereafter. Meanwhile, in the second embodiment, the first conductive pattern is formed by etching in the beginning, and the second conductive pattern is formed by use of the pattern-forming groove together with the via hole subsequently. As it is apparent from the foregoing difference, the order of formation of these conductive patterns is not in question in the present invention. In other words, the manufacturing processes of the multilayer substrate only need to include the step for forming a first conductive pattern having a predetermined thickness on a surface of an insulating layer constituting part of a multilayer substrate, and the step for forming a pattern-forming groove on the insulating layer and filling a space inside the pattern-forming groove with a conductive material to form a second conductive pattern thicker than the first conductive pattern, irrespective of the order to take place.

Next, a third embodiment of the present invention will be described in detail.

A method of manufacturing a multilayer substrate according to this embodiment is also applicable to both of a "core substrate" constituting a multilayer substrate and a "build-up layer" to be provided on the core substrate. First, the case of applying the method of manufacturing a multilayer substrate according to this embodiment to a "core substrate" will be described with reference to schematic cross-sectional views in FIG. 52 to FIG. 62.

Figure 52:
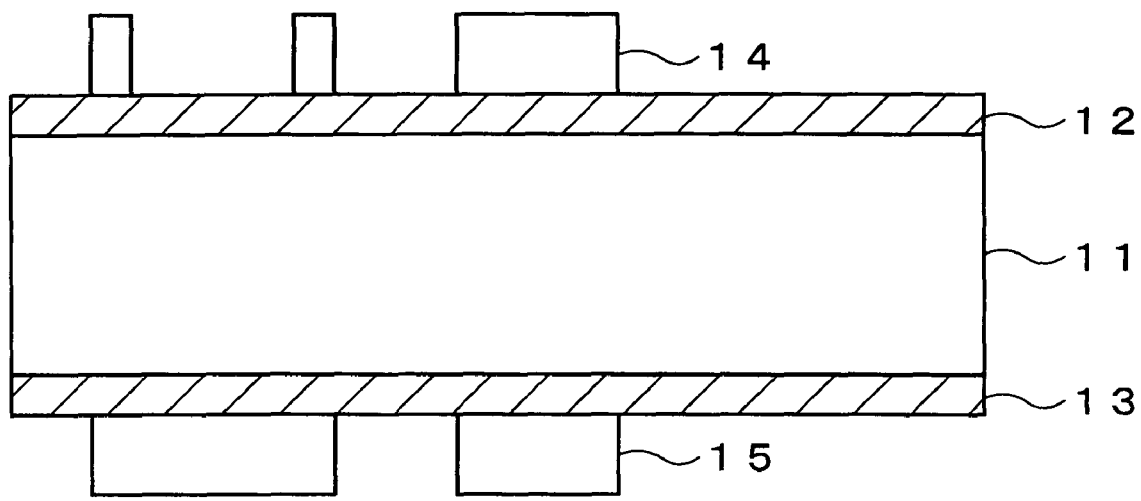
FIG. 52 is a schematic cross-sectional view showing a process (exposing and developing the dry films) in the method of manufacturing a multilayer substrate according to a third embodiment of the present invention.

First, similarly to the first embodiment, a core substrate 10 is prepared and dry films 14 and 15 made of a photosensitive material are respectively attached to both surfaces of the core substrate 10 (FIG. 1 and FIG. 2). In this way, substantially the entire surfaces of conductive layers 12 and 13 are covered with the dry films 14 and 15. Thereafter, the dry films 14 and 15 are patterned by exposure and development processes to expose portions the conductive layers 12 and 13 partially (FIG. 52).

Figure 53:
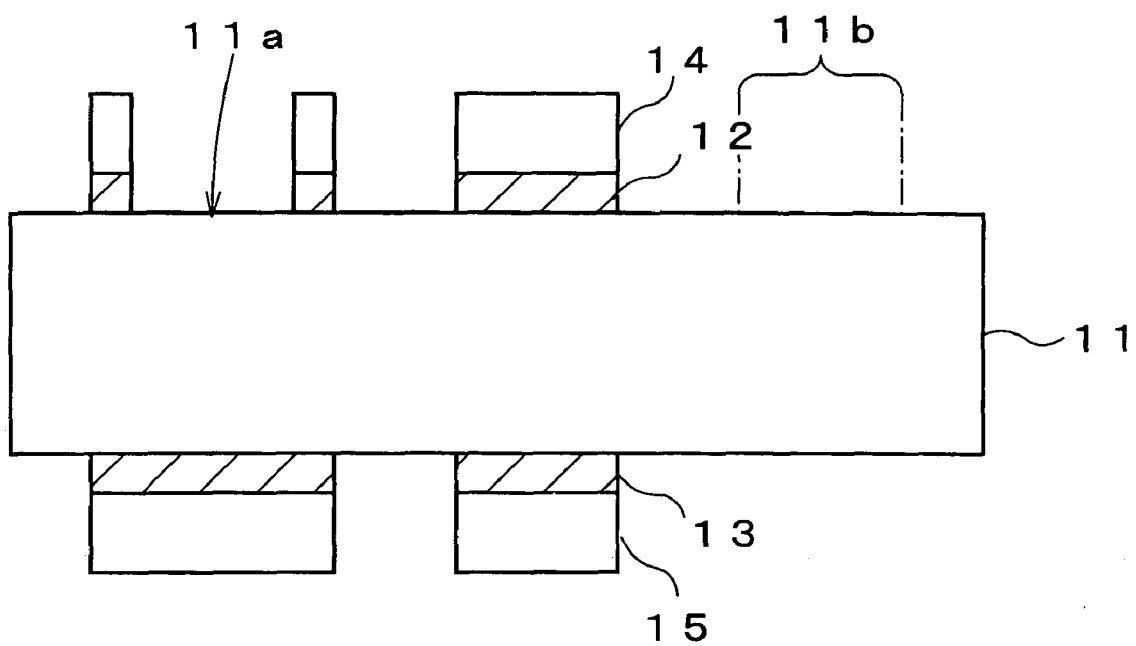
FIG. 53 is a schematic cross-sectional view showing a process (etching the conductive layers) in the method of manufacturing the multilayer substrate according to the third embodiment of the present invention.

Next, the conductive layers 12 and 13 are etched while using the dry films 14 and 15 as masks, and the insulating layer 11 is partially exposed (FIG. 53). A portion 11a in an exposed region of the insulating layer constitutes an open portion for a via hole, and another portion 11b constitutes a conductive pattern forming region of a relatively thicker conductive pattern. Meanwhile, each of the remaining conductive layers 12 and 13 mainly constitutes a normal conductive patterns (a first conductive pattern) having a predetermined thickness. A variation in the thickness of each of the conductive layers 12 and 13 patterned in this process is reduced to a very small amount. Accordingly, it is possible to perform patterning at high accuracy. Therefore, the width of the first conductive pattern formed by patterning can be regulated to a desired width.

Figure 54:
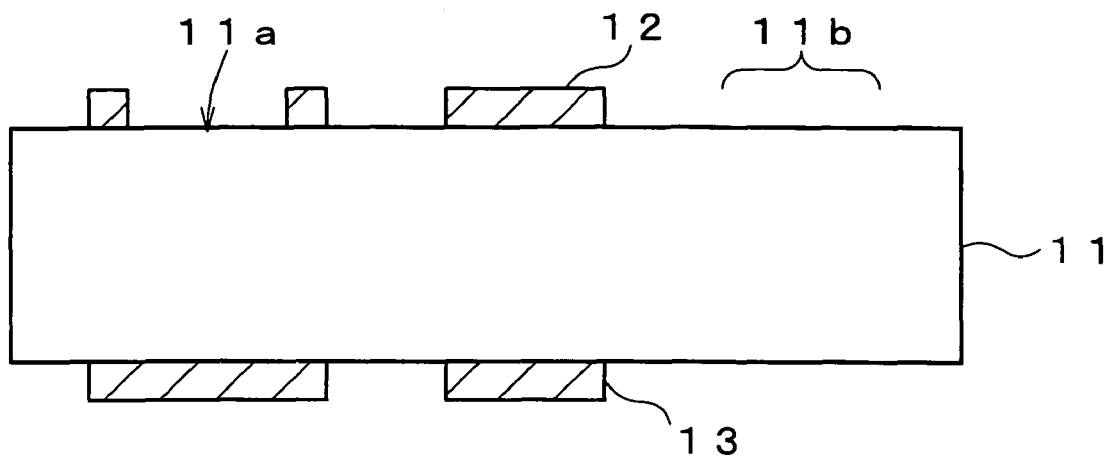
FIG. 54 is a schematic cross-sectional view showing a process (removing the dry films) in the method of manufacturing the multilayer substrate according to the third embodiment of the present invention.
Figure 55:
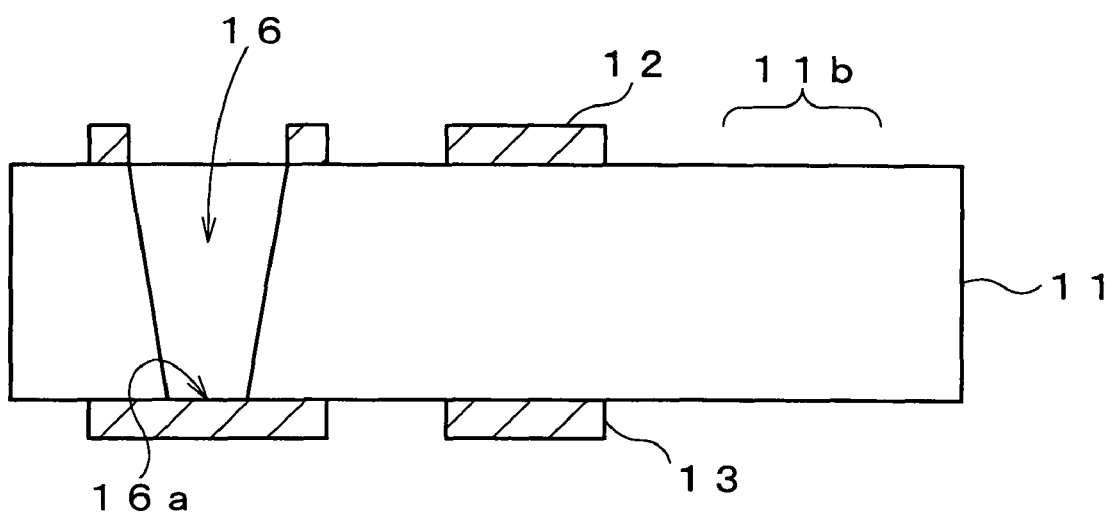
FIG. 55 is a schematic cross-sectional view showing a process (forming a via hole) in the method of manufacturing the multilayer substrate according to the third embodiment of the present invention.

Next, the dry films 14 and 15 are peeled off (FIG. 54). Then, a via hole 16 is formed at the portion 11a in the exposed region of the insulating layer 11 by laser processing (FIG. 55). Although the via hole 16 penetrates the insulating layer 11, part of the conductive layer 13 serves as a stopper in this case. Accordingly, this conductive layer 13 constitutes a bottom 16a of the via hole 16. The diameter of the via hole 16 is not particularly limited but is preferably set in a range from about 30 to 200 μm.

Figure 56:
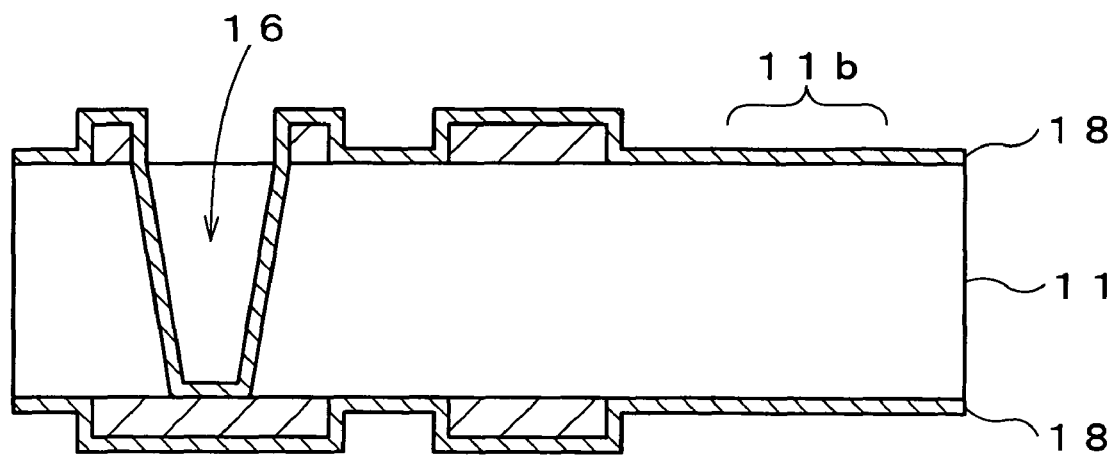
FIG. 56 is a schematic cross-sectional view showing a process (forming base conductive layers) in the method of manufacturing the multilayer substrate according to the third embodiment of the present invention.

Next, a base conductive layer 18 is formed on substantially the entire exposed surface including an inner wall of the via hole 16 (FIG. 56). As the method of forming the base conductive layer 18, it is preferable to apply an electroless plating method, a sputtering method, a vapor deposition method, and the like. The base conductive layer 18 serves as a base for electrolytic plating to be performed later. Accordingly, the base conductive layer 18 is formed in a very small thickness, which may be selected appropriately from a range of several hundred angstroms to 3.0 μm.

Figure 57:
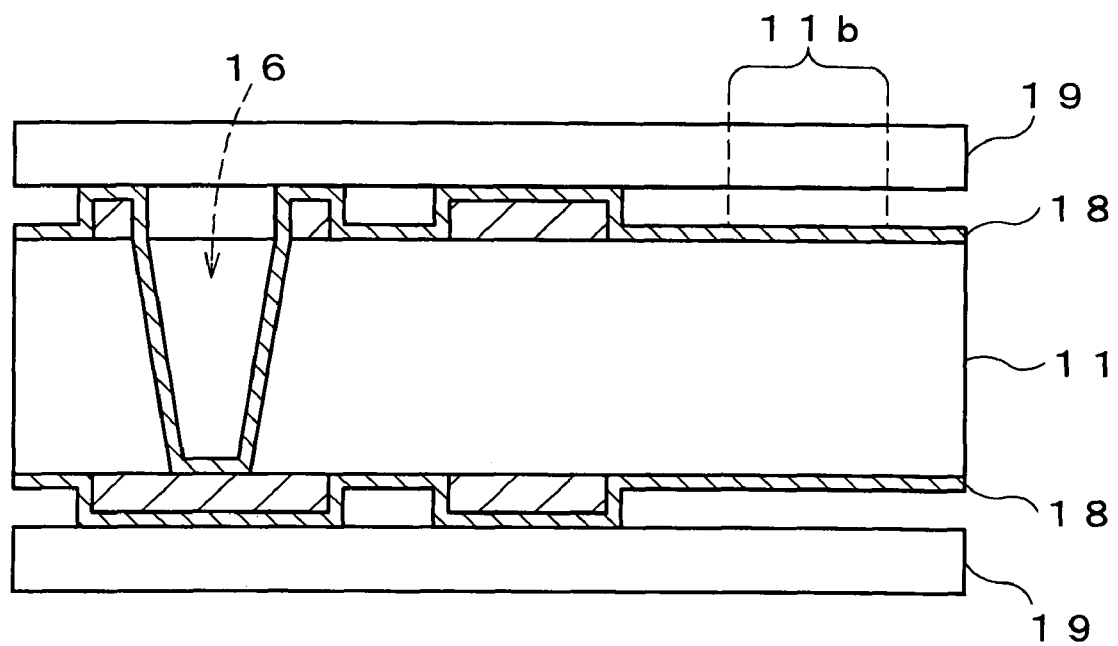
FIG. 57 is a schematic cross-sectional view showing a process (forming dry films) in the method of manufacturing the multilayer substrate according to the third embodiment of the present invention.
Figure 58:
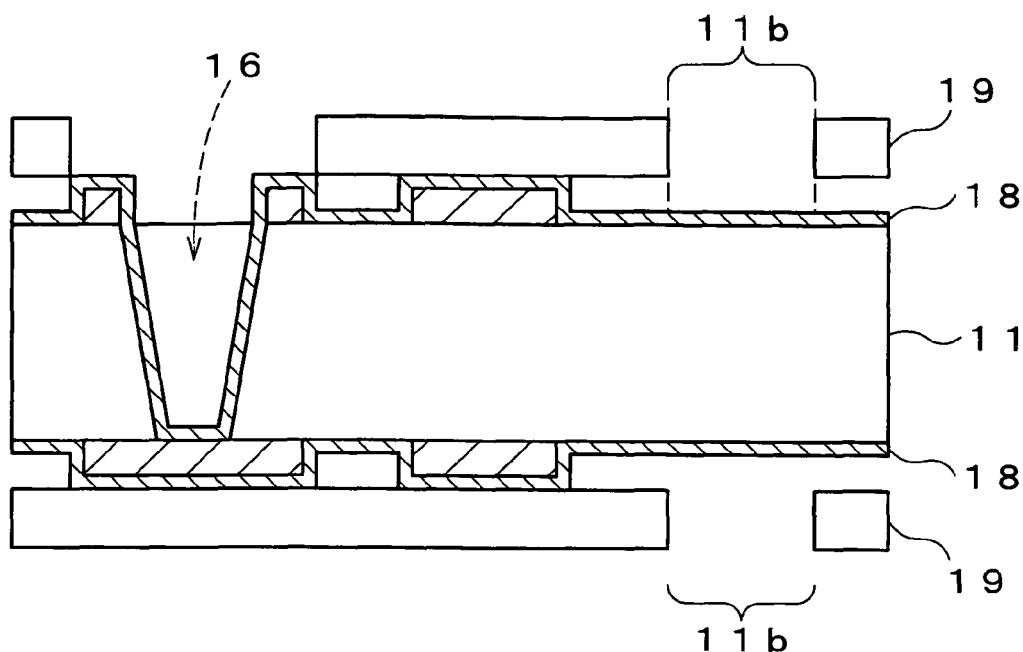
FIG. 58 is a schematic cross-sectional view showing a process (exposing and developing the dry films) in the method of manufacturing the multilayer substrate according to the third embodiment of the present invention.

Next, dry films 19 made of a photosensitive material are attached to both surfaces of the core substrate 10 (FIG. 57). In this way, substantially the entire surface of the base conductive layer 18 is covered with the dry film 19. The dry films 19 are used for forming second conductive patterns to be described later. Accordingly, the thickness of each dry film 19 must be thicker than the first conductive pattern. Then, the dry films 19 located on the open portion for the via hole 16 and in regions supposed to deposit the second conductive patterns thicker than the first conductive pattern are removed by exposing and developing the dry films 19 (FIG. 58). The remaining dry films 19 are used as masks for the electrolytic plating to be performed later.

Figure 59:
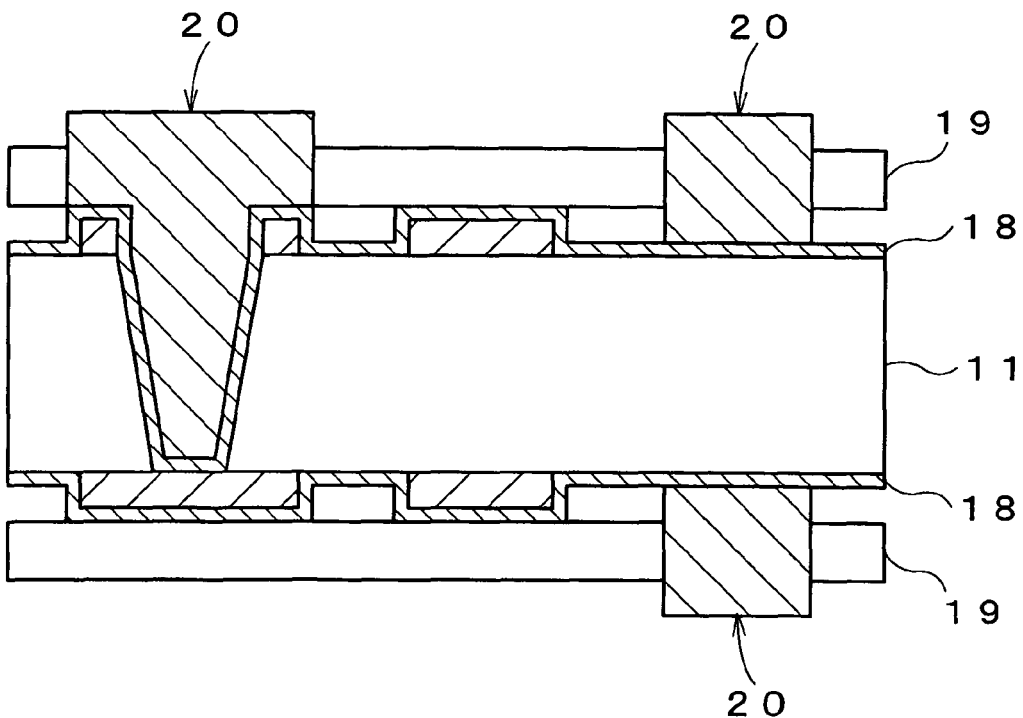
FIG. 59 is a schematic cross-sectional view showing a process (forming a conductive material) in the method of manufacturing the multilayer substrate according to the third embodiment of the present invention.

Next, a conductive material 20 is deposited in the regions not covered with the dry films 19 by electrolytic plating (FIG. 59). In other words, the conductive material 20 is selectively formed in the regions not covered with the dry films 19 instead of the entire surfaces of the core substrate 10. In this way, a space inside the via hole 16 is almost completely filled with the conductive material 20. Moreover, the conductive material 20 is deposited in forming regions of the second conductive patterns.

The electrolytic plating is preferably performed to fill the space inside the via hole 16 and spaces inside the forming regions of the second conductive patterns completely with the conductive material 20. The type of a plating solution may be appropriately selected. For example, when forming the conductive material 20 with copper (Cu), it is possible to use copper sulfate as the plating solution. If a void is left in the space inside the via hole 16, it is preferable to fill the space inside the via hole 16 with conductive resin. When a void is left, the plating solution and the like will remain inside the void and will lead to corrosion of the via hole. It is also possible to use insulative resin instead. However, it is preferable to use the conductive resin to ensure electrical connection of the layers above and below the via hole 16.

Figure 60:
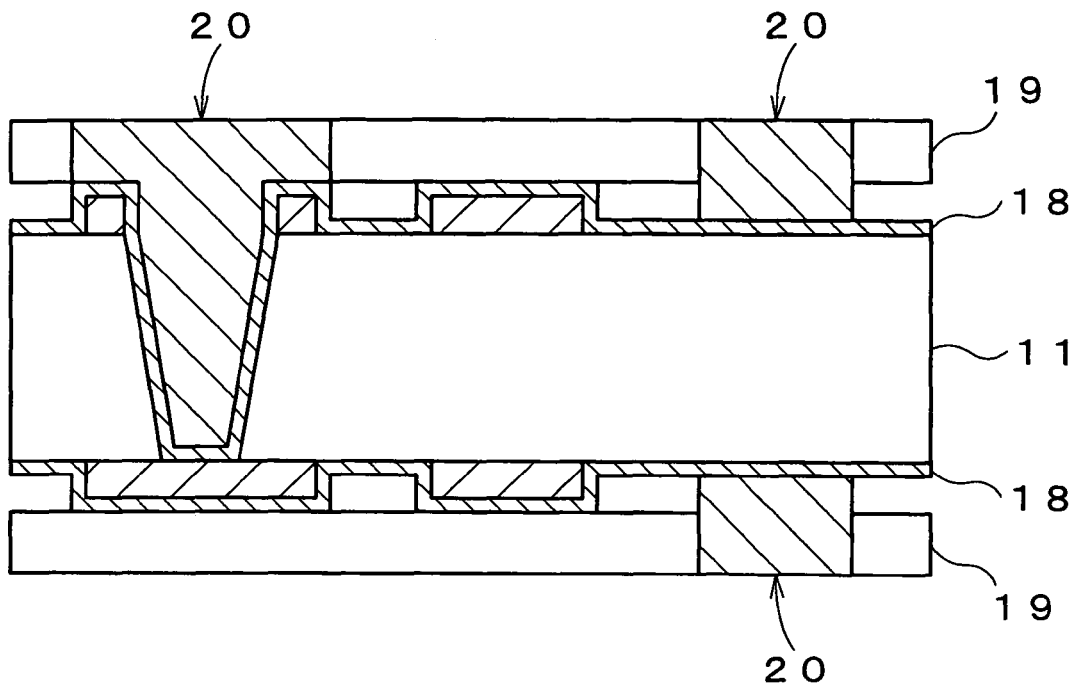
FIG. 60 is a schematic cross-sectional view showing a process (polishing the conductive material) in the method of manufacturing the multilayer substrate according to the third embodiment of the present invention.

Next, the conductive material 22 is polished parallel to the surfaces of the core substrate 10 without peeling the dry films 19 off, thereby planarizing the entire surfaces (FIG. 60). In other words, the conductive material 20 is polished while leaving the dry films 19 on the surfaces. At this time, the dry films are hardly polished off. Accordingly, a surface of the conductive material 20 will substantially coincide with a surface of the dry film 19. The polishing process may apply only one of a chemical polishing method and a mechanical polishing method using a buff. However, it is preferable to perform the both methods. Particularly, it is possible to ensure a very high degree of flatness by performing the chemical polishing method and then performing the mechanical polishing method using the buff.

Figure 61:
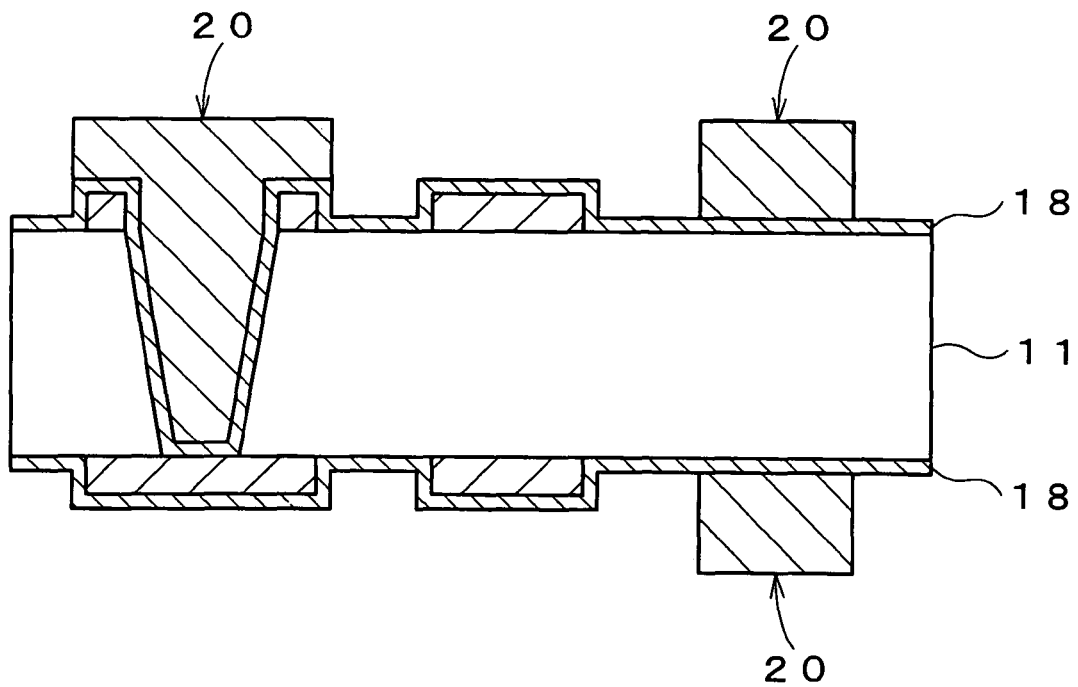
FIG. 61 is a schematic cross-sectional view showing a process (removing the dry films) in the method of manufacturing the multilayer substrate according to the third embodiment of the present invention.
Figure 62:
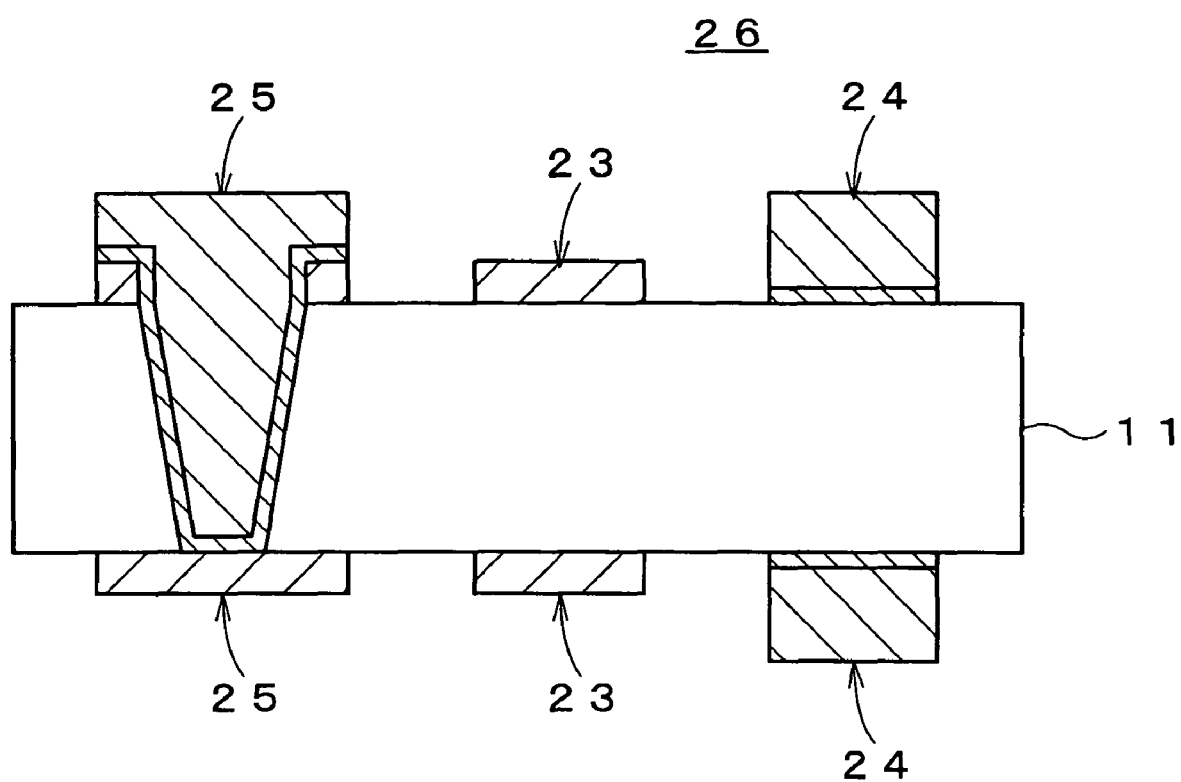
FIG. 62 is a schematic cross-sectional view showing a process (soft etching) in the method of manufacturing the multilayer substrate according to the third embodiment of the present invention.

Subsequently, second conductive patterns 24 thicker than a first conductive pattern 23 and an electrode pattern 25 on the via hole are formed on the surfaces of the base conductive layers 18 by removing the dry films 19 (FIG. 61). Thereafter, by removing (soft-etching) the unnecessary base conductive layers 18 at the portions where the conductive patterns and the like are not formed by use of an etchant such as an acid, the series of processes on the build-up layer are completed. In this way, a processed core substrate 26 is finished to include the relatively thinner first conductive patterns 23, the relatively thicker second conductive patterns 24, and the electrode pattern 25 on the via hole (FIG. 62). Here, the conductive patterns are also etched to some extent in the soft etching process. However, this will not cause a serious problem because a small etching amount is very small.

As described above, according to this embodiment, it is possible to form conductive patterns having mutually different thicknesses in the same layer. Therefore, an LC pattern for a high-frequency circuit that requires small variations in the width and the thickness of the pattern and a normal conductive pattern that requires impedance matching can be formed as the first conductive pattern by patterning the conductive layers. Meanwhile, an L pattern for a choke coil that requires a high aspect ratio and a relatively large cross-sectional area (which has a low direct-current resistance) can be formed as the second conductive pattern by plating. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a core substrate suitable for high-density packaging.

Furthermore, according to this embodiment, it is possible to form the second conductive pattern in the same step for filling the space inside the via hole. Therefore, it is possible to form the second conductive pattern within usual processes while avoiding an additional process.

Next, the case of applying the method of manufacturing a multilayer substrate of this embodiment to a "build-up layer" will be described with reference to schematic cross-sectional views in FIG. 63 to FIG. 75.

The method of this embodiment is applicable to a build-up layer to be laminated on the processed core substrate 26 which is fabricated by the method described with reference to FIG. 52 to 62, or to a build-up layer to be laminated on a processed core substrate fabricated by any other methods. In any case, it is preferable to apply this method to a build-up layer to be laminated on any of the core substrates which is fabricated by the method of manufacturing a multilayer substrate of the present invention. In this way, the variation in the thickness is reduced in terms of the conductive pattern formed on the surface of the core substrate as well as the conductive pattern formed on the surface of the build-up layer. As a consequence, it is possible to improve the pattern accuracy on the whole. Now, the case of applying this embodiment to the build-up layer to be laminated on the processed core substrate 26 (see FIG. 62) will be described.

Figure 63:
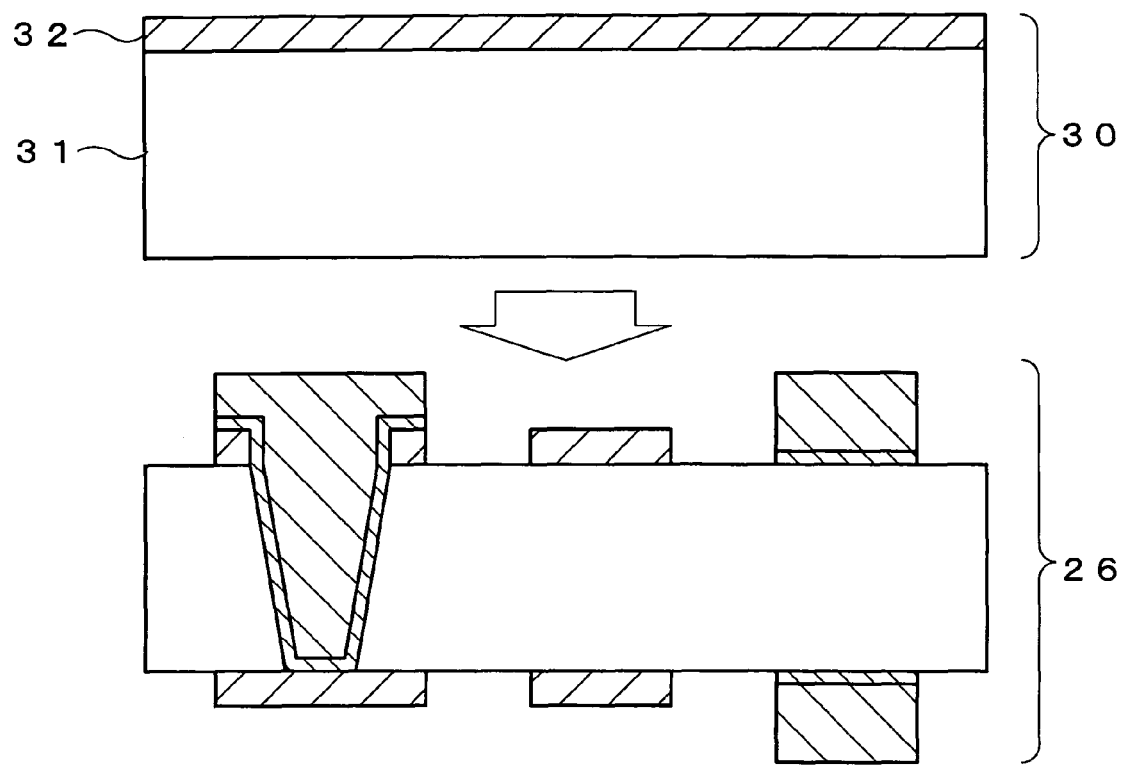
FIG. 63 is a schematic cross-sectional view showing a process (pressing a build-up layer) in the method of manufacturing a multilayer substrate according to the third embodiment of the present invention.
Figure 64:
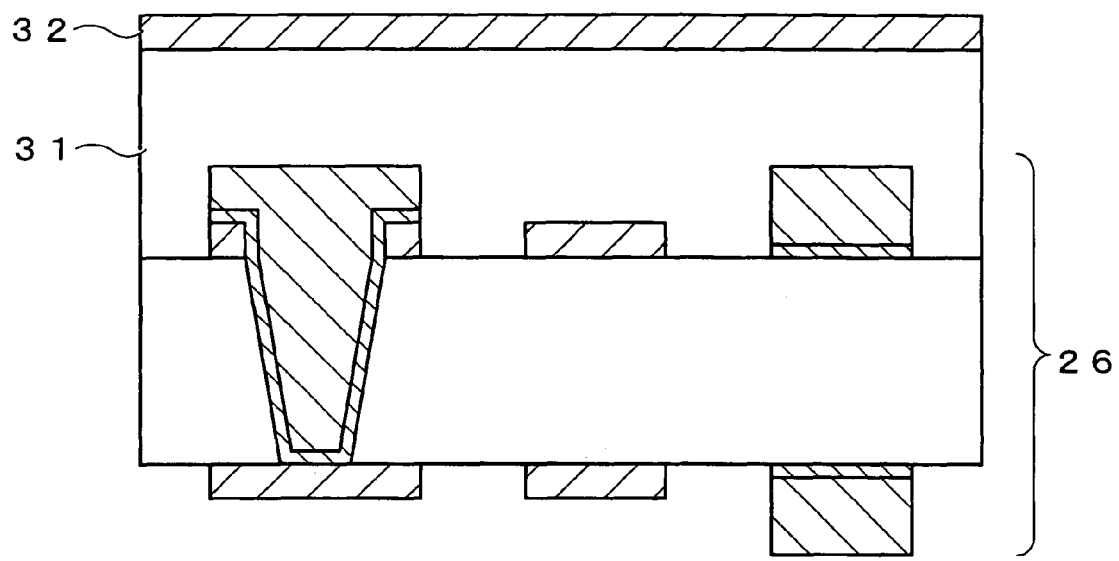
FIG. 64 is a schematic cross-sectional view showing a process (preparing the multilayer substrate) in the method of manufacturing the multilayer substrate according to the third embodiment of the present invention.

First, the processed core substrate 26 fabricated by the method described with reference to FIG. 52 to FIG. 62 is prepared, and a build-up layer 30 is laminated on the core substrate 26 (FIG. 63). The build-up layer 30 before processing is made of a sheet (a resin-coated metal film) made of thermosetting resin 31 such as B-stage epoxy resin, which is provided with a metal foil 32. This sheet is laminated on the core substrate 26 so as to allow the thermosetting resin 31 to face the core substrate 26. The thermosetting resin 31 is hardened by subjecting this laminated body to hot pressing. Accordingly, the build-up layer 30 is integrated with the core substrate 26 (FIG. 64). In this way, the thermosetting resin 31 constitutes an insulating layer of the build-up layer, while the metal foil 32 constitutes a conductive layer thereof.

Figure 65:
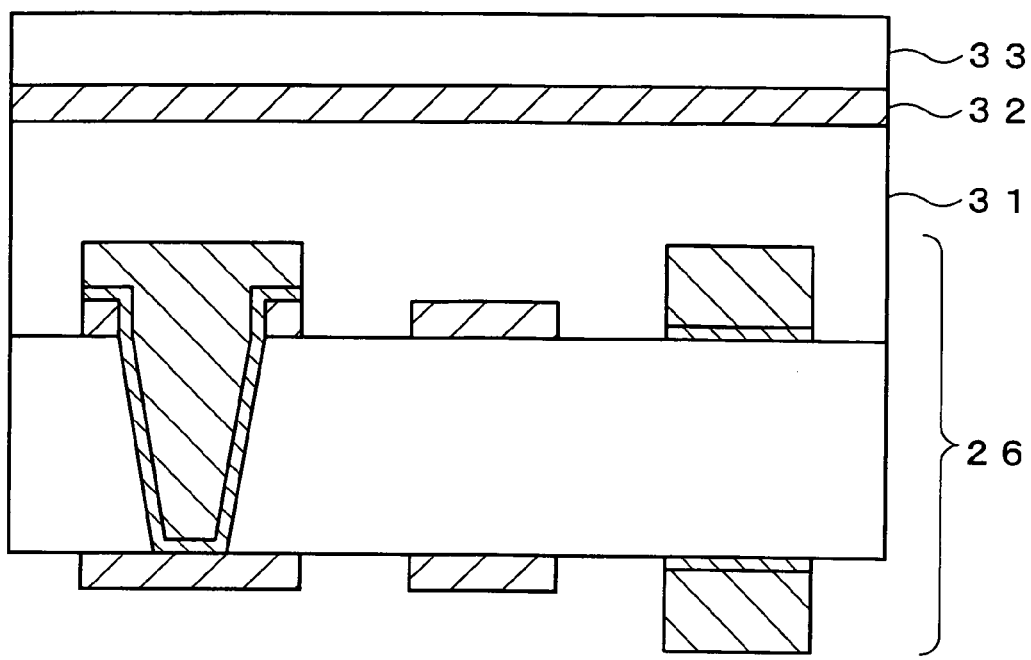
FIG. 65 is a schematic cross-sectional view showing a process (forming a dry film) in the method of manufacturing the multilayer substrate according to the third embodiment of the present invention.
Figure 66:
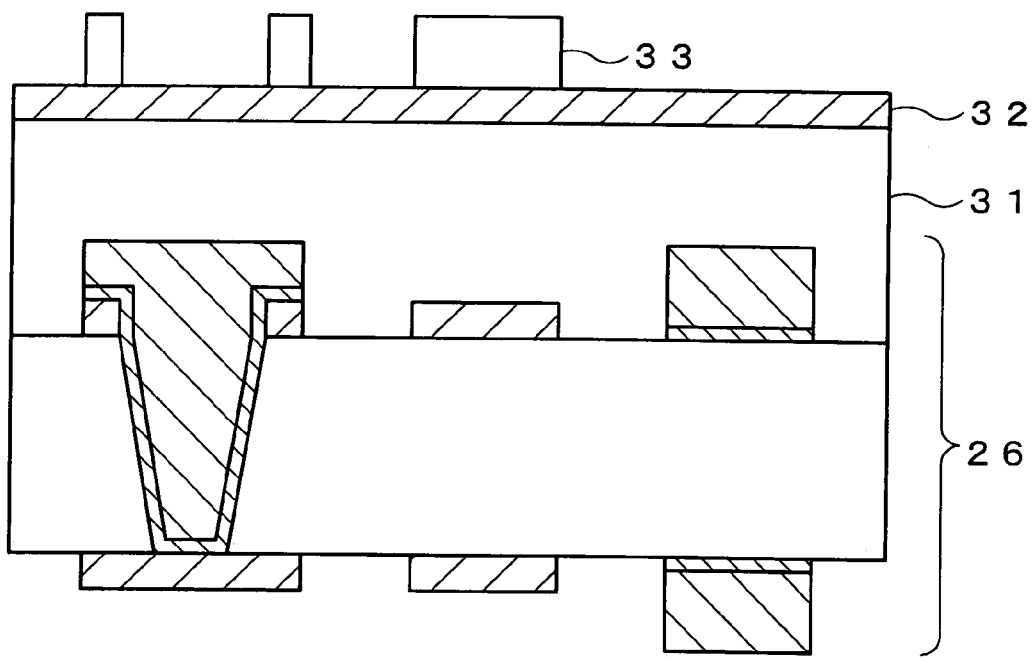
FIG. 66 is a schematic cross-sectional view showing a process (exposing and developing the dry film) in the method of manufacturing the multilayer substrate according to the third embodiment of the present invention.

Next, a dry film 33 made of a photosensitive material is attached to a surface of the build-up layer 30 (FIG. 65). In this way, substantially the entire surface of the conductive layer 32 is covered with the dry film 33. Thereafter, the dry film 33 is patterned by exposure and development processes to expose the conductive layer 32 partially (FIG. 66).

Figure 67:
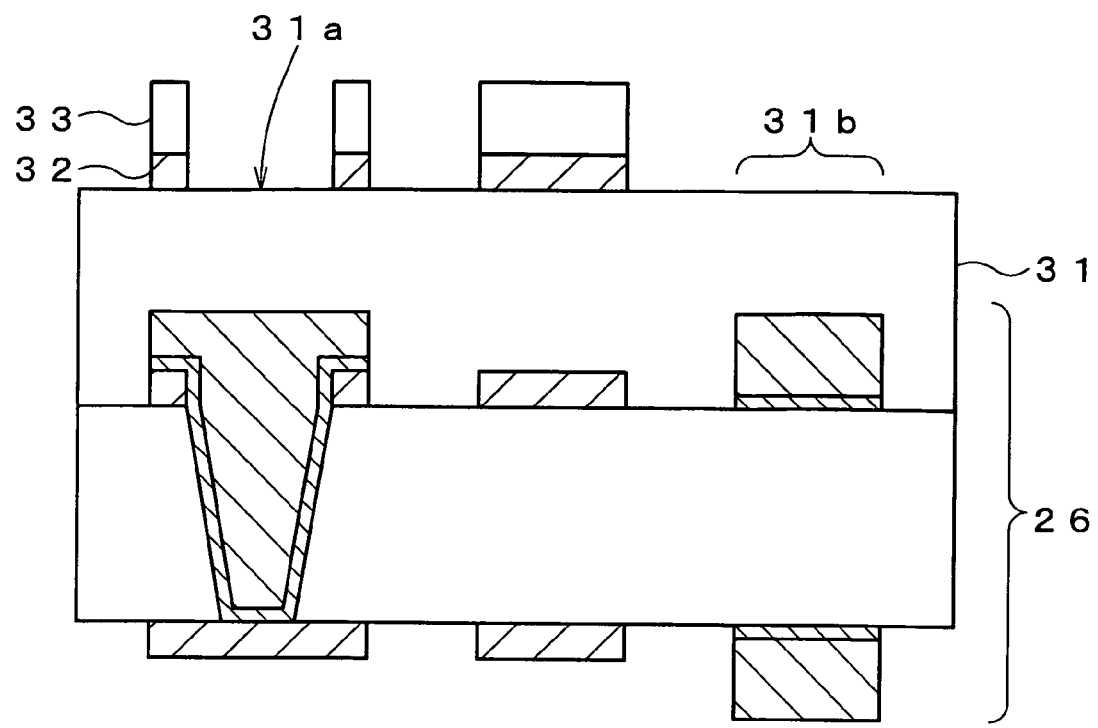
FIG. 67 is a schematic cross-sectional view showing a process (etching the conductive layer) in the method of manufacturing the multilayer substrate according to the third embodiment of the present invention.

Next, the conductive layer 32 is etched while using the dry film 33 as a mask, and the insulating layer 31 is partially exposed (FIG. 67). A portion 31a in an exposed region of the insulating layer constitutes an open portion for a via hole, and another portion 31b constitutes an open portion for a conductive pattern forming region of a relatively thicker conductive pattern. Meanwhile, the remaining conductive layer 32 mainly constitutes a normal conductive pattern (a first conductive pattern) having a predetermined thickness. A variation in the thickness of the conductive layer 32 patterned in this process is reduced to a very small amount. Accordingly, it is possible to perform patterning at high accuracy. Therefore, the width of the first conductive pattern can be regulated to a desired width.

Figure 68:
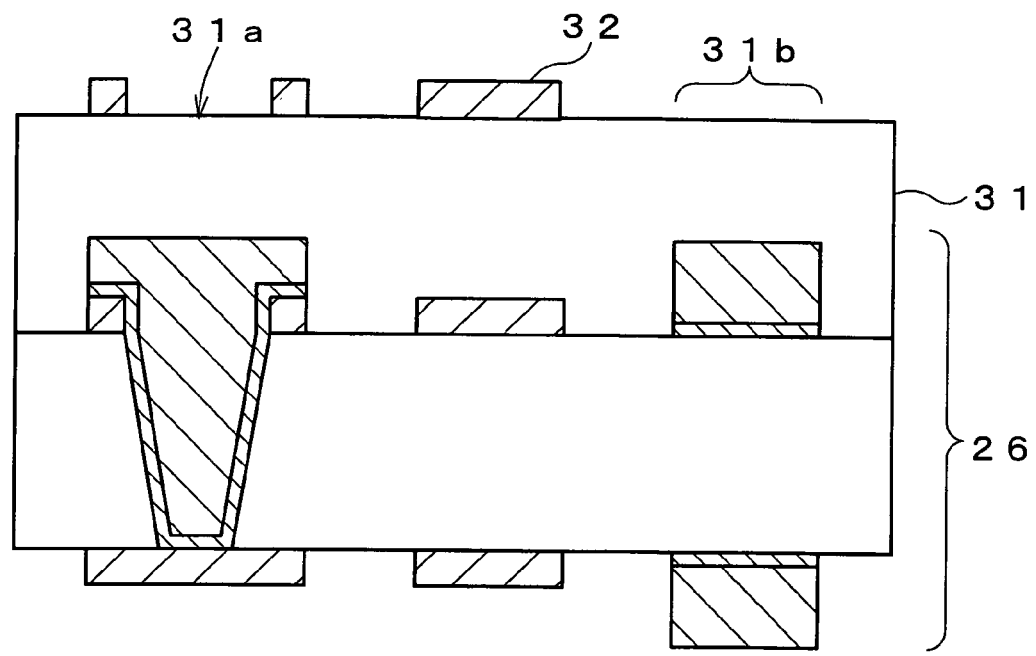
FIG. 68 is a schematic cross-sectional view showing a process (removing the dry films) in the method of manufacturing the multilayer substrate according to the third embodiment of the present invention.
Figure 69:
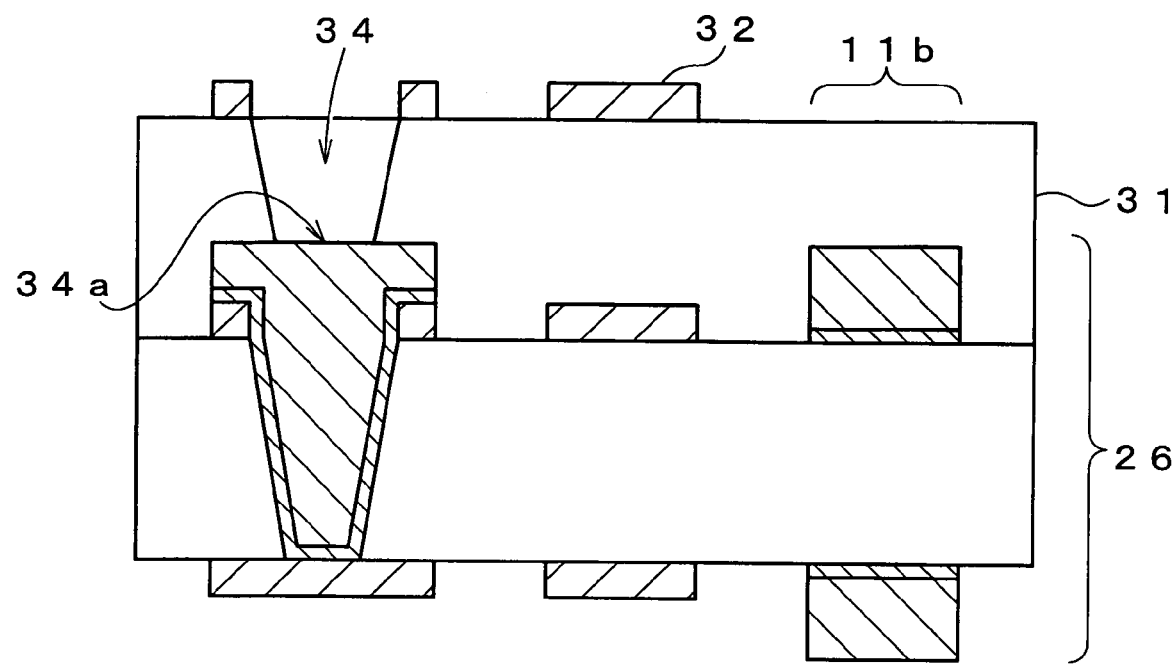
FIG. 69 is a schematic cross-sectional view showing a process (forming a via hole) in the method of manufacturing the multilayer substrate according to the third embodiment of the present invention.

Next, the dry film 33 is peeled off (FIG. 68). Then, a via hole 34 is formed at the portion 31a in the exposed region of the insulating layer 31 by laser processing (FIG. 69). Although the via hole 34 penetrates the insulating layer 31, part of the conductive layer on the core substrate 26 (which is the electrode pattern 23) serves as a stopper in this case. Accordingly, this conductive layer constitutes a bottom 34a of the via hole 34. The diameter of the via hole 34 is not particularly limited but is preferably set in a range from about 30 to 200 μm.

Figure 70:
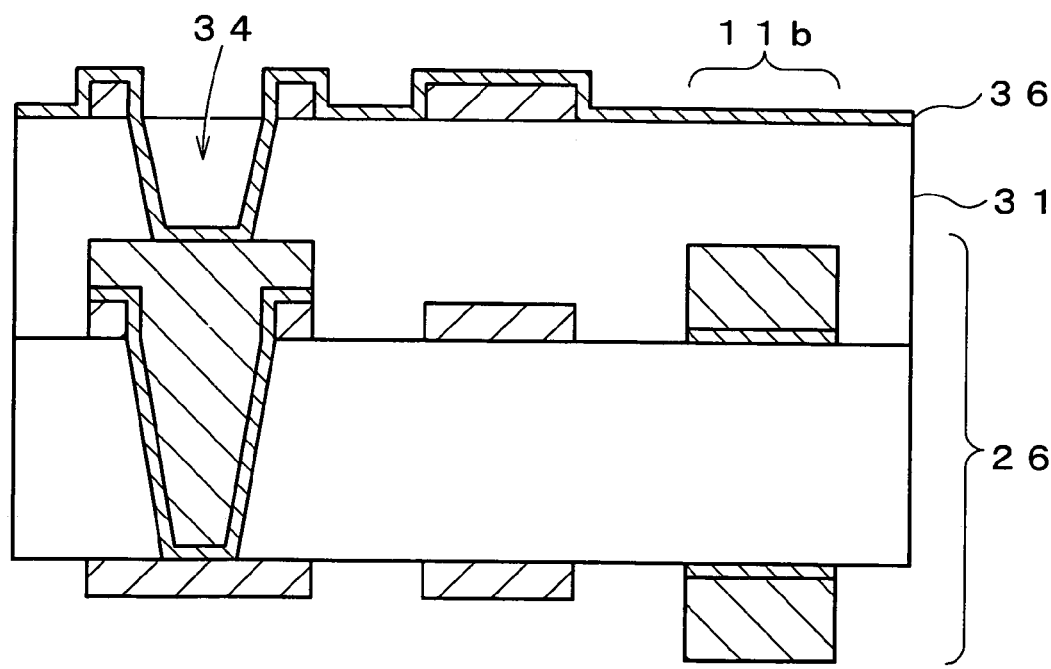
FIG. 70 is a schematic cross-sectional view showing a process (forming a base conductive layer) in the method of manufacturing the multilayer substrate according to the third embodiment of the present invention.

Next, a base conductive layer 36 is formed on substantially the entire exposed surface including an inner wall of the via hole 34 (FIG. 70). As the method of forming the base conductive layer 36, it is preferable to apply an electroless plating method, a sputtering method, a vapor deposition method, and the like. The base conductive layer 36 serves as a base for electrolytic plating to be performed later. Accordingly, the base conductive layer 36 is formed in a very small thickness, which may be selected appropriately from a range of several hundred angstroms to 3.0 μm.

Figure 71:
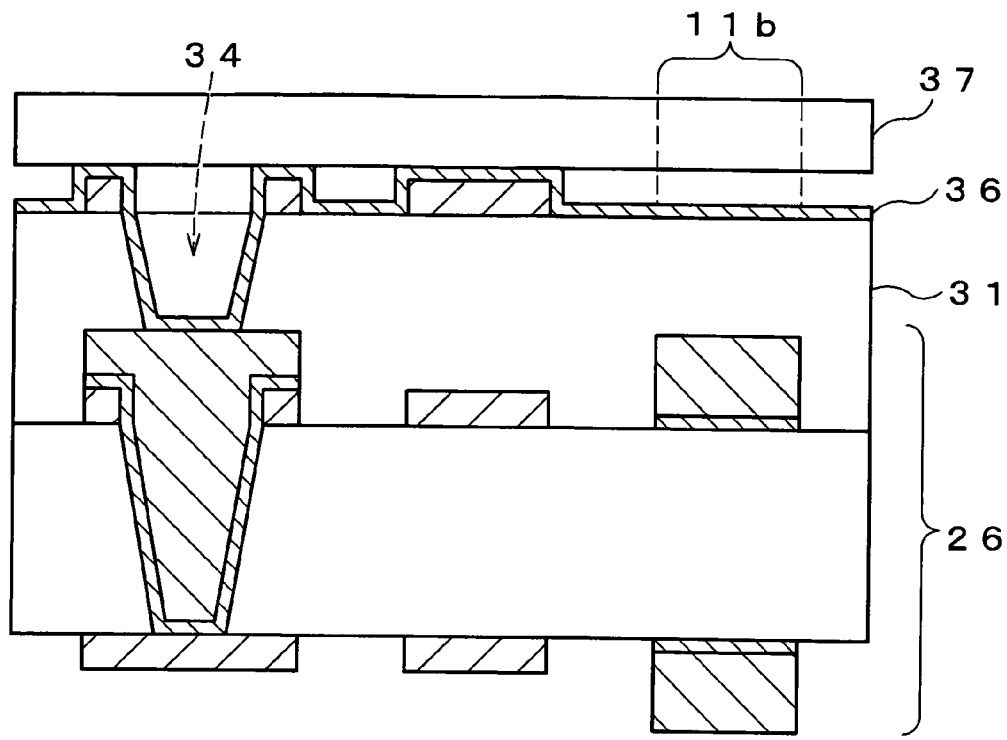
FIG. 71 is a schematic cross-sectional view showing a process (forming a dry film) in the method of manufacturing the multilayer substrate according to the third embodiment of the present invention.
Figure 72:
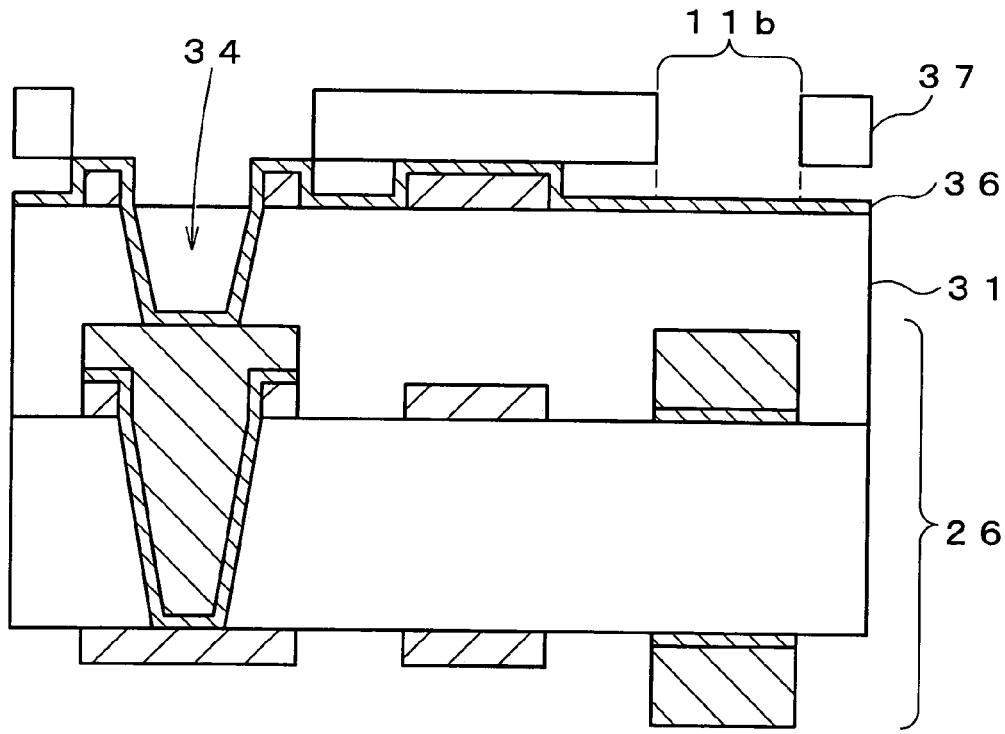
FIG. 72 is a schematic cross-sectional view showing a process (exposing and developing the dry film) in the method of manufacturing the multilayer substrate according to the third embodiment of the present invention.

Next, a dry film 37 made of a photosensitive material is attached to a surface of the build-up layer 30 (FIG. 71). In this way, substantially the entire surface of the base conductive layer 36 is covered with the dry film 37. The dry film 37 is used for forming a second conductive pattern to be described later. Accordingly, the thickness of the dry film 37 must be thicker than the first conductive pattern. Then, the dry film 37 located on the open portion for the via hole 34 and in a region supposed to deposit the second conductive pattern thicker than the first conductive pattern is removed by exposing and developing the dry film 37 (FIG. 72). The remaining dry film 37 is used as a mask for the electrolytic plating to be performed later.

Figure 73:
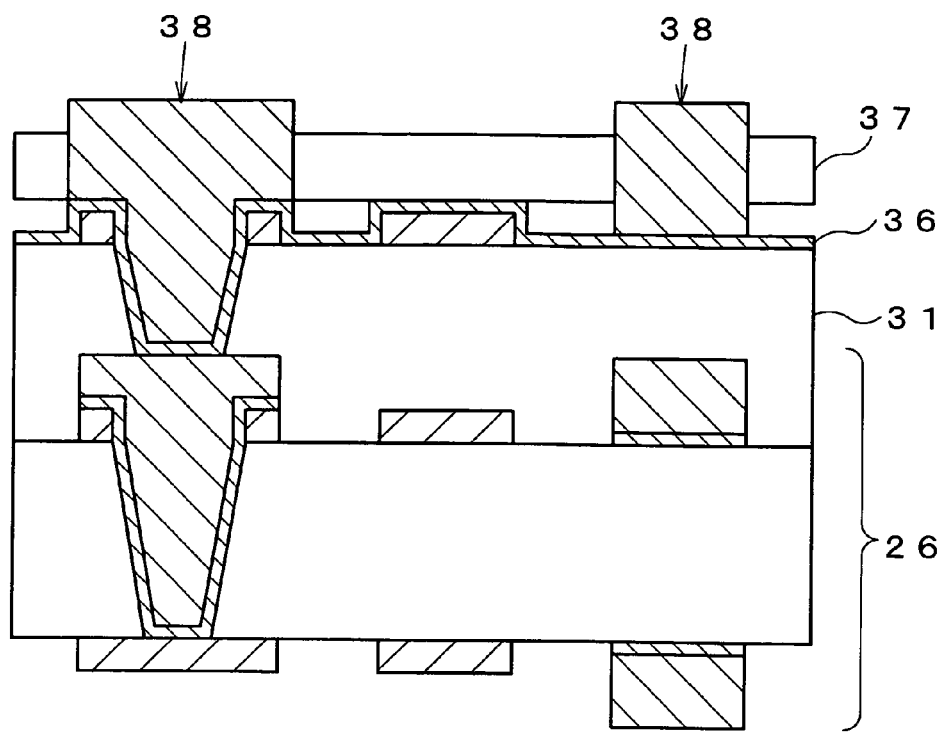
FIG. 73 is a schematic cross-sectional view showing a process (forming a conductive material) in the method of manufacturing the multilayer substrate according to the third embodiment of the present invention.

Next, a conductive material 38 is deposited in the region not covered with the dry film 37 by electrolytic plating (FIG. 73). In other words, the conductive material 38 is selectively formed in the region not covered with the dry film 37, instead of the entire surface of the build-up layer. In this way, a space inside the via hole 34 is almost completely filled with the conductive material 38. Moreover, the conductive material 38 is deposited in a forming region of the second conductive pattern.

Figure 74:
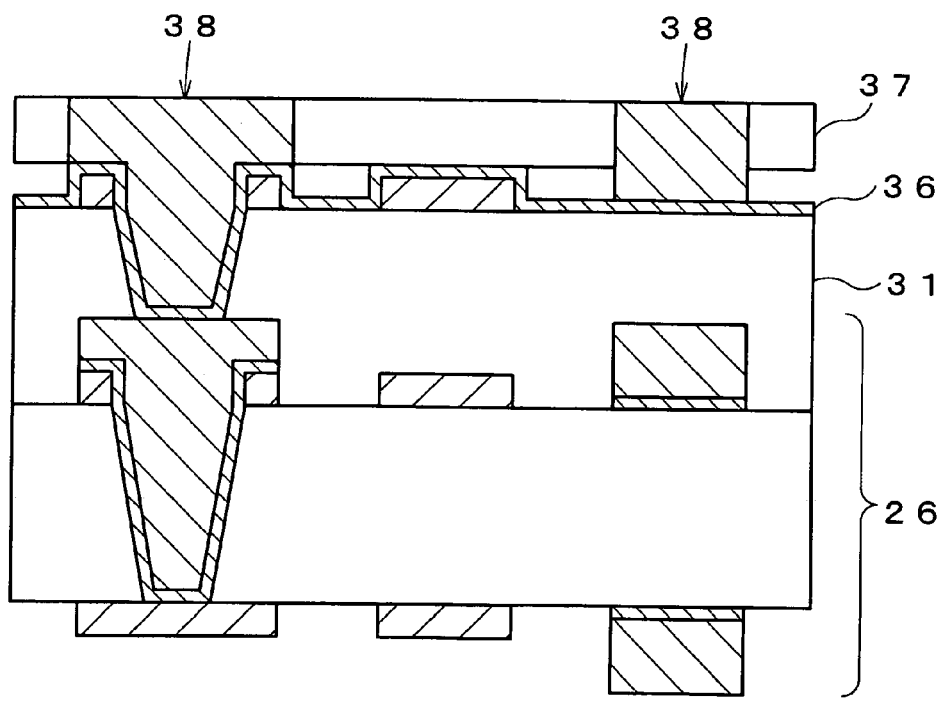
FIG. 74 is a schematic cross-sectional view showing a process (polishing the conductive material) in the method of manufacturing the multilayer substrate according to the third embodiment of the present invention.

Next, the conductive material 38 is polished parallel to the surface of the build-up layer 30 without peeling the dry film 37 off, thereby planarizing the entire surface (FIG. 74). In other words, the conductive material 38 is polished while leaving the dry film 37 on the surface. At this time, the dry film is hardly polished off. Accordingly, a surface of the conductive material 38 will substantially coincide with a surface of the dry film 37.

Figure 75:
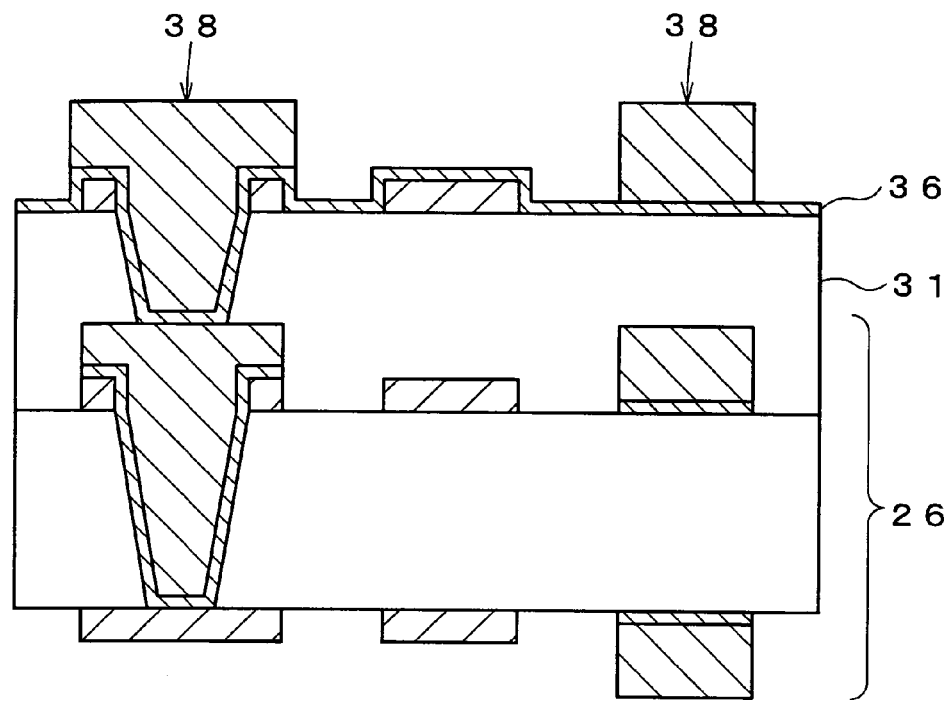
FIG. 75 is a schematic cross-sectional view showing a process (removing the dry film) in the method of manufacturing the multilayer substrate according to the third embodiment of the present invention.
Figure 76:
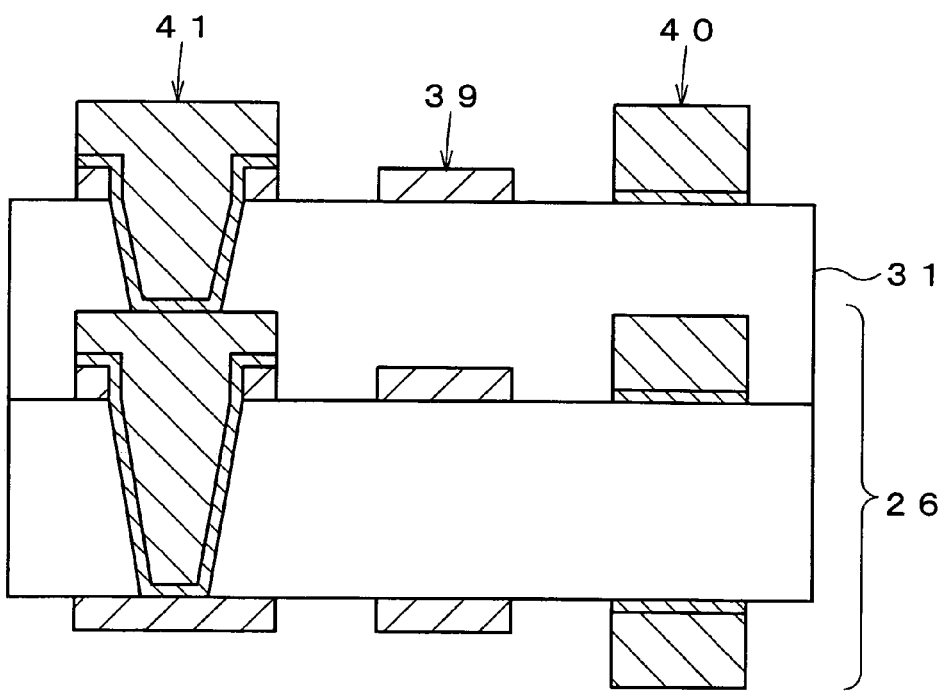
FIG. 76 is a schematic cross-sectional view showing a process (soft etching) in the method of manufacturing the multilayer substrate according to the third embodiment of the present invention.

Subsequently, a second conductive pattern 41 thicker than a first conductive pattern 40 and an electrode pattern 42 on the via hole are formed on the surface of the base conductive layer 36 by removing the dry film 37 (FIG. 75). Thereafter, by removing (soft-etching) the unnecessary base conductive layer 36 at the portion where the conductive patterns and the like are not formed by use of an etchant such as an acid, the series of processes on the build-up layer are completed. In this way, a multilayer substrate 43 is finished to include the relatively thinner first conductive patterns 40, the relatively thicker second conductive patterns 41, and the electrode pattern 42 on the via hole (FIG. 76). Here, the conductive patterns are also etched to some extent in the soft etching process. However, this will not cause a serious problem because a small etching amount is small.

As described above, according to this embodiment, it is possible to form patterns having mutually different thicknesses in the same layer. Therefore, an LC pattern for a high-frequency circuit that requires small variations in the width and the thickness of the pattern and a normal conductive pattern that requires impedance matching can be formed as the first conductive pattern by patterning the conductive layers. Meanwhile, an L pattern for a choke coil that requires a high aspect ratio and a relatively large cross-sectional area (which has a low direct-current resistance) can be formed as the second conductive pattern by plating. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a core substrate suitable for high-density packaging.

Furthermore, according to this embodiment, it is possible to form the second conductive pattern in the same step for filling the space inside the via hole. Therefore, it is possible to form the second conductive pattern within usual processes while avoiding an additional process.

Next, a fourth embodiment of the present invention will be described in detail.

A method of manufacturing a multilayer substrate according to this embodiment is also applicable to both of a "core substrate" constituting a multilayer substrate and a "build-up layer" to be provided on the core substrate. First, the case of applying the method of manufacturing a multilayer substrate according to this embodiment to a "core substrate" will be described with reference to schematic cross-sectional views in FIG. 77 to FIG. 98.

Figure 77:
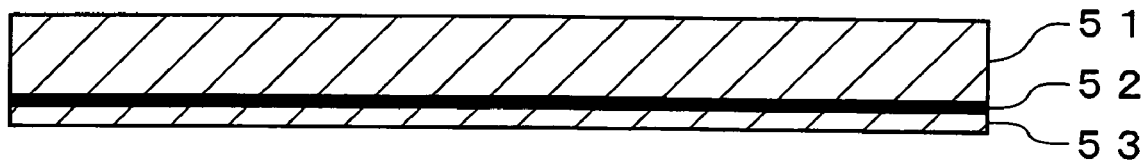
FIG. 77 is a schematic cross-sectional view showing a process (preparing a clad material) in the method of manufacturing a multilayer substrate according to a fourth embodiment of the present invention.

A clad material 50 is prepared to begin with (FIG. 77). The clad material 50 before processing is formed as a three-layer laminated body including conductive materials A and B having mutually different etching rates which are laminated in the order of A/B/A. Specifically, a first conductive layer 51 and a third conductive layer 53 are made of an etching material A, and a second conductive layer 52 interposed therebetween is made of an etch-stop material B having a lower etching rate than the etching material A. A combination (A/B) is preferably selected from the groups of (Cu/Al), (Al/Cu), (Cu/Ni), (Ni/Cu), (Cu/Pd), (Cu/Ag), (SUS/Pd), (SUS/Ag), (Ag/SUS), and (Cu/SUS). A combination (Cu/Ni/Cu) representing (A/B/A) is particularly preferable. Thicknesses of the first conductive layer 51 and the third conductive layer 53 are preferably different from each other. In this embodiment, the first conductive layer 51 is thicker than the third conductive layer 53. The thickness (t1) of the first conductive layer 51 is preferably 1.5 to 20 times as large as the thickness (t3) of the third conductive layer 53. To be more precise, the thickness (t1) of the first conductive layer 51 is set preferably in a range from 12 to 70 μm, and the thickness (t3) of the third conductive layer 53 is set preferably in a range from 1 to 18 μm.

Figure 78:
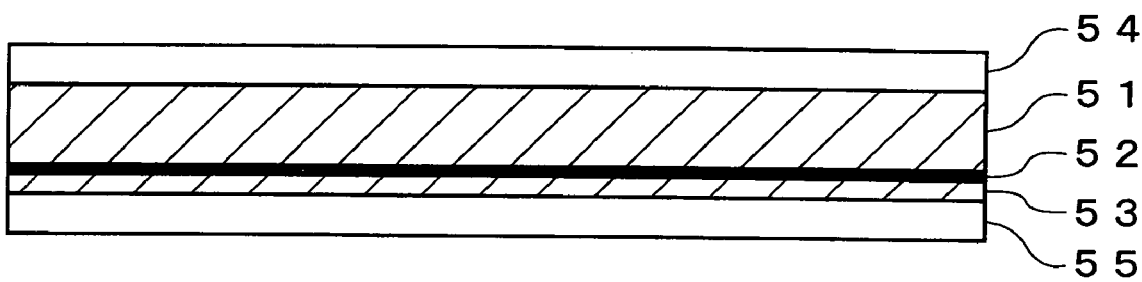
FIG. 78 is a schematic cross-sectional view showing a process (forming dry films) in the method of manufacturing the multilayer substrate according to the fourth embodiment of the present invention.
Figure 79:
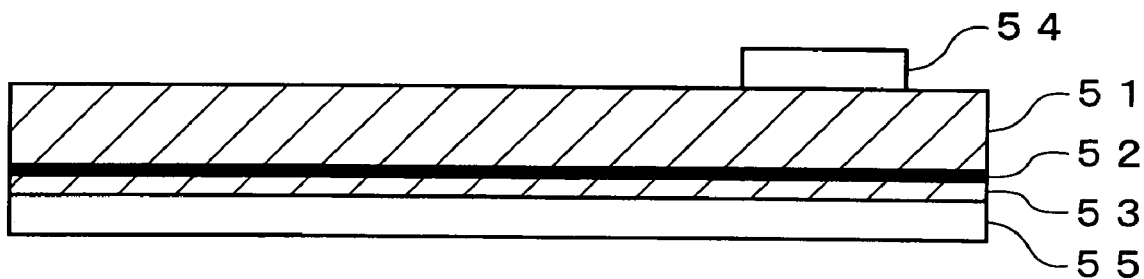
FIG. 79 is a schematic cross-sectional view showing a process (exposing and developing the dry films) in the method of manufacturing the multilayer substrate according to the fourth embodiment of the present invention.

Next, dry films 54 and 55 made of a photosensitive material are respectively attached to both surfaces of the clad material 50 (FIG. 78). In this way, a surface of the first conductive layer 51 is covered with the dry film 54 and a surface of the third conductive layer 53 is covered with the dry film 55. Then, the dry film 54 is patterned by exposure and development processes, and the first conductive layer 54 is exposed (FIG. 79).

Figure 80:
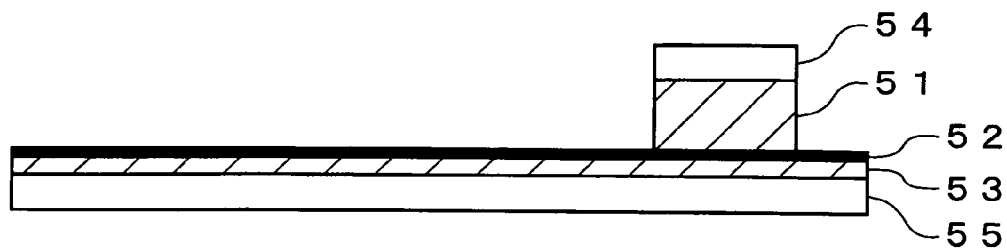
FIG. 80 is a schematic cross-sectional view showing a process (etching the clad material) in the method of manufacturing the multilayer substrate according to the fourth embodiment of the present invention.
Figure 81:
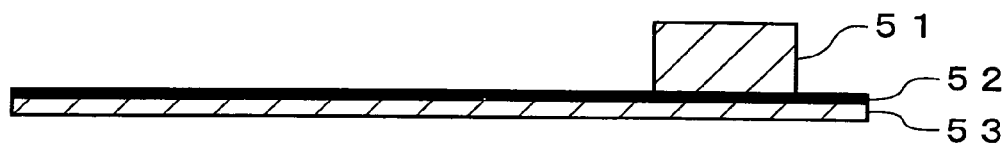
FIG. 81 is a schematic cross-sectional view showing a process (removing the dry films) in the method of manufacturing the multilayer substrate according to the fourth embodiment of the present invention.

Next, the first conductive layer 51 of the clad material 50 is etched while using the dry film 54 as a mask (FIG. 80). In this way, the first conductive layer 51 is patterned and formed into a relatively thicker conductive pattern (a second conductive pattern). At this time the second conductive layer 52 serving as the etch-stop material exists between the first conductive layer 51 and the third conductive layer 53. Therefore, the second conductive layer 52 may be slightly etched but will not be etched completely to expose the third conductive layer 53. Here, it is preferable to select an appropriate etchant depending on the combination of the etching material and the etch-stop material as described below. Specifically, it is preferable to use: an acidic etchant (such as sulfuric acid) when the combination (the etching material/the etch-stop material) is (Cu/Al); an alkaline etchant in the case of (Al/Cu); any of a mixture of sulfuric acid and a hydrogen peroxide etchant, ammonium persulfate, and an alkaline etchant in the case of (Cu/Ni); a commercially available Ni remover in the case of (Ni/Cu); ferric chloride in the case of any of (Cu/Pd), (Cu/Ag), (SUS/Pd) and (SUS/Ag); and ferric nitrate in the case of any of (Ag/SUS) and (Cu/SUS). Thereafter, the dry films 54 and 55 are peeled off (FIG. 81) to complete patterning of the clad material 50.

Figure 82:
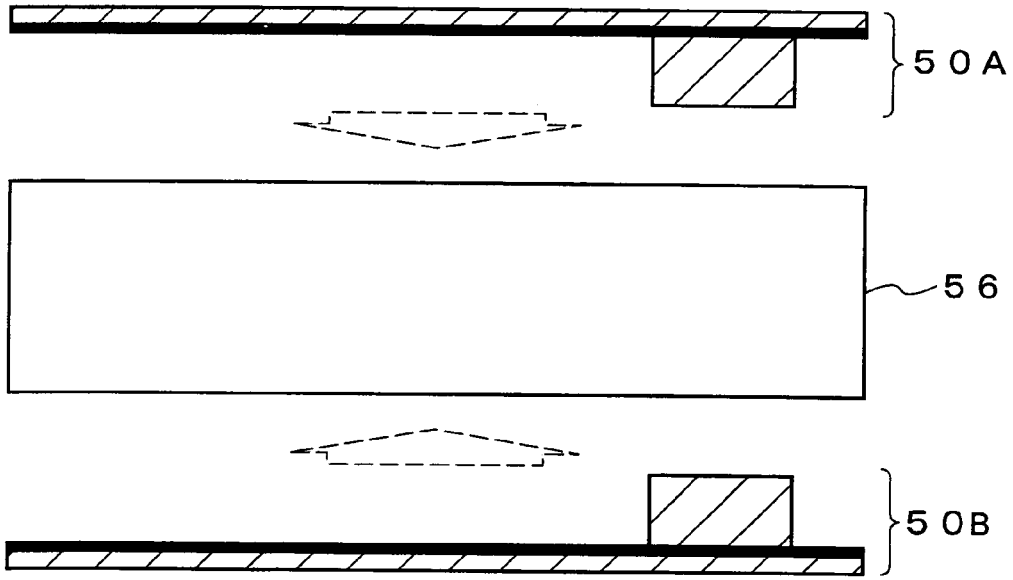
FIG. 82 is a schematic cross-sectional view showing a process (preparing a core substrate) in the method of manufacturing the multilayer substrate according to the fourth embodiment of the present invention.
Figure 83:
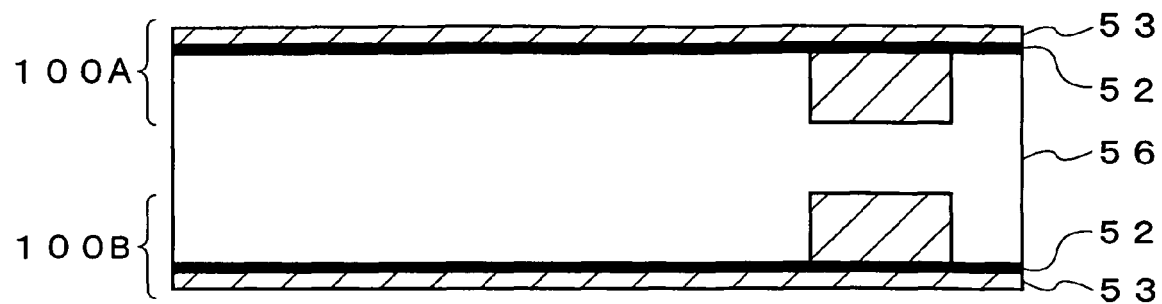
FIG. 83 is a schematic cross-sectional view showing a process (integrating the clad materials) in the method of manufacturing the multilayer substrate according to the fourth embodiment of the present invention.

Next, two clad materials 50 thus patterned are prepared and a core substrate 56 is prepared. Then, the two clad materials (hereinafter referred to as clad materials 50A and 50B) are respectively attached to both surfaces of the core substrate 56 (FIG. 82). The core substrate 56 serves as an insulating layer of a multilayer substrate, and also serves to ensure overall mechanical strength upon fabrication of the multilayer substrate. Although the material of the core substrate 56 is not particularly limited, it is preferable to use a core made of a glass cloth, Kevlar, a resin cloth such as liquid crystal polymer, a fluoroplastic porous sheet or the like, which is impregnated with thermosetting resin, thermoplastic resin or the like. The thickness of the core substrate 56 is set preferably in a range from about 20 μm to 200 μm. Alternatively, as the core substrate it is possible to use a sheet material without a core, such as LCP, PPS, PES, PEEK or PI in order to uniformize laser processing conditions. The clad materials 50A and 50B are attached to this core substrate 56 such that the pattern-etched surfaces (i.e. the first conductive layers 51) face the core substrate 56. The core 11 is hardened by pressing this laminated body. In this way, the clad materials 50A and 50B are integrated with the core substrate 56 (FIG. 83).

Figure 84:
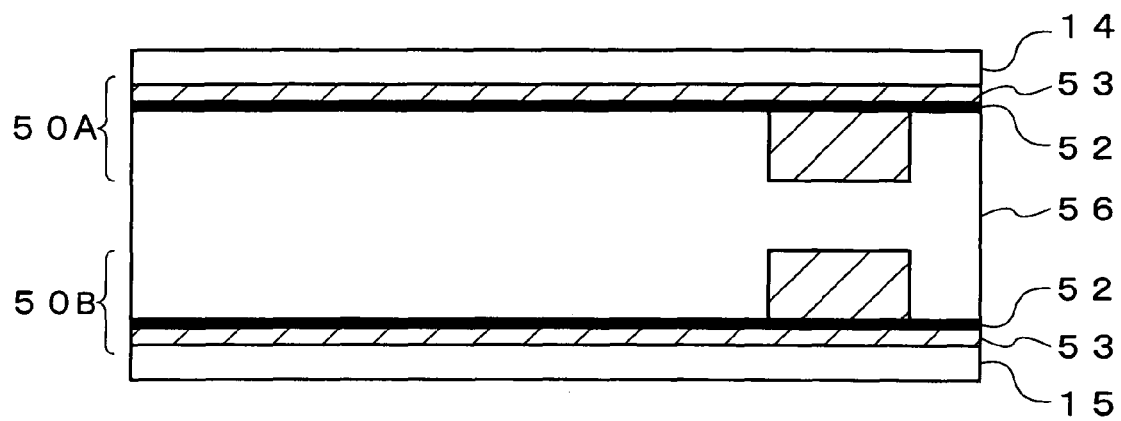
FIG. 84 is a schematic cross-sectional view showing a process (forming dry films) in the method of manufacturing the multilayer substrate according to the fourth embodiment of the present invention.
Figure 85:
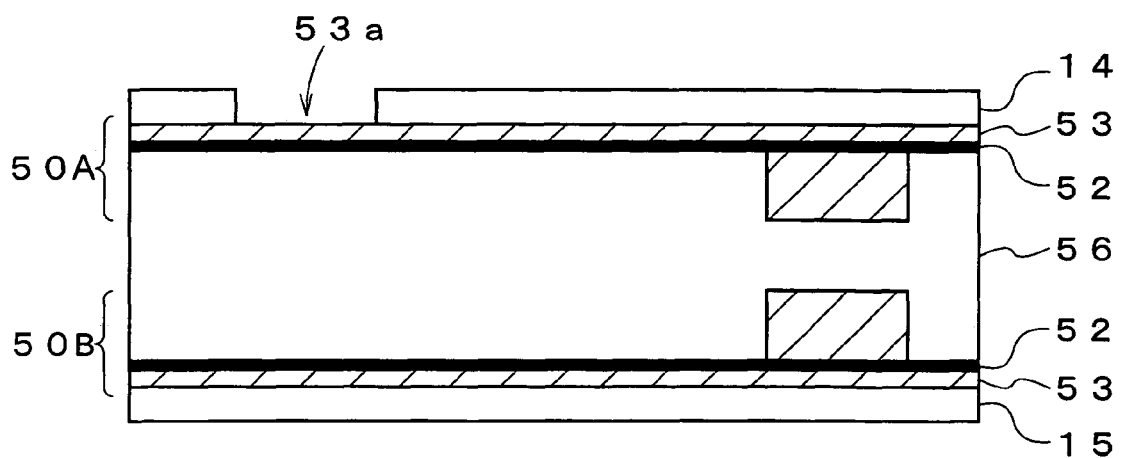
FIG. 85 is a schematic cross-sectional view showing a process (exposing and developing the dry films) in the method of manufacturing the multilayer substrate according to the fourth embodiment of the present invention.

Next, dry films 14 and 15 are respectively attached to both surfaces of the core substrate 56 provided with the clad materials 50A and SOB (FIG. 84). In this way, a surface of the third conductive layer 53 of the clad material 50A is covered with the dry film 14 and a surface of the third conductive layer 53 of the clad material 50B is covered with the dry film 15. Then, the dry film 14 is partially removed by exposure and development processes, and a portion 53a of the third conductive layer of the clad material 50A is exposed (FIG. 85).

Figure 86:
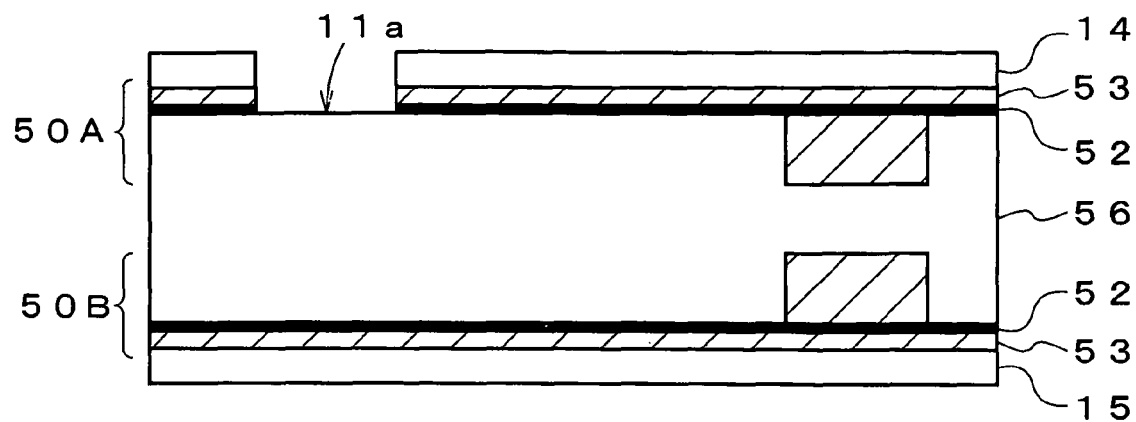
FIG. 86 is a schematic cross-sectional view showing a process (etching the clad material) in the method of manufacturing the multilayer substrate according to the fourth embodiment of the present invention.

Next, the clad material 50A is etched while using the dry film 14 as a mask. In this way, the core substrate 56 is partially exposed (FIG. 86). An exposed region 11a constitutes an open portion for a via hole. Here, the first conductive layer 51 of the clad material 50A has already been removed by the first etching process, and the third conductive layer 53 made of the etching material and the second conductive layer 52 made of the etch-stop material are left on the core substrate 56. The third conductive layer 53 and the second conductive layer 52 are completely removed by etching these layers with a strong etchant, and the surface of the core substrate 56 is thereby exposed. Here, it is preferable to select an appropriate etchant depending on the combination of the etching material and the etch-stop material as described below. Specifically, it is preferable to use: an acidic etchant (such as sulfuric acid) when the combination (the etching material/the etch-stop material) is (Cu/Al); an alkaline etchant in the case of (Al/Cu); any of a mixture of sulfuric acid and a hydrogen peroxide etchant, ammonium persulfate, and an alkaline etchant in the case of (Cu/Ni); a commercially available Ni remover in the case of (Ni/Cu); ferric chloride in the case of any of (Cu/Pd), (Cu/Ag), (SUS/Pd) and (SUS/Ag); and ferric nitrate in the case of any of (Ag/SUS) and (Cu/SUS).

Figure 87:
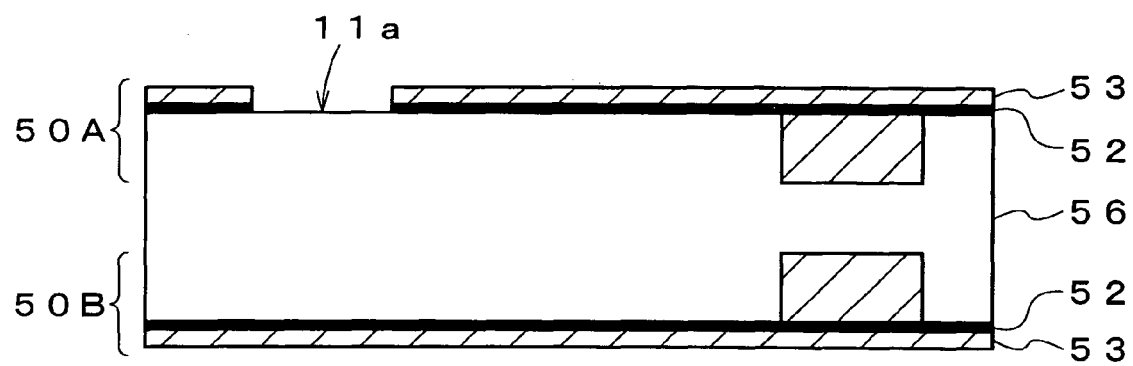
FIG. 87 is a schematic cross-sectional view showing a process (removing the dry films) in the method of manufacturing the multilayer substrate according to the fourth embodiment of the present invention.
Figure 88:
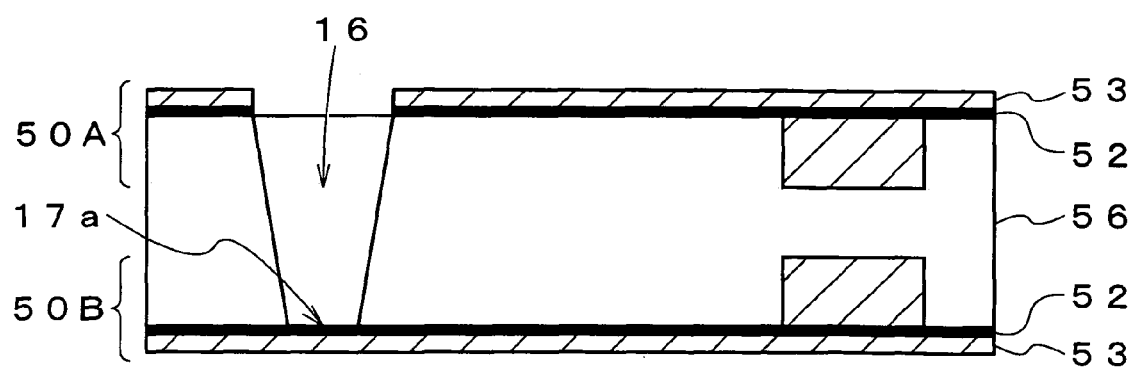
FIG. 88 is a schematic cross-sectional view showing a process (forming a via hole) in the method of manufacturing the multilayer substrate according to the fourth embodiment of the present invention.

Next, the dry films 14 and 15 are peeled off (FIG. 87). Then, a via hole 16 is formed at the portion 11a in the exposed region of the core substrate 56 by laser processing (FIG. 88). Although the via hole 16 penetrates the core substrate 56, the clad material 50B located on the opposite side of a laser incident face serves as a stopper in this case. Accordingly, the second conductive layer 52 of this clad material 50B constitutes a bottom 17a of the via hole 16. The diameter of the via hole 16 is not particularly limited but is preferably set in a range from about 30 to 200 μm.

Figure 89:
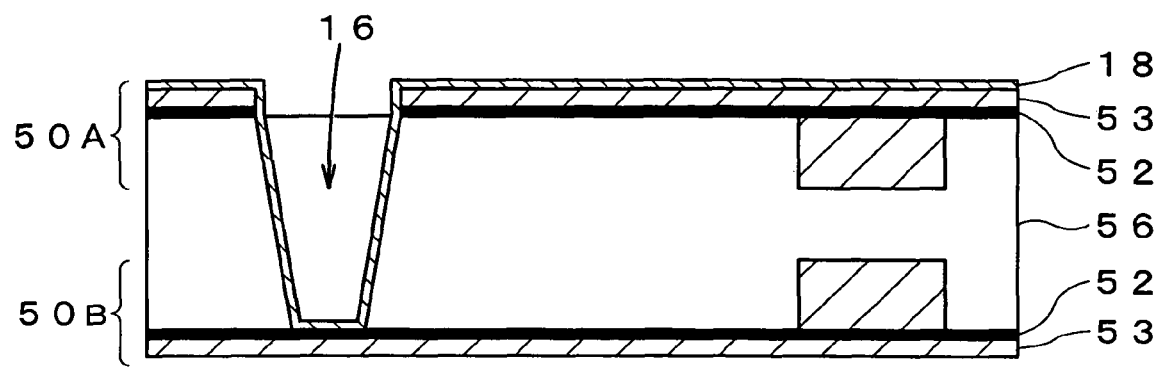
FIG. 89 is a schematic cross-sectional view showing a process (forming a base conductive layer) in the method of manufacturing the multilayer substrate according to the fourth embodiment of the present invention.

Next, a base conductive layer 18 is formed on substantially the entire exposed surface including an inner wall of the via hole 16 (FIG. 89). As the method of forming the base conductive layer 18, it is preferable to apply an electroless plating method, a sputtering method, a vapor deposition method, and the like. The base conductive layer 18 serves as a base for electrolytic plating to be performed later. Accordingly, the base conductive layer 18 is formed in a very small thickness, which may be selected appropriately from a range of several hundred angstroms to 3.0 μm.

Figure 90:
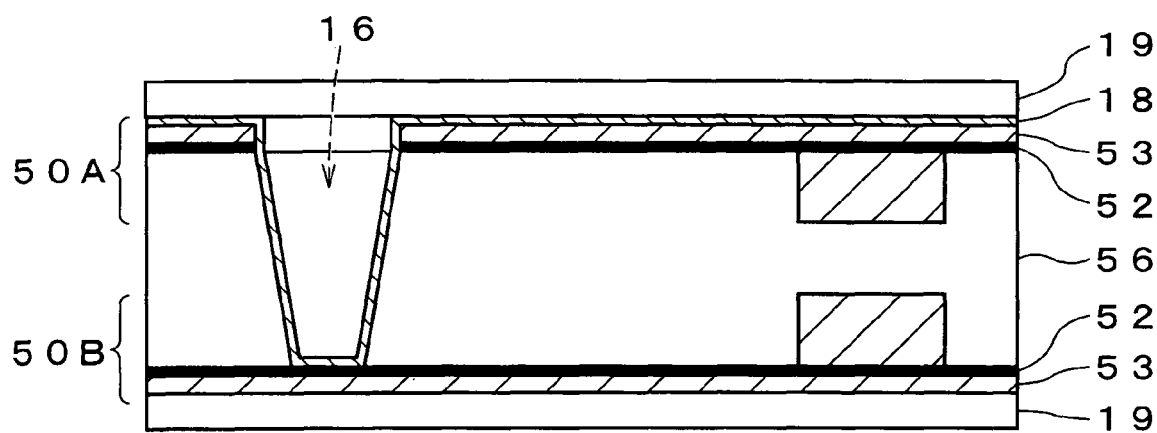
FIG. 90 is a schematic cross-sectional view showing a process (forming a dry film) in the method of manufacturing the multilayer substrate according to the fourth embodiment of the present invention.
Figure 91:
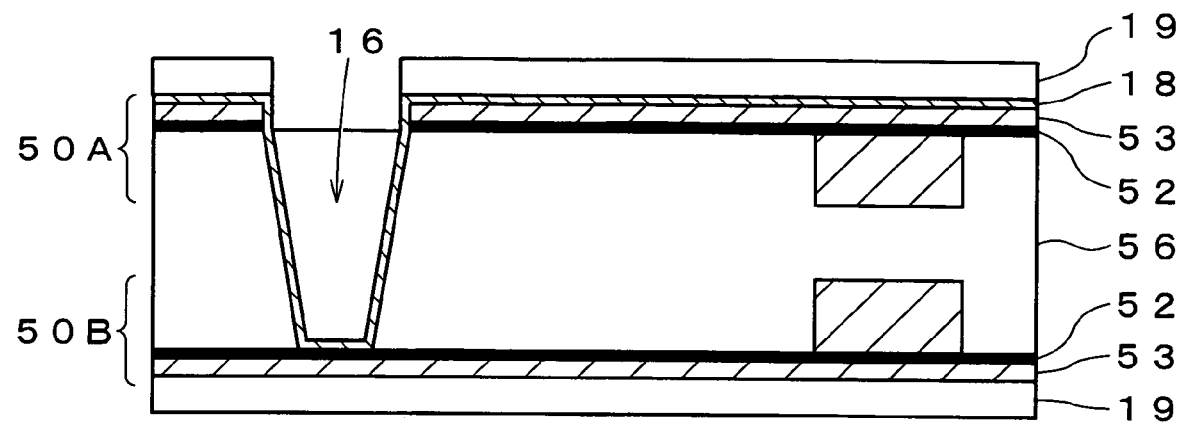
FIG. 91 is a schematic cross-sectional view showing a process (exposing and developing the dry film) in the method of manufacturing the multilayer substrate according to the fourth embodiment of the present invention.

Next, dry films 19 are attached to both surfaces of the core substrate 56 (FIG. 90). In this way, substantially the entire surface of the base conductive layer 18 is covered with the dry film 19, and a surface of the clad material 50B is also covered with the dry film 19B. Then, the dry film 19 located above the open portion for the via hole 16 is removed by exposing and developing the dry film 19 (FIG. 91). The remaining dry film 19 is used as a mask for the electrolytic plating to be performed later.

Figure 92:
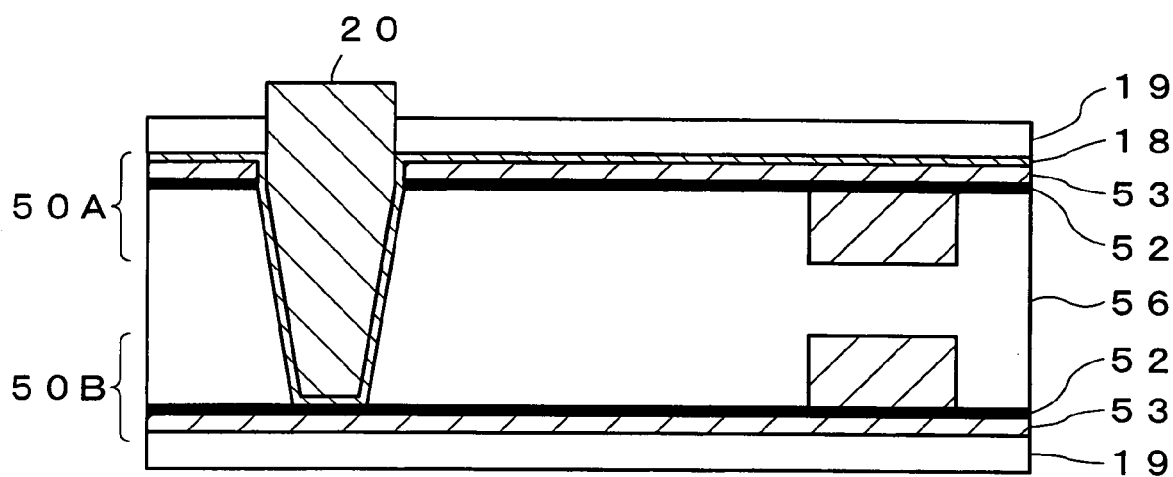
FIG. 92 is a schematic cross-sectional view showing a process (forming a conductive material) in the method of manufacturing the multilayer substrate according to the fourth embodiment of the present invention.
Figure 93:
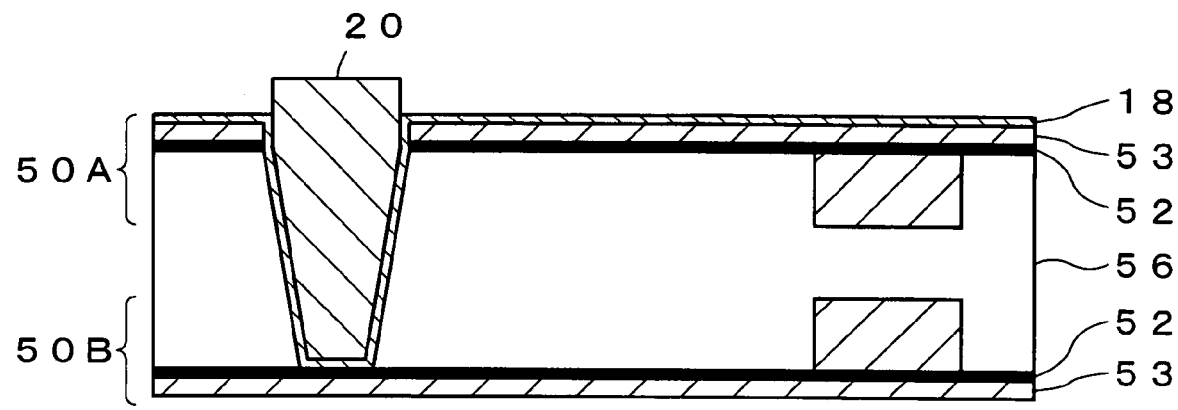
FIG. 93 is a schematic cross-sectional view showing a process (removing the dry film) in the method of manufacturing the multilayer substrate according to the fourth embodiment of the present invention.

Next, a conductive material 20 is deposited in the region not covered with the dry film 19 by electrolytic plating (FIG. 92). In other words, the conductive material 20 is selectively formed in the region not covered with the dry film 19, instead of the entire surface of the core substrate 56. In this way, a space inside the via hole 16 is almost completely filled with the conductive material 20. The electrolytic plating is preferably performed to fill the space inside the via hole 16 completely with the conductive material 20. The type of a plating solution may be appropriately selected. For example, when forming the conductive material 20 with copper (Cu), it is possible to use copper sulfate as the plating solution. If a void is left in the space inside the via hole 16, it is preferable to fill the space inside the via hole 16 with conductive resin. When a void is left, the plating solution and the like will remain inside the void and will lead to corrosion of the via hole. It is also possible to use insulative resin instead. However, it is preferable to use the conductive resin to ensure electrical connection of the layers above and below the via hole 16

Figure 94:
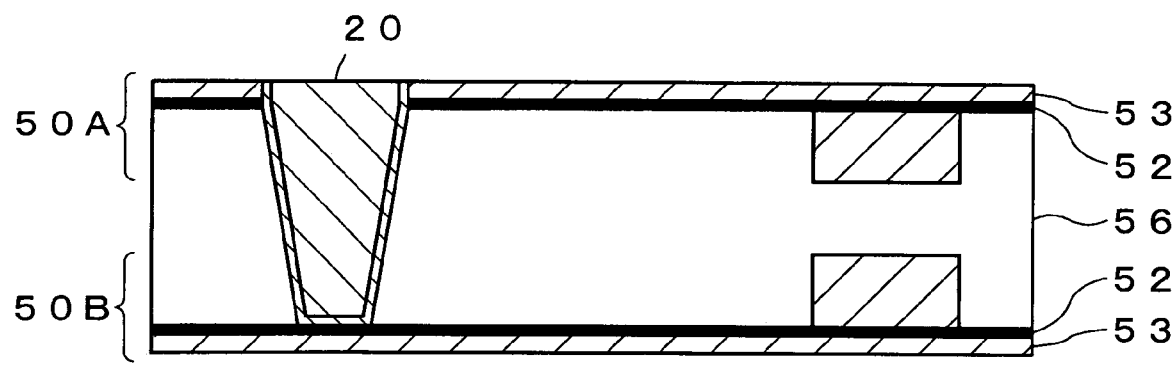
FIG. 94 is a schematic cross-sectional view showing a process (polishing the conductive material) in the method of manufacturing the multilayer substrate according to the fourth embodiment of the present invention.

Next, after peeling the dry films 19 off (FIG. 93) the conductive material 20 is polished parallel to the surface of the core substrate 56, thereby planarizing the entire surface (FIG. 94). At this time, it is possible to planarize the entire surface reliably by performing the polishing process so as to remove the base conductive layer 18 and further to polish a small amount of the surface of the third conductive layer 53. The polishing process may apply only one of a chemical polishing method and a mechanical polishing method using a buff. However, it is preferable to perform the both methods. Particularly, it is possible to ensure a very high degree of flatness by performing the chemical polishing method and then performing the mechanical polishing method using the buff.

If a large amount of the surface of the third conductive layer 53 is polished in this polishing process, a variation in the thickness of the third conductive layer 53 may be slightly increased. However, the conductive material 20 is not formed on the entire surface but is formed selectively. Therefore, even when the third conductive layer 53 is polished along with polishing the conductive material 20, an amount of the third conductive layer 53 to be polished off is very limited. For this reason, the increase in the variation in the thickness is also very limited. On the contrary, if the conductive material 20 is formed on the entire surface without using the dry film 19, it is necessary to polish a relatively a large amount (in the thickness of 20 μm, for example) of the conductive material 20 on the whole. Accordingly, the variation in the thickness of the third conductive layer 53 eventually becomes quite large. This is why the mask made of the dry film 19 is provided in the region not supposed to deposit the conductive material 20 in this embodiment. It is to be noted, however, that formation of the mask in the region not supposed to deposit the conductive material 20 is not always essential in the present invention.

Figure 95:
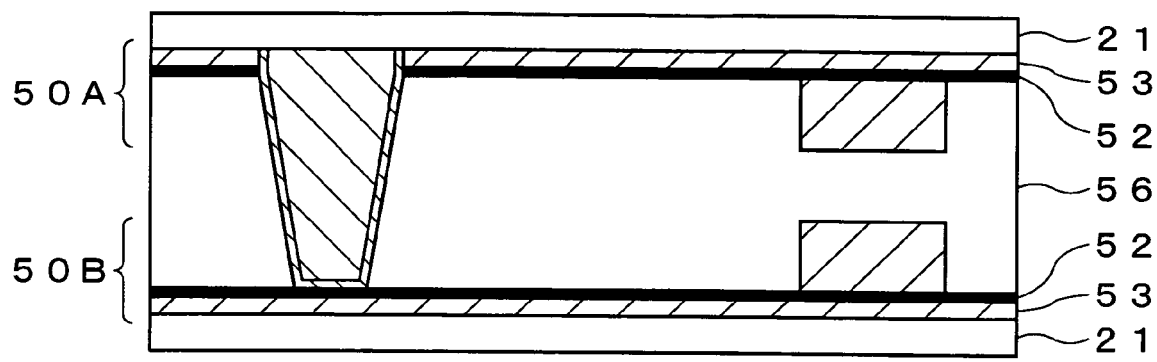
FIG. 95 is a schematic cross-sectional view showing a process (forming dry films) in the method of manufacturing the multilayer substrate according to the fourth embodiment of the present invention.
Figure 96:
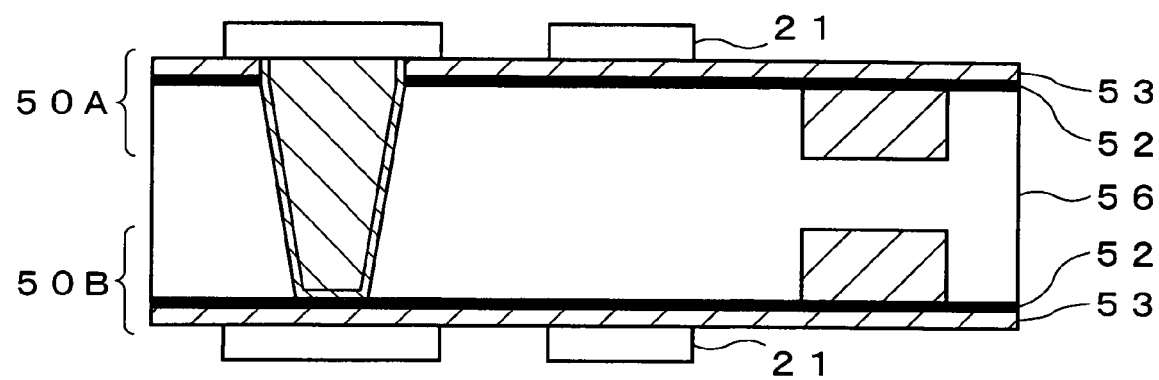
FIG. 96 is a schematic cross-sectional view showing a process (exposing and developing the dry films) in the method of manufacturing the multilayer substrate according to the fourth embodiment of the present invention.

Next, new dry films 21 are again attached to the both surfaces of the core substrate 56 (FIG. 95). In this way, the surface of the third conductive layer 53 of the clad material 50A and the surface of the third conductive layer 53 of the clad material SOB are respectively covered with the dry films 21. Then, the dry films 21 are patterned by performing exposing and developing processes. In this way, the second conductive layers 52 of the clad materials 50A and 50B are partially exposed (FIG. 96).

Figure 97:
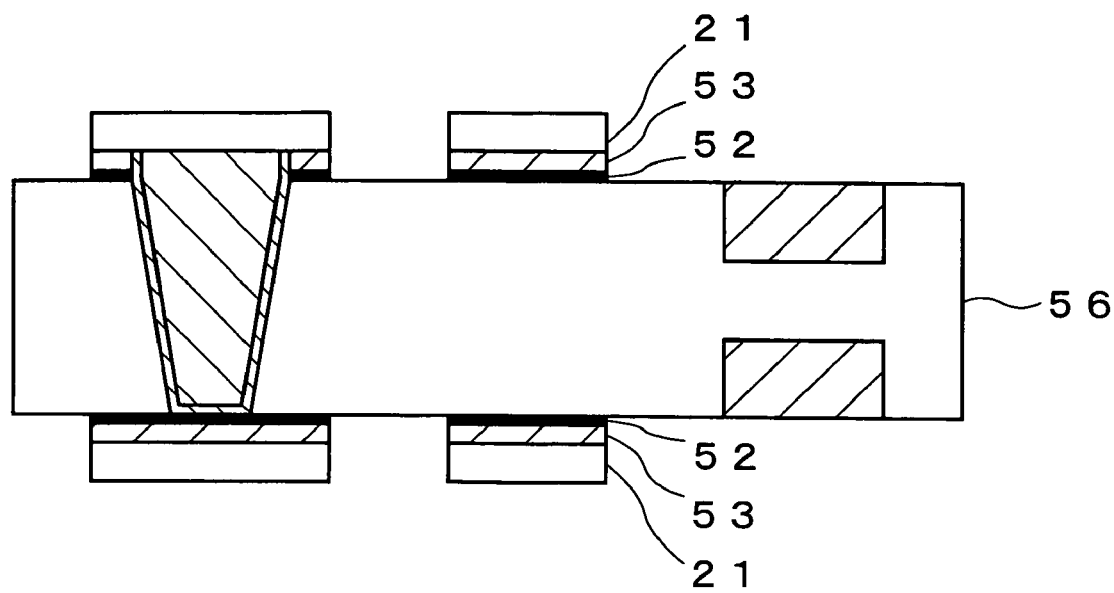
FIG. 97 is a schematic cross-sectional view showing a process (etching the conductive layers) in the method of manufacturing a multilayer substrate according to the fourth embodiment of the present invention.

Next, the third conductive layers 53 and the second conductive layers 52 of the clad materials 50A and 50B are etched while using the dry films 21A and 21B as masks (FIG. 97). In this way, the third conductive layers 53 and the second conductive layers 52 are patterned and formed into relatively thinner conductive patterns (first conductive patterns). Here, the first conductive layer 51 of the clad material 50A has already been removed by the first etching process, and the third conductive layers 53 made of the etching material and the second conductive layers 52 made of the etch-stop material are left on the core substrate 56. The third conductive layers 53 and the second conductive layers 52 are completely patterned by etching with a strong etchant. Here, it is possible to use the same etchant used in the second etching process.

Figure 98:
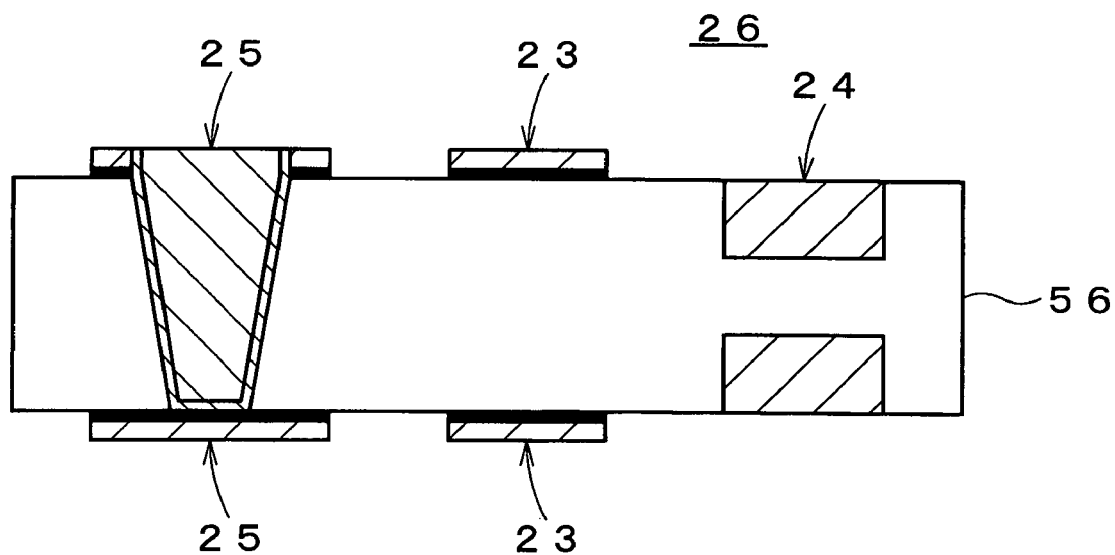
FIG. 98 is a schematic cross-sectional view showing a process (removing the dry films) in the method of manufacturing the multilayer substrate according to the fourth embodiment of the present invention.

Thereafter, the dry films 21 are peeled off to complete the series of processes on the core substrate 56. In this way, a processed core substrate 26 is finished to include the relatively thinner first conductive patterns 23, the relatively thicker second conductive patterns 24, and electrode patterns 25 on both ends of the via hole (FIG. 98).

As described above, according to this embodiment, it is possible to form patterns having mutually different thicknesses in the same layer. Therefore, an LC pattern for a high-frequency circuit that requires small variations in the width and the thickness of the pattern and a normal conductive pattern that requires impedance matching can be formed as first conductive patterns by patterning the conductive layers. Meanwhile, an L pattern for a choke coil that requires a high aspect ratio and a relatively large cross-sectional area (which has a low direct-current resistance) can be formed as the relatively thicker second conductive pattern. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a core substrate suitable for high-density packaging.

Meanwhile, according to this embodiment, it is possible to form the relatively thicker conductive pattern by patterning the clad material in advance, then to attach the relatively thicker pattern onto the core substrate, and then to form the relatively thinner conductive pattern by further patterning the clad material on the core substrate. In this way, it is possible to form all the conductive patterns by using only the subtractive method. As a result, it is only necessary to prepare process equipment designed for the subtractive method, and process equipment designed for the additive method is not required at all.

In addition, according to this embodiment, when the space inside the via hole is filled with the conductive material, the conductive material is selectively formed by forming the mask in the region not supposed to deposit the conductive material. In this way, it is possible to suppress the variation in the thickness of the insulating layer caused by polishing. As a consequence, it is possible to significantly improve pattern accuracy when the conductive pattern is formed by patterning the conductive layer in accordance with the subtractive method. Moreover, since a protruded portion of the selectively formed conductive material is mainly subjected to polishing, it is possible to reduce occurrence of warpage as compared to polishing the entire surface. In this way, it is possible to suppress a variation in the impedance in the case of forming a passive element such as an LC for a high-frequency circuit on a core substrate, for example. Specifically, in this embodiment, the variation in the film thickness of the third or second conductive layer subject to patterning is reduced to a very small amount. Accordingly, it is possible to perform patterning at high accuracy. Therefore, it is possible to regulate the width of the relatively thinner second conductive pattern into a desired width by performing high-accuracy patterning.

Next, the case of applying the method of manufacturing a multilayer substrate of this embodiment to a "build-up layer" will be described with reference to schematic cross-sectional views in FIG. 99 to FIG. 117.

The method of this embodiment is applicable to a build-up layer to be laminated on the processed core substrate 26 which is fabricated by the method described with reference to FIG. 77 to 98, or to a build-up layer to be laminated on a processed core substrate fabricated by any other methods. In any case, it is preferable to apply this method to a build-up layer to be laminated on any of the core substrates which is fabricated by the method of manufacturing a multilayer substrate of the present invention. In this way, the variation in the thickness is reduced in terms of the conductive pattern formed on the surface of the core substrate as well as the conductive pattern formed on the surface of the build-up layer. As a consequence, it is possible to improve the pattern accuracy on the whole. Now, the case of applying this embodiment to the build-up layer to be laminated on the processed core substrate 26 (see FIG. 98) will be described.

Figure 99:
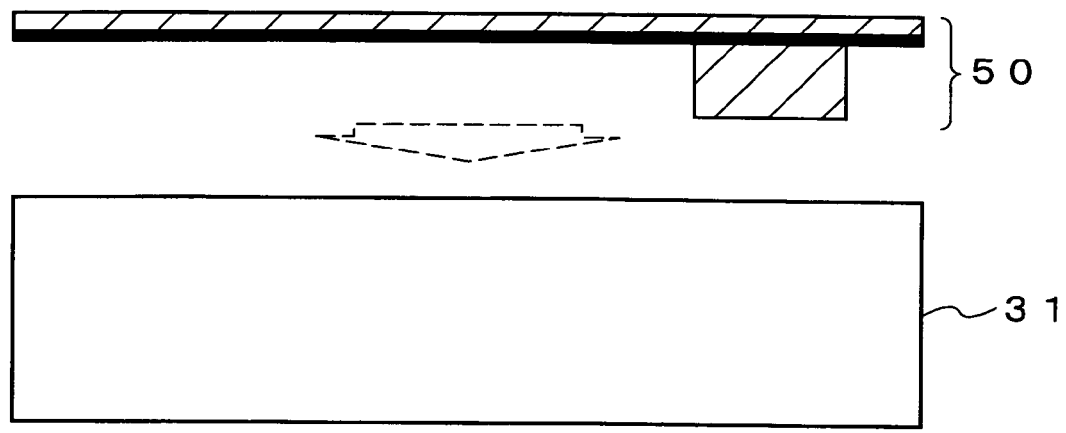
FIG. 99 is a schematic cross-sectional view showing a process (pressing a clad material) in the method of manufacturing the multilayer substrate according to the fourth embodiment of the present invention.
Figure 100:
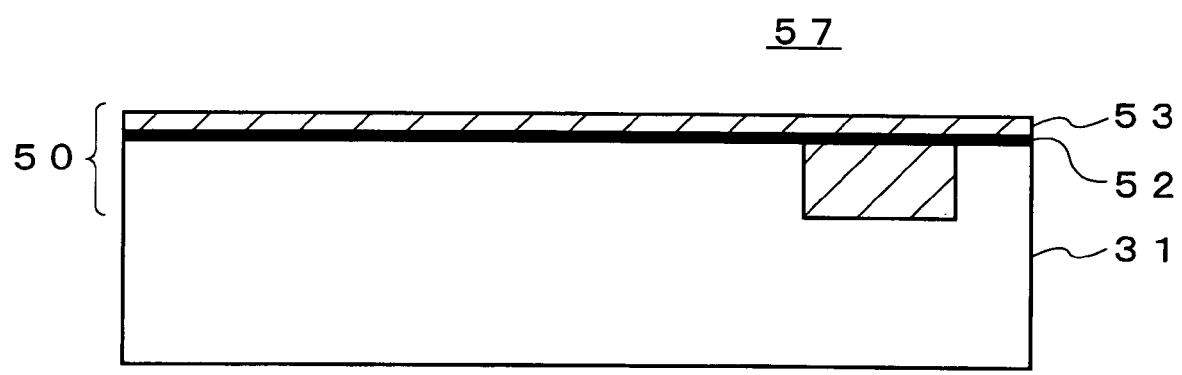
FIG. 100 is a schematic cross-sectional view showing a process (forming a resin-coated metal foil) in the method of manufacturing the multilayer substrate according to the fourth embodiment of the present invention.

First, the patterned clad material 50 fabricated by the processes described with reference to FIG. 77 to FIG. 81 is prepared, and this patterned clad material 50 is attached to a thermosetting resin sheet 31 made of B-stage epoxy resin or the like (FIG. 99). In this case, the pattern-etched surface of the clad material 50 is attached to the resin sheet 31. This thermosetting resin is hardened by pressing this laminated body. Accordingly, the clad material 50 is integrated with the resin sheet 31. In this way, a resin-coated metal foil 57 is finished (FIG. 100).

Figure 101:
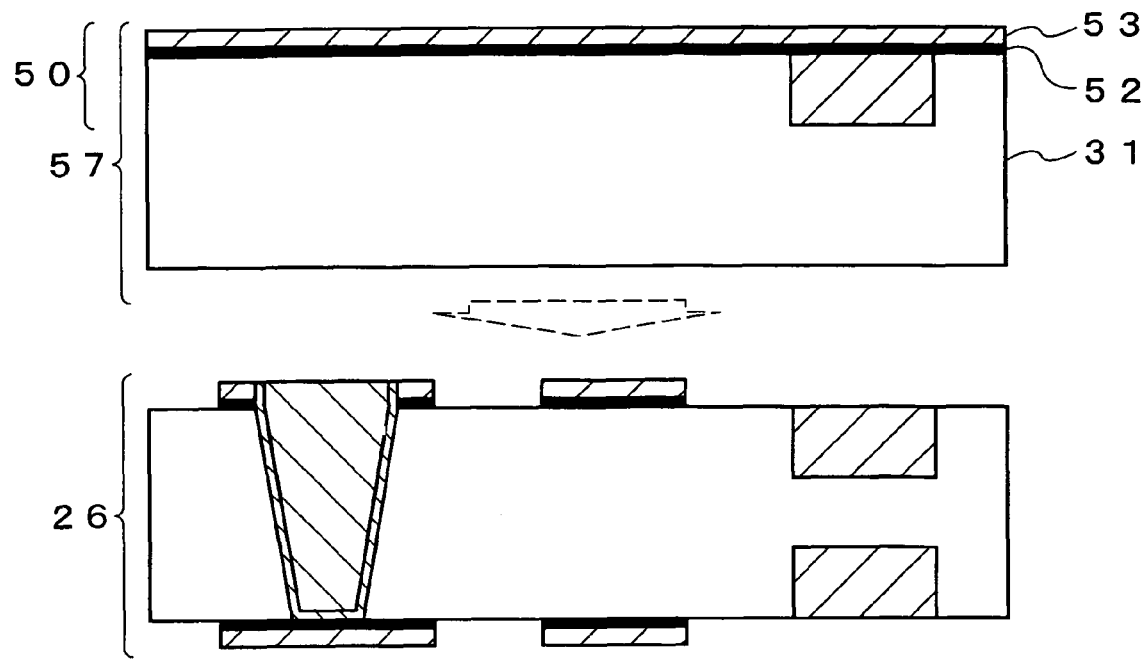
FIG. 101 is a schematic cross-sectional view showing a process (preparing a processed core substrate) in the method of manufacturing the multilayer substrate according to the fourth embodiment of the present invention.
Figure 102:
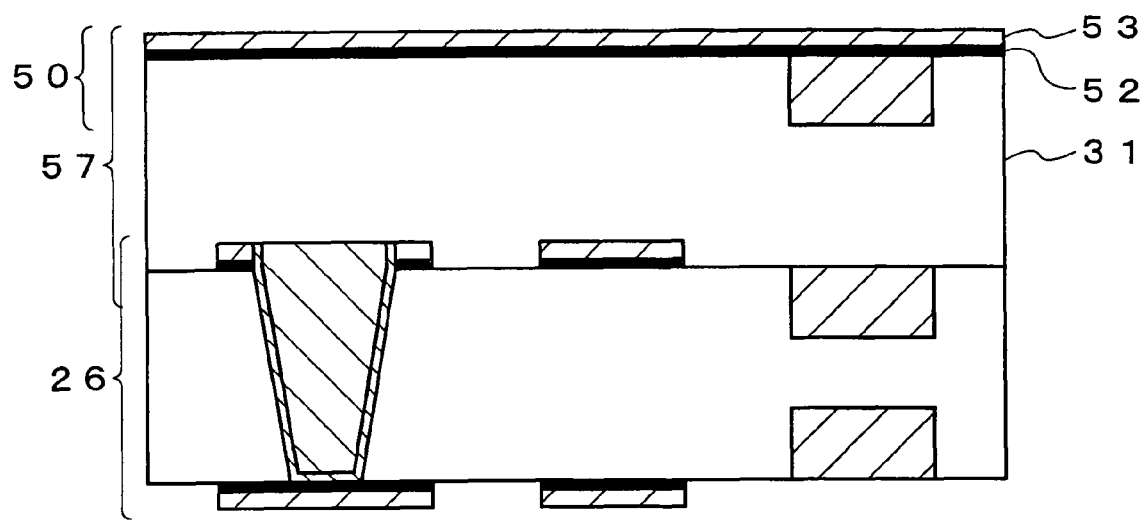
FIG. 102 is a schematic cross-sectional view showing a process (integrating the resin-coated metal foil) in the method of manufacturing the multilayer substrate according to the fourth embodiment of the present invention.

Next, the processed core substrate 26 is prepared, and the resin-coated metal foil 57 is laminated on the core substrate 26 (FIG. 101). In this case, the resin sheet 31 is attached to the core substrate 26. The thermosetting resin is hardened by subjecting this laminated body to hot pressing. Accordingly, the resin-coated metal foil 57 is integrated with the core substrate 26 (FIG. 102). In this way, a build-up layer (hereinafter referred to as the build-up layer 57) is formed on the core substrate 26. Here, the resin sheet 31 constitutes an insulating layer (hereinafter referred to as the insulating layer 31) of the build-up layer 57, and the first conductive layer 51, the second conductive layer 52, and the third conductive layer 53 of the clad material 50 constitute conductive layers on the build-up layer 57.

Figure 103:
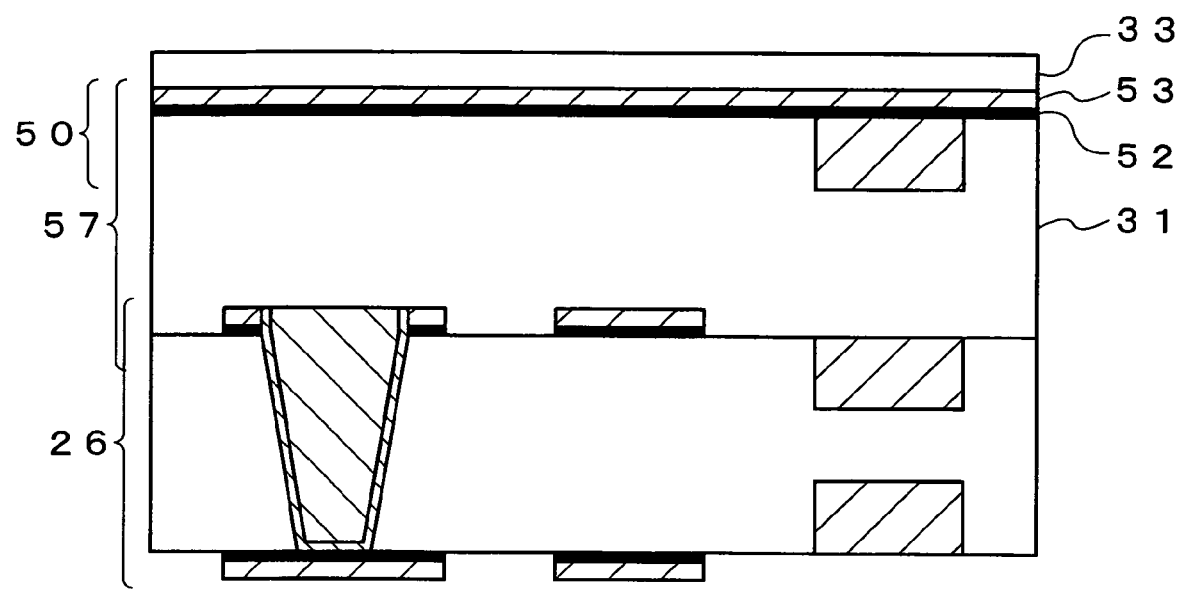
FIG. 103 is a schematic cross-sectional view showing a process (forming a dry film) in the method of manufacturing the multilayer substrate according to the fourth embodiment of the present invention.
Figure 104:
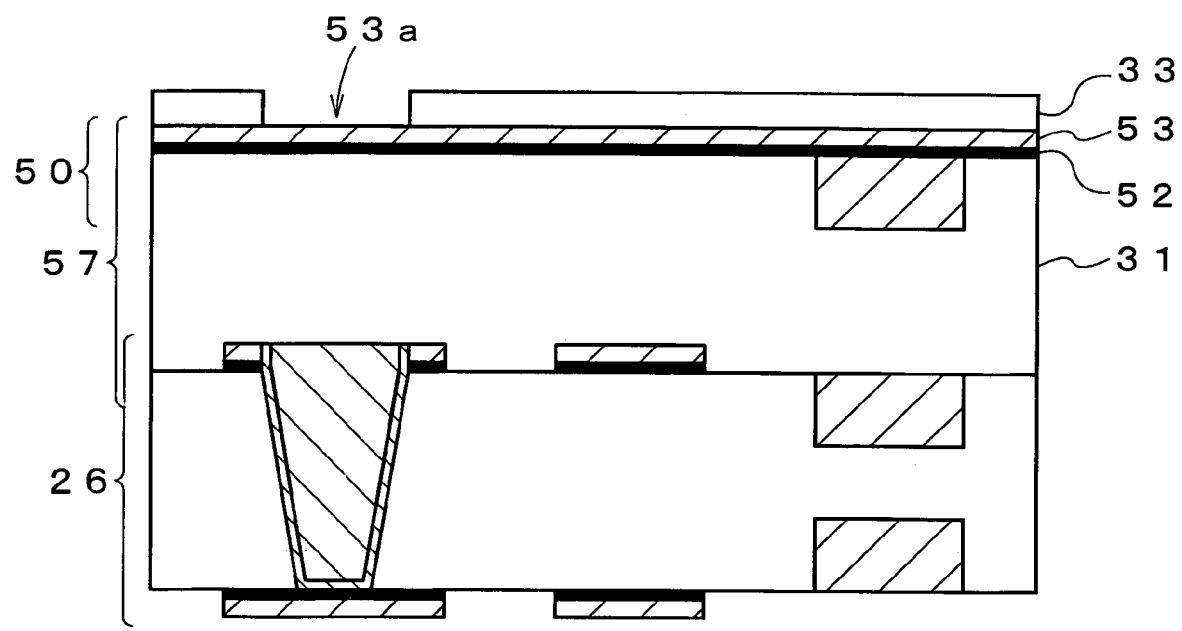
FIG. 104 is a schematic cross-sectional view showing a process (exposing and developing the dry film) in the method of manufacturing the multilayer substrate according to the fourth embodiment of the present invention.

Next, a dry film 33 is attached to the surface of the clad materials 50 formed on the insulating layer 31 (FIG. 103). In this way, a surface of the third conductive layer 53 of the clad material 50 is covered with the dry film 33. Then, the dry film 33 is partially removed by exposure and development processes, and a portion 53a of the third conductive layer of the clad material 50 is exposed (FIG. 104).

Figure 105:
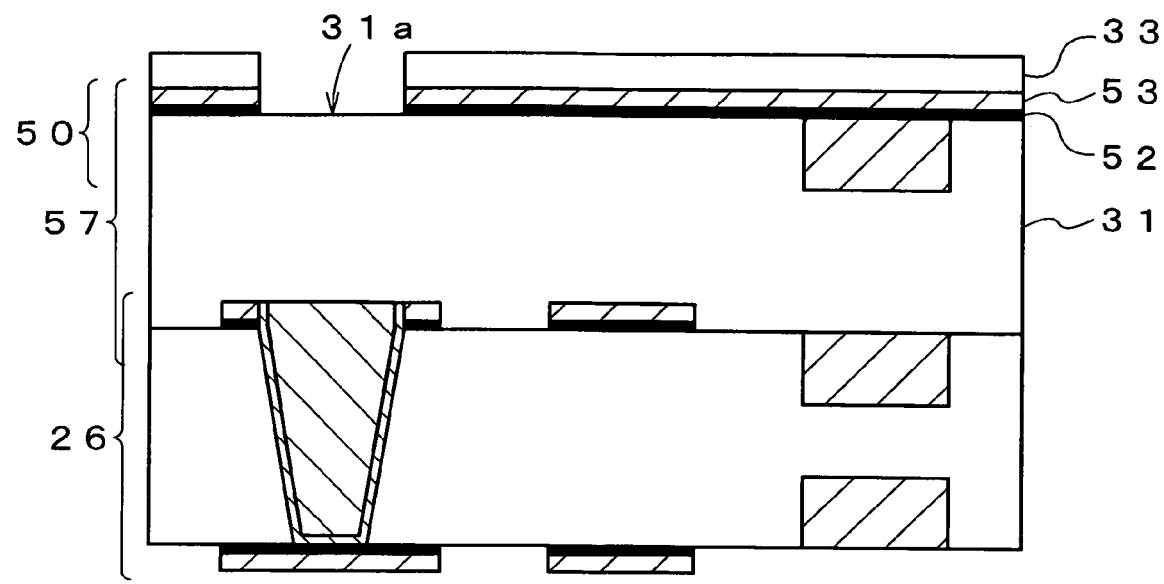
FIG. 105 is a schematic cross-sectional view showing a process (etching the clad material) in the method of manufacturing the multilayer substrate according to the fourth embodiment of the present invention.

Next, the clad material 50 is etched while using the dry film 33 as a mask. In this way, the insulating layer 31 is partially exposed (FIG. 105). An exposed region 31a constitutes an open portion for a via hole. Here, the first conductive layer 51 of the clad material 50 has already been removed by the first etching process, and the third conductive layer 53 made of the etching material and the second conductive layer 52 made of the etch-stop material are left on the insulating layer 31. The third conductive layer 53 and the second conductive layer 52 are completely removed by etching these layers with a strong etchant, and the surface of the insulating layer 31 is thereby exposed. Here, it is preferable to select an appropriate etchant depending on the combination of the etching material and the etch-stop material as described below. Specifically, it is preferable to use: an acidic etchant (such as sulfuric acid) when the combination (the etching material/the etch-stop material) is (Cu/Al); an alkaline etchant in the case of (Al/Cu); any of a mixture of sulfuric acid and a hydrogen peroxide etchant, ammonium persulfate, and an alkaline etchant in the case of (Cu/Ni); a commercially available Ni remover in the case of (Ni/Cu); ferric chloride in the case of any of (Cu/Pd), (Cu/Ag), (SUS/Pd) and (SUS/Ag); and ferric nitrate in the case of any of (Ag/SUS) and (Cu/SUS).

Figure 106:
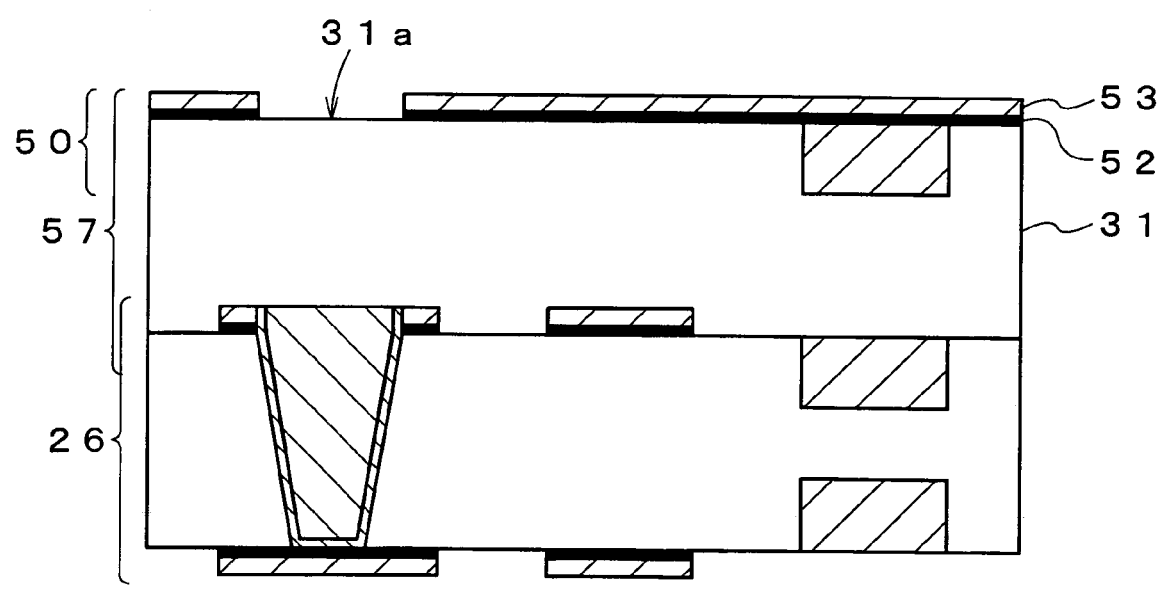
FIG. 106 is a schematic cross-sectional view showing a process ((removing the dry film) in the method of manufacturing the multilayer substrate according to the fourth embodiment of the present invention.
Figure 107:
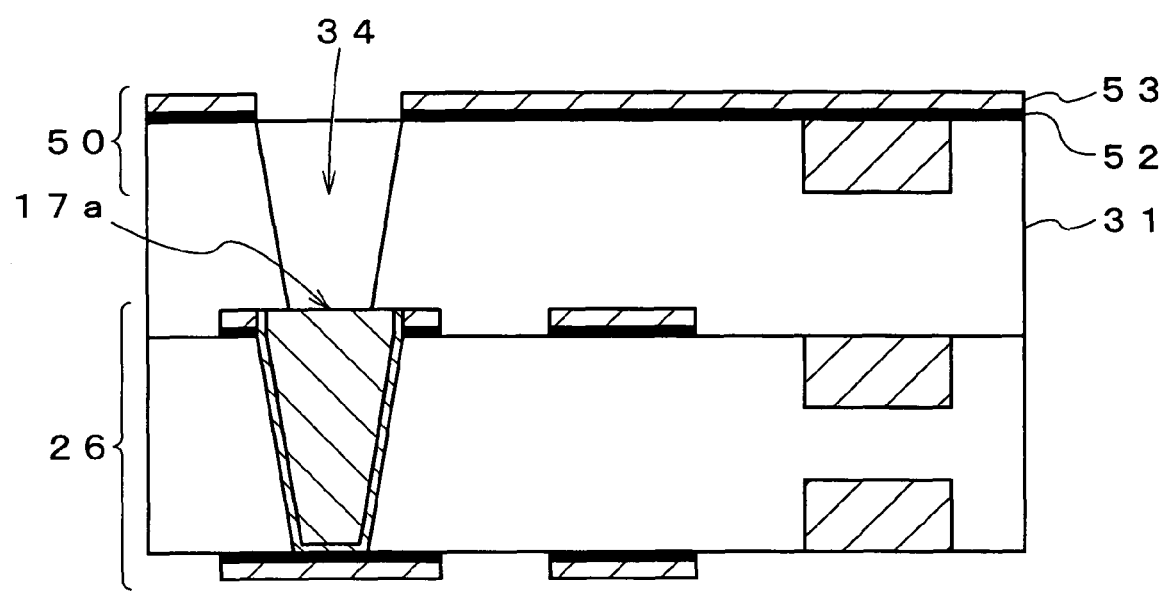
FIG. 107 is a schematic cross-sectional view showing a process (forming a via hole) in the method of manufacturing the multilayer substrate according to the fourth embodiment of the present invention.

Next, the dry film 33 is peeled off (FIG. 106). Then, a via hole 34 is formed at an exposed portion 31a of the insulating layer 31 by laser processing (FIG. 107). Although the via hole 34 penetrates the insulating layer 31, the electrode pattern (the electrode pattern on the via hole of the core substrate 26) located on the opposite side of a laser incident face serves as a stopper in this case. Accordingly, this electrode pattern constitutes a bottom 17a of the via hole 34. The diameter of the via hole 34 is not particularly limited but is preferably set in a range from about 30 to 200 μm.

Figure 108:
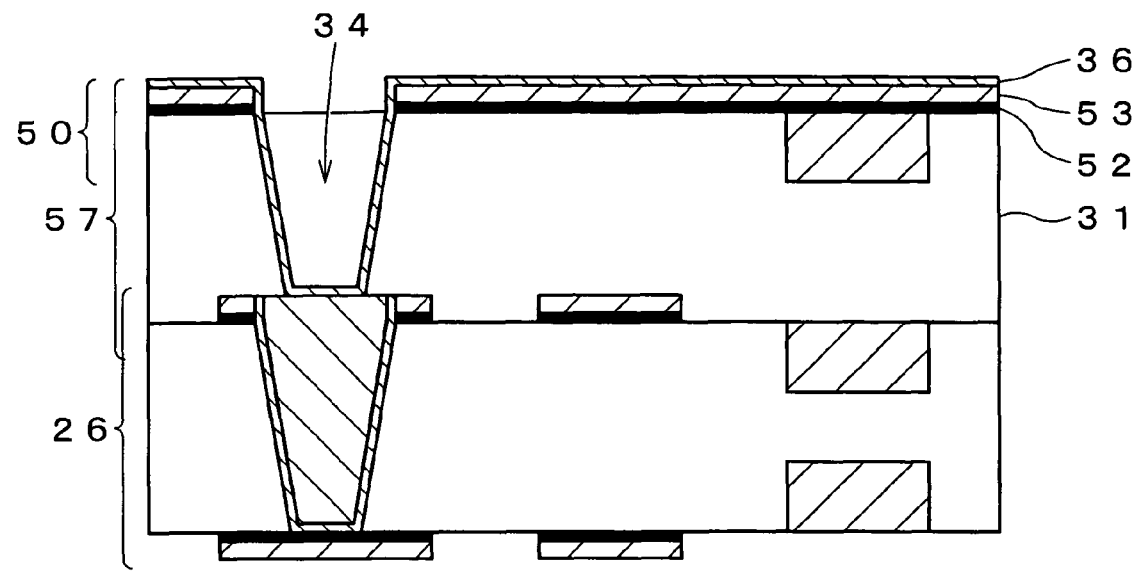
FIG. 108 is a schematic cross-sectional view showing a process (forming a base conductive layer) in the method of manufacturing the multilayer substrate according to the fourth embodiment of the present invention.

Next, a base conductive layer 36 is formed on substantially the entire exposed surface including an inner wall of the via hole 34 (FIG. 108). As the method of forming the base conductive layer 36, it is preferable to apply an electroless plating method, a sputtering method, a vapor deposition method, and the like. The base conductive layer 36 serves as a base for electrolytic plating to be performed later. Accordingly, the base conductive layer 36 is formed in a very small thickness, which may be selected appropriately from a range of several hundred angstroms to 3.0 μm.

Figure 109:
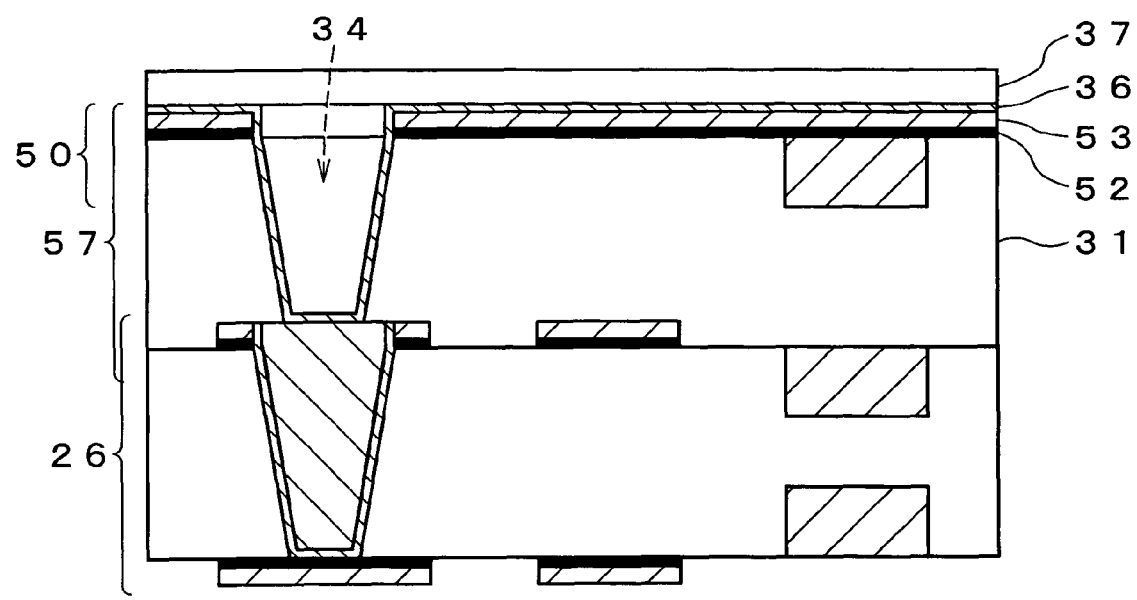
FIG. 109 is a schematic cross-sectional view showing a process (forming a dry film) in the method of manufacturing the multilayer substrate according to the fourth embodiment of the present invention.
Figure 110:
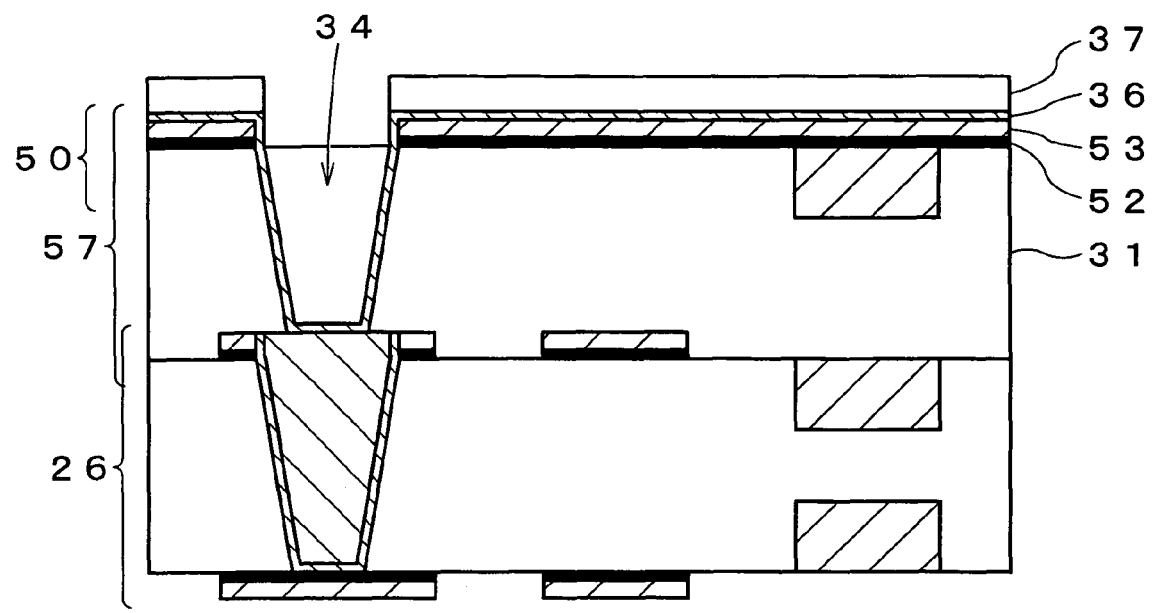
FIG. 110 is a schematic cross-sectional view showing a process (exposing and developing the dry film) in the method of manufacturing the multilayer substrate according to the fourth embodiment of the present invention.

Next, a dry film 37 is attached to a surface of the build-up layer 57 (FIG. 109). In this way, substantially the entire surface of the base conductive layer 36 is covered with the dry film 37. Then, the dry film 37 located above the open portion for the via hole 34 is removed by exposing and developing the dry film 37 (FIG. 110). The remaining dry film 37 is used as a mask for the electrolytic plating to be performed later.

Figure 111:
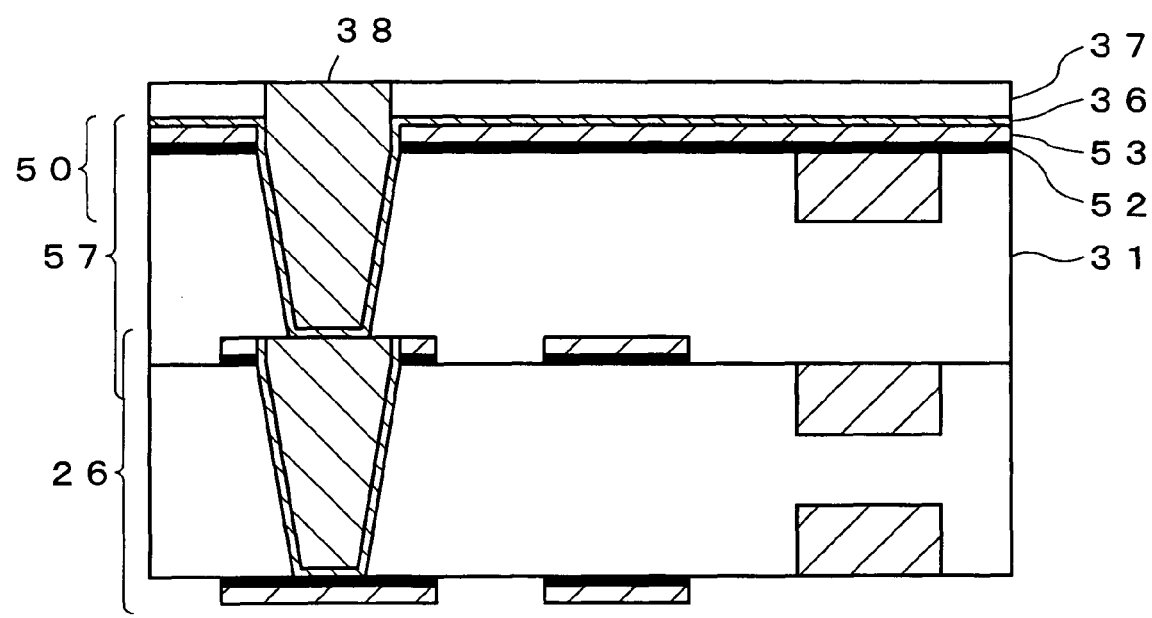
FIG. 111 is a schematic cross-sectional view showing a process (forming a conductive material) in the method of manufacturing the multilayer substrate according to the fourth embodiment of the present invention.
Figure 112:
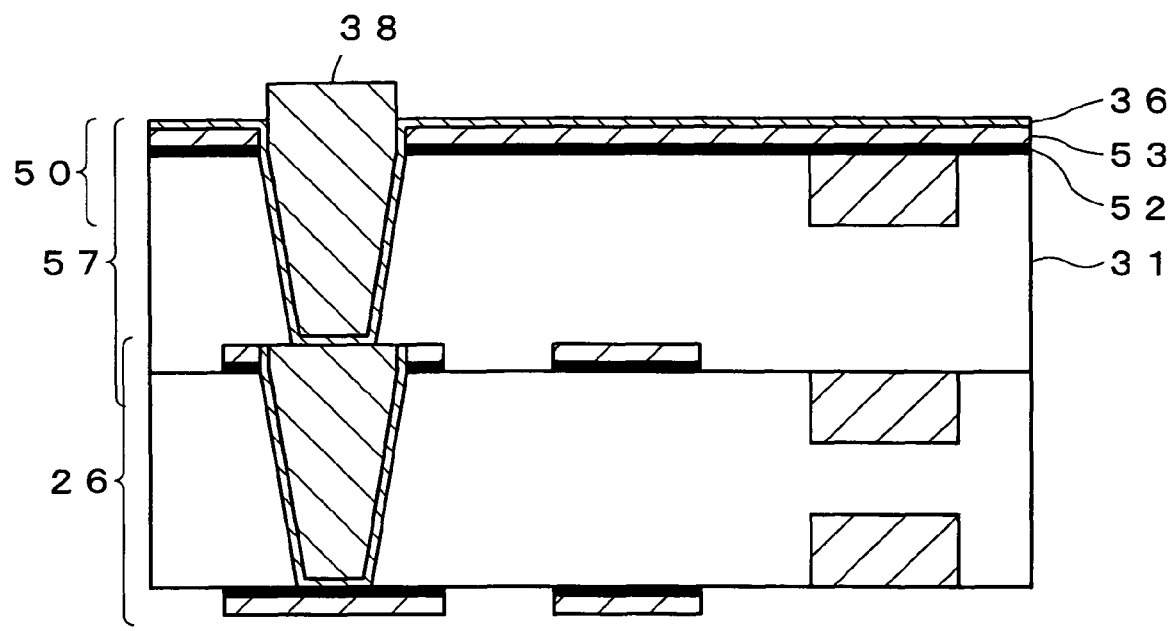
FIG. 112 is a schematic cross-sectional view showing a process (removing the dry film) in the method of manufacturing the multilayer substrate according to the fourth embodiment of the present invention.

Next, a conductive material 38 is deposited in the region not covered with the dry film 37 by electrolytic plating (FIG. 111). In other words, the conductive material 38 is selectively formed in the region not covered with the dry film 37, instead of the entire surface of the build-up layer 57. In this way, a space inside the via hole 34 is almost completely filled with the conductive material 38. It is preferable to perform the electrolytic plating so that the space inside the via hole 34 is filled completely with the conductive material 38. The type of a plating solution may be appropriately selected. For example, when forming the conductive material 38 with copper (Cu), it is possible to use copper sulfate as the plating solution. If a void is left in the space inside the via hole 34, it is preferable to fill the space inside the via hole 34 with conductive resin. When a void is left, the plating solution and the like will remain inside the void and will lead to corrosion of the via hole 34. It is also possible to use insulative resin instead. However, it is preferable to use the conductive resin to ensure electrical connection of the layers above and below the via hole 34

Figure 113:
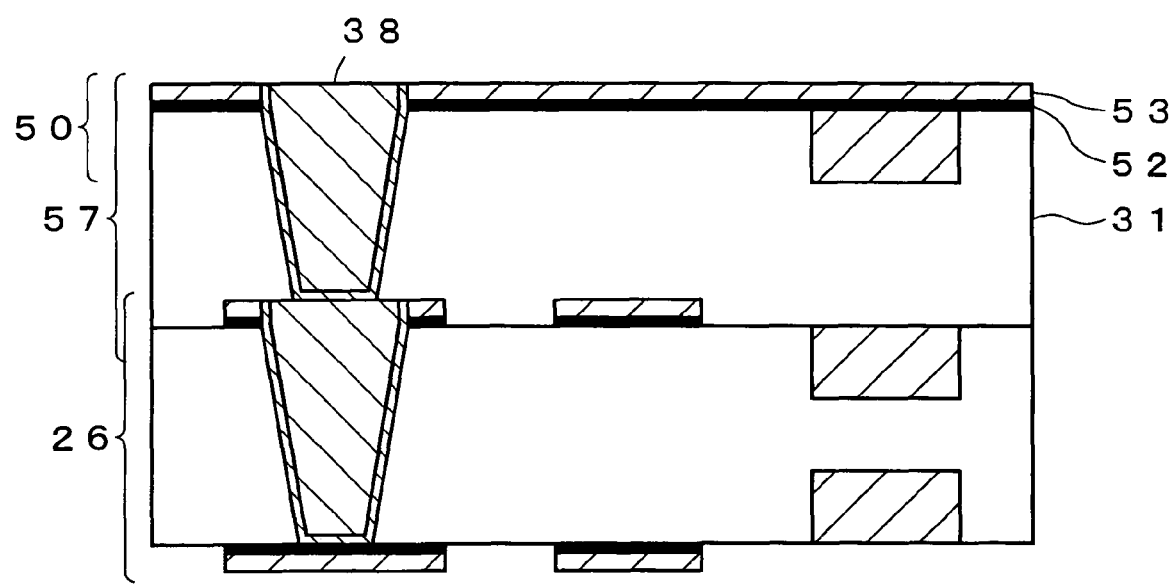
FIG. 113 is a schematic cross-sectional view showing a process (polishing the conductive material) in the method of manufacturing the multilayer substrate according to the fourth embodiment of the present invention.

Next, after peeling the dry films 37 off (FIG. 112) the conductive material 38 is polished parallel to the surface of the build-up layer 57, thereby planarizing the entire surface (FIG. 113). At this time, it is possible to planarize the entire surface reliably by performing the polishing process so as to remove the base conductive layer 36 and further to polish a small amount of the surface of the third conductive layer 53. The polishing process may apply only one of a chemical polishing method and a mechanical polishing method using a buff. However, it is preferable to perform the both methods.

Particularly, it is possible to ensure a very high degree of flatness by performing the chemical polishing method and then performing the mechanical polishing method using the buff.

If a large amount of the surface of the third conductive layer 53 is polished in this polishing process, a variation in the thickness of the third conductive layer 53 may be slightly increased. However, the conductive material 38 is not formed on the entire surface but is formed selectively. Therefore, even when the third conductive layer 53 is polished along with polishing the conductive material 38, an amount of the third conductive layer 53 to be polished off is very limited. For this reason, the increase in the variation in the thickness is also very limited. On the contrary, if the conductive material 38 is formed on the entire surface without using the dry film 37, it is necessary to polish a relatively a large amount (in the thickness of 20 μm, for example) of the conductive material 38 on the whole. Accordingly, the variation in the thickness of the third conductive layer 53 eventually becomes quite large. This is why this embodiment provides the mask made of the dry film 37 in the region not supposed to deposit the conductive material 38. It is to be noted, however, that formation of the mask in the region not supposed to deposit the conductive material 38 is not always essential in the present invention.

Figure 114:
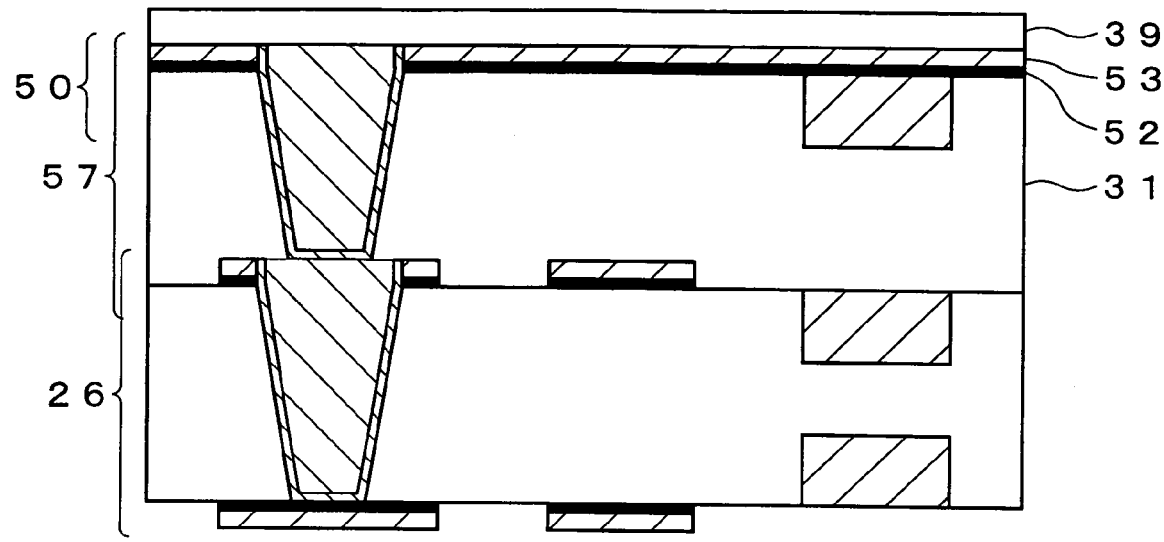
FIG. 114 is a schematic cross-sectional view showing a process (forming dry film) in the method of manufacturing the multilayer substrate according to the fourth embodiment of the present invention.
Figure 115:
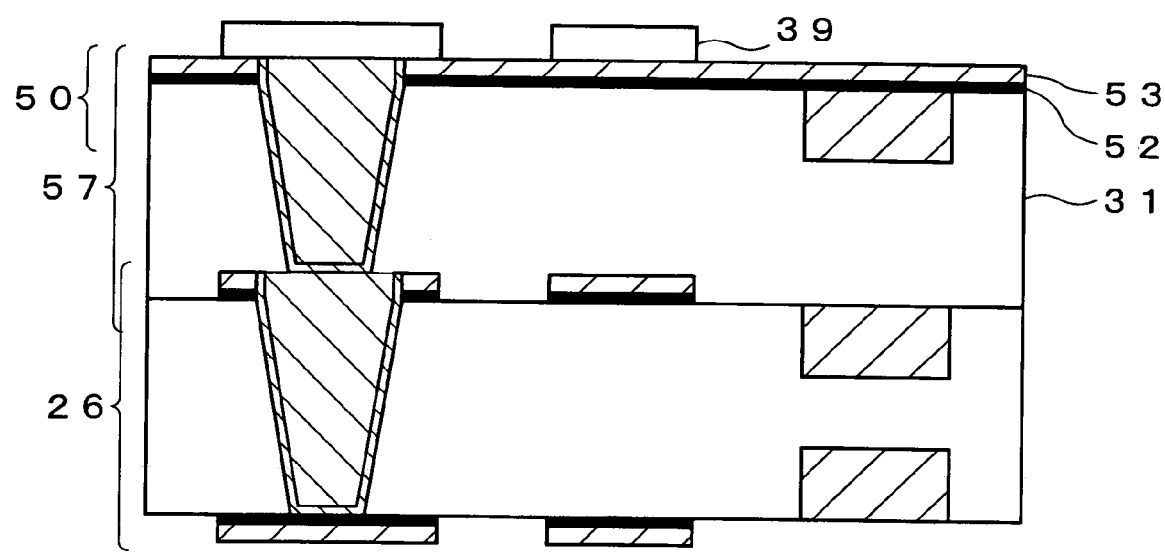
FIG. 115 is a schematic cross-sectional view showing a process (exposing and developing the dry film) in the method of manufacturing the multilayer substrate according to the fourth embodiment of the present invention.

Next, a new dry film 39 is again attached to the surface of the build-up layer 57 (FIG. 114). In this way, the surface of the third conductive layer 53 of the clad material 50 is covered with the dry film 39. Then, the dry film 39 is patterned by performing exposing and developing processes. In this way, the third conductive layer 53 of the clad material 50 is partially exposed (FIG. 115).

Figure 116:
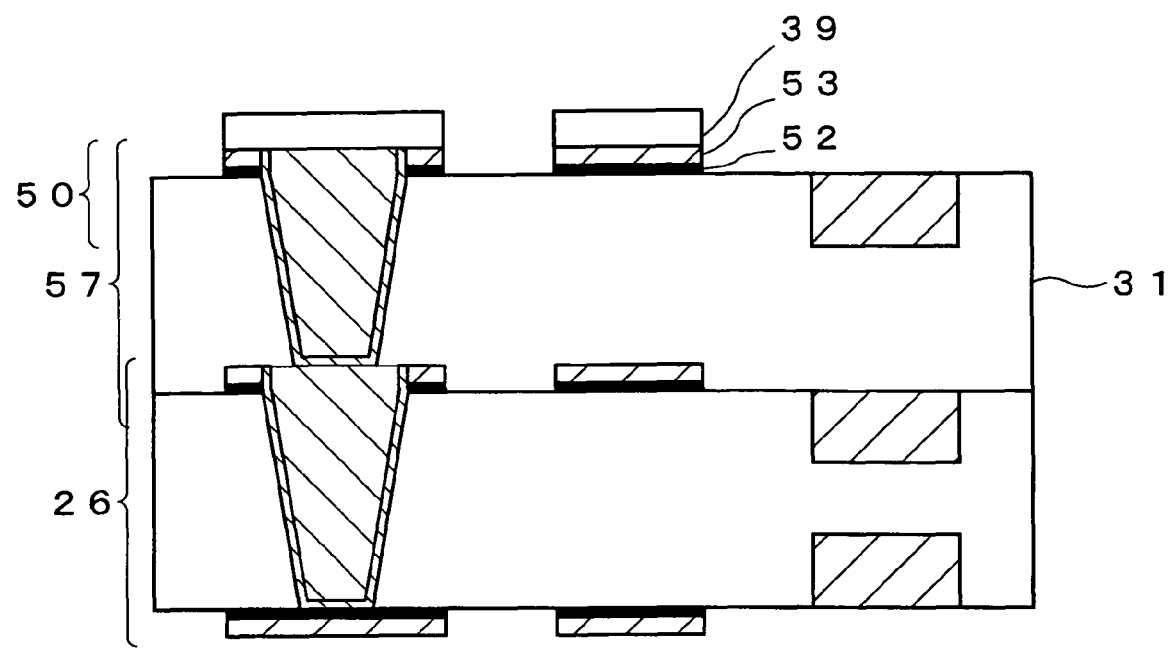
FIG. 116 is a schematic cross-sectional view showing a process (etching the conductive layer) in the method of manufacturing the multilayer substrate according to the fourth embodiment of the present invention.

Next, the third conductive layer 53 and the second conductive layer 52 of the clad material 50 are etched while using the dry film 39 as a mask (FIG. 116). In this way, the third conductive layer 53 and the second conductive layer 52 are patterned and formed into a relatively thinner conductive pattern (a first conductive pattern). Here, the first conductive layer 51 of the clad material 50 has already been removed by the first etching process, and the third conductive layer 53 made of the etching material and the second conductive layer 52 made of the etch-stop material are left on the build-up layer 57. The third conductive pattern 53 and the second conductive pattern 52 are completely patterned by etching with a strong etchant. Here, it is possible to use the same etchant used in the second etching process.

Figure 117:
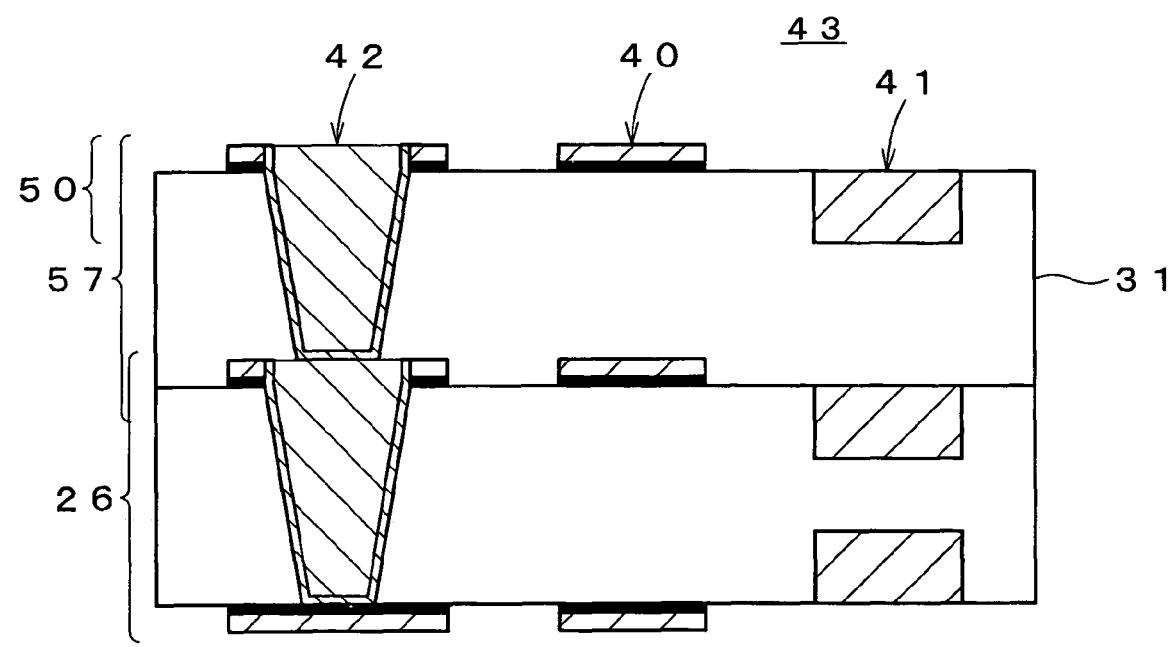
FIG. 117 is a schematic cross-sectional view showing a process (removing the dry film) in the method of manufacturing the multilayer substrate according to the fourth embodiment of the present invention.

Thereafter, the dry film 39 is peeled off to complete the series of processes on the build-up layer 57. In this way, a processed core substrate 43 is finished to include a relatively thinner first conductive pattern 40, a relatively thicker second conductive pattern 41, and electrode patterns 42 on the via hole electrode (FIG. 117).

As described above, according to this embodiment, it is possible to form patterns having mutually different thicknesses in the same layer. Therefore, an LC pattern for a high-frequency circuit that requires small variations in the width and the thickness of the pattern and a normal conductive pattern that requires impedance matching can be formed as the relatively thinner first conductive pattern by patterning the conductive layers. Meanwhile, an L pattern for a choke coil that requires a high aspect ratio and a relatively large cross-sectional area (which has a low direct-current resistance) can be formed as the relatively thicker second conductive pattern. Moreover, these two types of conductive patterns can be formed in the same layer. Accordingly, it is possible to arbitrarily select optimal pattern shapes and variations in the width and thickness required in various elements. In other words, it is possible to provide high design freedom and thereby to fabricate a core substrate suitable for high-density packaging.

Meanwhile, according to this embodiment, it is possible to form the relatively thicker conductive pattern by patterning the clad material in advance, then to attach the relatively thicker first pattern onto the thermosetting resin sheet constituting the build-up layer, and then to form the relatively thinner second conductive pattern by further patterning the clad material on the build-up layer. In this way, it is possible to form all the conductive patterns by using only the subtractive method. As a result, it is only necessary to prepare process equipment designed for the subtractive method, and process equipment designed for the additive method is not required at all.

In addition, according to this embodiment, when the space inside the via hole is filled with the conductive material, the conductive material is selectively formed by forming the mask in the region not supposed to deposit the conductive material. In this way, it is possible to suppress the variation in the thickness of the insulating layer caused by polishing. As a consequence, it is possible to significantly improve pattern accuracy when the conductive pattern is formed by patterning the conductive layer in accordance with the subtractive method. Moreover, since a protruded portion of the selectively formed conductive material is mainly subjected to polishing, it is possible to reduce occurrence of warpage as compared to polishing the entire surface. In this way, it is possible to suppress a variation in the impedance in the case of forming a passive element such as an LC for a high-frequency circuit on a core substrate, for example. Specifically, in this embodiment, the variation in the film thickness of the third or second conductive layer subject to patterning is reduced to a very small amount. Accordingly, it is possible to perform patterning at high accuracy. Therefore, it is possible to regulate the width of the relatively thinner second conductive pattern into a desired width by performing high-accuracy patterning.

In the fourth embodiment, the clad materials 50A and 50B are attached to the both surfaces of the core substrate 56, whereby the first and second conductive patterns are respectively formed on the both surfaces of the core substrate 56. However, it is also possible to form these conductive patterns only on one of the surfaces. In this case, the core substrate used herein includes a metal foil attached on one surface and a clad material attached on the other surface without any metal foil. This metal foil serves as a stop layer at the time of laser processing, constitutes the bottom 17a at the time of electrolytic plating, and is then patterned and formed into the relatively thin conductive pattern. It is preferable to use a copper foil as the metal foil, and the thickness (t1) thereof is set preferably in a range from about 1 to 18 μm. When forming the conductive layers 52 and 53 by using a copper foil, it is possible to minimize a variation in the thickness either by use of an electrolytic copper foil (a copper foil formed by electrodepositing copper ions dissolved in a copper sulfate aqueous solution continuously onto an electrodeposited roll) generally applied to printed circuit boards, or by use of a rolled copper foil. Alternatively, it is possible to regulate the thickness of the copper foil by the SUEP or any other methods as appropriate.

Moreover, in the fourth embodiment, the relatively thicker conductive pattern is formed in the beginning by patterning one of the surfaces of the clad material. Then, this clad material is attached onto the core substrate or the build-up layer. Thereafter, the relatively thinner wiring layer is formed by patterning the other surface of this clad material. On the contrary, it is also possible to form the relatively thinner conductive pattern in the beginning, and to form the relatively thicker pattern thereafter. In this case, the third conductive layer of the clad material needs to be thinner than the first conductive layer to be patterned in the beginning.

It is to be understood that the present invention shall not be limited only to the above-described embodiments. It is obvious to those skilled in the art that various modifications are possible without departing from the spirit and scope of the present invention and that those modifications are also encompassed by the invention as defined in the appended claims.

For example, the via hole or the pattern-forming groove was formed by laser processing in the above-described embodiments. However, the present invention is not limited only to the foregoing. It is also possible to apply other processing methods such as milling, dry blasting, wet blasting, drilling, and the like in consideration of various requirements including a grinding thickness, a grinding width (diameter) or a grinding rate, and the like.

Moreover, the patterned dry films are used as the masks for electrolytic plating in the above-described embodiments. However, it is also possible to selectively form an insulative material as a mask by means of screen printing instead of patterning the dry films.

In addition, in the above-described embodiments, the conductive materials are polished after peeling the dry films off. However, it is also possible to polish the conductive materials twice before and after peeling the dry films off. In this case, it is possible to realize thin and uniform conductive materials with reasonable addition of the polishing process, and thereby to achieve patterning at higher accuracy. Although the conductive layers are not subjected to polishing in the above-described embodiments, it is also effective to polish the conductive layers to align the thickness thereof. It is to be noted, however, that the polishing process is not always essential in the present invention. Nevertheless, the polishing process is effective to align the thicknesses of the conductive materials, and thereby to further reduce variations in the thicknesses among the patterned core materials, the base conductive layer, and the conductive materials.

What is claimed is:

1. A multilayer substrate, comprising:
    a plurality of laminated insulating layers and conductive patterns formed between the respective insulating layers,
    wherein the conductive patterns includes a first conductive pattern having a predetermined thickness and a second conductive pattern thicker than the first conductive pattern, and the first conductive pattern and the second conductive pattern are at a predetermined distance from each other on the same insulating layer; and
    wherein the first conductive pattern is formed on a surface of a predetermined one of the plurality of insulating layers and at least part of the second conductive pattern is partially embedded in the predetermined insulating layer.

2. The multilayer substrate as claimed in claim 1, wherein both the first conductive pattern and the second conductive pattern are formed on a surface of a predetermined one of the plurality of insulating layers.

3. The multilayer substrate as claimed in claim 1, wherein at least one of the first conductive pattern and the second conductive pattern is formed as a laminated body of a plurality of conductive layers having mutually different etching rates.

4. The multilayer substrate as claimed in claim 3, wherein the laminated body is made of two conductive layers, and a combination of the two conductive layers is selected in the combinations of copper (Cu) and aluminum (Al), aluminum (Al) and copper (Cu), copper (Cu) and nickel (Ni), nickel (Ni) and copper (Cu), copper (Cu) and palladium (Pd), copper (Cu) and silver (Ag), stainless steel (SUS) and palladium (Pd), stainless steel (SUS) and silver (Ag), silver (Ag) and stainless steel (SUS), and copper (Cu) and stainless steel (SUS).

5. The multilayer substrate as claimed in claim 1, further including a via hole electrode for connecting the conductive patterns located on different layers.

6. The multilayer substrate as claimed in claim 1, wherein the thickness (t1) of the first conductive pattern is selected in a range from 1 μM to 18 μm, and the thickness (t2) of the second conductive pattern is selected such that a proportion (t2/t1) between the thickness of the first conductive pattern and the second conductive pattern is in a range from 1.5 to 20.

7. The multilayer substrate as claimed in claim 1, wherein at least part of the second conductive patterns serves as a choke coil.

8. A multilayer substrate, comprising:
a plurality of laminated insulating layers and conductive patterns formed between the respective insulating layers,
wherein the conductive patterns includes a first conductive pattern having a predetermined thickness and a second conductive pattern thicker than the first conductive pattern, and the first conductive pattern and the second conductive pattern are separated from one another a predetermined distance from each other along the same insulating layer;
wherein the first conductive pattern is formed on a surface of a predetermined one of the plurality of insulating layers and at least part of the second conductive pattern is partially embedded in the same predetermined insulating layer; and
wherein both the first conductive pattern and the second conductive pattern are formed on a surface of a predetermined one of the plurality of insulating layers.

9. The multilayer substrate as claimed in claim 8, wherein at least one of the first conductive pattern and the second conductive pattern is formed as a laminated body of a plurality of conductive layers having mutually different etching rates.

10. The multilayer substrate as claimed in claim 9, wherein the laminated body is made of two conductive layers, and a combination of the two conductive layers is selected in the combinations of copper (Cu) and aluminum (Al), aluminum (Al) and copper (Cu), copper (Cu) and nickel (Ni), nickel (Ni) and copper (Cu), copper (Cu) and palladium (Pd), copper (Cu) and silver (Ag), stainless steel (SUS) and palladium (Pd), stainless steel (SUS) and silver (Ag), silver (Ag) and stainless steel (SUS), and copper (Cu) and stainless steel (SUS).

11. The multilayer substrate as claimed in claim 9, further including a via hole electrode for connecting the conductive patterns located on different layers.

12. The multilayer substrate as claimed in claim 11, wherein the first conductive pattern and the second conductive pattern have mutually different thickness.

13. The multilayer substrate as claimed in claim 12, wherein the thickness (t1) of the first conductive pattern is selected in a range from 1 μm to 18 μm, and the thickness (t2) of the second conductive pattern is selected such that a proportion (t2/t1) between the thickness of the first conductive pattern and the second conductive pattern is in a range from 1.5 to 20.

14. The multilayer substrate as claimed in claim 12, wherein at least part of the first conductive pattern and/or at least a part of the second conductive pattern includes an inductor and a capacitor embedded in the multilayer substrate.

15. The multilayer substrate as claimed in claim 12, wherein at least part of the second conductive pattern serves as a choke coil.

16. A multilayer substrate, comprising:
a plurality of laminated insulating layers and conductive patterns formed between the respective insulating layers,
wherein the conductive patterns includes a first conductive pattern having a predetermined thickness and a second conductive pattern thicker than the first conductive pattern, the first conductive pattern and the second conductive pattern being located on the same one of the plurality of insulating layers, and at least part of the first conductive pattern and/or at least a part of the second conductive patterns including an inductor element partially embedded in the multilayer substrate.

17. The multilayer substrate as claimed in claim 16, wherein the first conductive pattern is formed on a surface of a predetermined one of the plurality of insulating layers and at least part of the second conductive pattern is buried in the predetermined insulating layer.

18. The multilayer substrate as claimed in claim 17, wherein both the first conductive pattern and the second conductive pattern are formed on a surface of a predetermined one of the plurality of insulating layers.

19. The multilayer substrate as claimed in claim 18, wherein at least one of the first conductive pattern and the second conductive pattern is formed as a laminated body of a plurality of conductive layers having mutually different etching rates.

20. The multilayer substrate as claimed in claim 19, wherein the laminated body is made of two conductive layers, and a combination of the two conductive layers is selected in the combinations of copper (Cu) and aluminum (Al), aluminum (Al) and copper (Cu), copper (Cu) and nickel (Ni), nickel (Ni) and copper (Cu), copper (Cu) and palladium (Pd), copper (Cu) and silver (Ag), stainless steel (SUS) and palladium (Pd), stainless steel (SUS) and silver (Ag), silver (Ag) and stainless steel (SUS), and copper (Cu) and stainless steel (SUS).

21. The multilayer substrate as claimed in claim 19, further including a via hole electrode for connecting the conductive patterns located on different layers.

22. The multilayer substrate as claimed in claim 21, wherein the thickness (t1) of the first conductive pattern is selected in a range from 1 μm to 18 μm, and the thickness (t2) of the second conductive pattern is selected such that a proportion (t2/t1) between the thickness of the first conductive pattern and the second conductive pattern is in a range from 1.5 to 20.

23. The multi layer substrate as claimed in claim 22, wherein at least part of the second conductive pattern serves as a choke coil.

* * * * *

UNITED STATES PATENT AND TRADEMARK OFFICE
CERTIFICATE OF CORRECTION

| | | |
|---|---|---|
| PATENT NO. | : 7,868,464 B2 | Page 1 of 1 |
| APPLICATION NO. | : 11/229394 | |
| DATED | : January 11, 2011 | |
| INVENTOR(S) | : Kenichi Kawabata, Hisayuki Abe and Masashi Katsumata | |

It is certified that error appears in the above-identified patent and that said Letters Patent is hereby corrected as shown below:

Col. 37, claim 6, line 16: "1 µM" should be changed to "1 µm"

Signed and Sealed this
Third Day of May, 2011

David J. Kappos
*Director of the United States Patent and Trademark Office*